(12) United States Patent
Hara et al.

(10) Patent No.: US 7,035,136 B2
(45) Date of Patent: Apr. 25, 2006

(54) NONVOLATILE MAGNETIC MEMORY DEVICE AND METHOD OF WRITING DATA INTO TUNNEL MAGNETORESISTANCE DEVICE IN NONVOLATILE MAGNETIC MEMORY DEVICE

(75) Inventors: Masaaki Hara, Tokyo (JP); Tsunenori Shiimoto, Kanagawa (JP); Yujiro Ito, Kanagawa (JP); Jun Sawai, Kanagawa (JP)

(73) Assignee: Sony Corporation, (JP)

( * ) Notice: Subject to any disclaimer, the term of this patent is extended or adjusted under 35 U.S.C. 154(b) by 61 days.

(21) Appl. No.: 10/767,423

(22) Filed: Jan. 30, 2004

(65) Prior Publication Data
US 2004/0184313 A1 Sep. 23, 2004

(30) Foreign Application Priority Data
Feb. 25, 2003 (JP) ............................ 2003-047845

(51) Int. Cl.
*G11C 11/00* (2006.01)

(52) U.S. Cl. .................... 365/158; 365/185.28; 365/48
(58) Field of Classification Search ................ 365/158, 365/185.28, 48, 173, 171
See application file for complete search history.

(56) References Cited

U.S. PATENT DOCUMENTS 5,459,687 A * 10/1995 Sakakima et al. .......... 365/158
5,940,319 A     8/1999 Durlam et al.
2002/0051381 A1 * 5/2002 Numata et al. ............. 365/171

FOREIGN PATENT DOCUMENTS

JP      2002-203388     7/2002

* cited by examiner

*Primary Examiner*—Richard Elms
*Assistant Examiner*—Dang T. Nguyen
(74) *Attorney, Agent, or Firm*—Rader, Fishman & Grauer PLLC; Ronald P. Kananen

(57) ABSTRACT

A nonvolatile magnetic memory device having a nonvolatile magnetic memory array comprising write-in word line(s), bit lines and tunnel magnetoresistance devices, wherein when data is written into the tunnel magnetoresistance device, a current $I(m)_{RWL}$ is passed through the m-th-place write-in word line, a current $g(0) \cdot I(n)_{BL}$ is passed through the n-th-place bit line, and at the same time, a current $g(k) \cdot I(n)_{BL}$ is passed through the q-th-place bit line (q=n+k, k is ±1, ±2, ..., and the total number of the lines is K), and a spatial FIR filter assuming magnetic fields, which are supposed to be formed in the n-th-place bit line and the bit lines that are K in number by the current $I(n)_{BL}$, to be discrete pulse response and assuming the coefficients $g(0)$ and $g(k)$ to be tap-gains is constituted of the n-th-place bit line and the bit lines that are K in number.

20 Claims, 46 Drawing Sheets

COEFFICIENT g(k)
BEFORE ADDITION

COEFFICIENT g(k)
AFTER ADDITION

ASTEROID CURVE

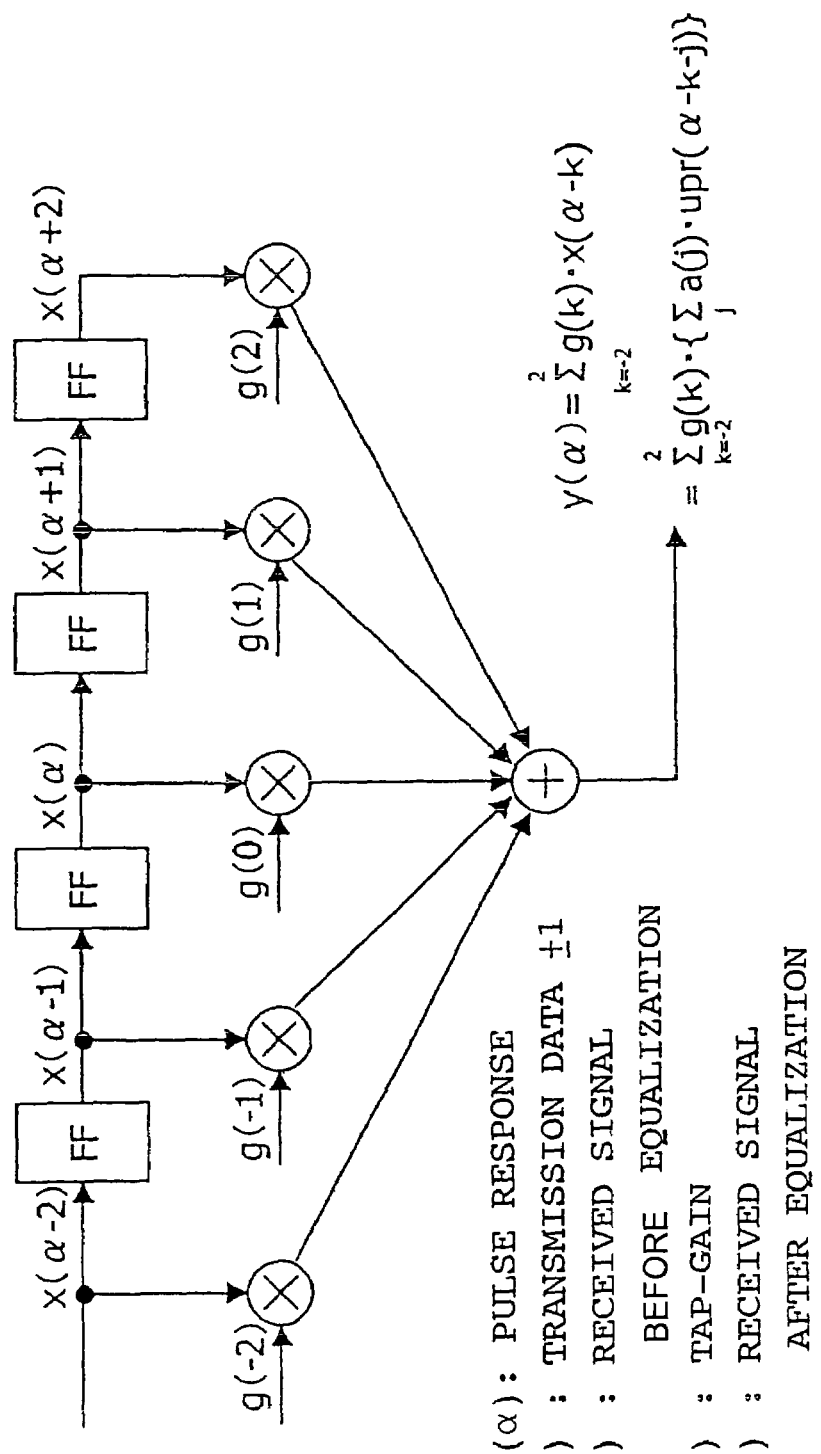

UNIT PULSE

PULSE RESPOMSE

NONVOLATILE MAGNETIC MEMORY DEVICE AND METHOD OF WRITING DATA INTO TUNNEL MAGNETORESISTANCE DEVICE IN NONVOLATILE MAGNETIC MEMORY DEVICE

BACKGROUND OF THE INVENTION AND RELATED ART STATEMENT

The present invention relates to a nonvolatile magnetic memory device and a method of writing data into a tunnel magnetoresistance device in a nonvolatile magnetic memory device. More specifically, the present invention relates to a nonvolatile magnetic memory device called a TMR (Tunnel Magneto resistance) type MRAM (Magnetic Random Access Memory) and a method of writing data into a tunnel magnetoresistance device in such a nonvolatile magnetic memory device.

With great diffusion of information communication machines, particularly, personal small machines such as personal digital assistances, various semiconductor devices such as a memory, a logic and so on, constituting such machines are being demanded to cope with higher performances such as a higher degree of integration, faster operation capability and lower power consumption. Particularly, a nonvolatile memory is considered indispensable in the ubiquitous era. Even if the depletion of a power supply or some troubles occur or a server is disconnected to a network due to some failure, important information can be stored or protected with a nonvolatile memory. Further, recently available personal digital assistances are designed such that the power consumption is reduced to a lowest level possible by maintaining non-operating circuit blocks in a standby state, and the waste of power consumption and a memory can be avoided if a nonvolatile memory capable of working as a fast-speed work memory and a mass-storage memory can be realized. Further, if a fast-speed and mass-storage nonvolatile memory can be realized, the "instant-on" function of booting in the instance of turning on power can be made possible.

The nonvolatile memory includes a flash memory using a semiconductor material and a ferroelectric nonvolatile semiconductor memory (FERAM, Ferroelectric Random Access Memory) using a ferroelectric material. However, the flash memory has a defect that the writing speed is slow since it is in the order of microseconds. On the other hand, in FERAM, the number of times of re-writability thereof is $10^{12}$ to $10^{14}$, and the number cannot be said to be sufficient for replacing SRAM or DRAM with FERAM, and there is pointed out another problem that the micro-fabrication of a ferroelectric layer is difficult.

As a nonvolatile memory free of the above defects, a nonvolatile magnetic memory device called MRAM (Magnetic Random Access Memory) is in the limelight. The MRAM at an early development stage was based on a spin valve using a GMR (Giant MagnetoResistance) effect. Since, however, the memory cell resistance against a load is as low as 10 to 100 ohms, the power consumption per bit on readout is large, and the defect is that it is difficult to attain the capacity of mass storage.

While the MRAM using a TMR (Tunnel MagnetoResistance) effect only had a resistance change ratio of 1–2% at room temperature at an early development stage, it has come to be possible to obtain a resistance change ratio close to 20% in recent years, so that the MRAM using the TMR effect is highlighted. The TMR-type MRAM has a simple structure and enables easy scaling, and recording is made by the rotation of a magnetic moment, so that the number of times of possible re-writing is great. Further, it is expected that the TMR-type MRAM is very rapid with regard to an access time period, and it is already said that the TMR-type MRAM is capable of an operation at 100 MHz.

FIG. 5 shows a schematic partial cross-sectional view of a TMR-type MRAM (to be simply referred to as "MRAM" hereinafter). The MRAM comprises a transistor for selection TR constituted of a MOS-type FET and a tunnel magnetoresistance device TMJ.

The tunnel magnetoresistance device TMJ has a stacking structure constituted of a first ferromagnetic layer 31, a tunnel barrier 34 and a second ferromagnetic layer 35. More specifically, the first ferromagnetic layer 31 has a two-layer structure, for example, of an anti-ferromagnetic layer 32 positioned below and a ferromagnetic layer (called a reference layer or a pinned magnetic layer 33 as well) positioned above and has an intense unidirectional magnetic anisotropy due to an exchange interaction working between these two layers. The second ferromagnetic layer 35 of which the magnetization direction rotates relatively easily is also called a free layer or memory layer. The second ferromagnetic layer will be called a memory layer 35 hereinafter. The tunnel barrier 34 works to cut a magnetic coupling between the memory layer 35 and the pinned magnetic layer 33, and a tunnel current flows in the tunnel barrier 34. A bit line BL for connecting the MRAMs is formed on a third insulating interlayer 26. A top coating film 36 formed between the bit line BL and the memory layer 35 works to prevent mutual diffusion of atoms constituting the bit line BL and atoms constituting the memory layer 35, to reduce a contact resistance and to prevent the oxidation of the memory layer 35. In Figure, reference numeral 37 indicates a lead-out electrode connected to the lower surface of the anti-ferromagnetic layer 32.

Further, a write-in word line RWL is arranged below the tunnel magnetoresistance device TMJ through a second insulating interlayer 24. Generally, the extending direction (first direction) of the write-in word line RWL and the extending direction (second direction) of the bit line BL cross each other at right angles.

The transistor for selection TR is formed in that portion of a semiconductor substrate 10 which portion is surrounded by a device isolation region 11, and the transistor for selection TR is covered with a first insulating interlayer 21. One source/drain region 14B is connected to the lead-out electrode 37 of the tunnel magnetoresistance device TMJ through a connecting hole 22 constituted of a tungsten plug, a landing pad 23 and a connecting hole 25 constituted of a tungsten plug. The other source/drain region 14A is connected to a sense line 16 through a tungsten plug 15. In FIG. 5, reference numeral 12 indicates a gate electrode, and reference numeral 13 indicates a gate insulating film.

In an MRAM array, the MRAM is arranged in an intersecting point (overlap region) of the bit line BL and the write-in word line RWL.

When data is written into the above-constituted MRAM, a current $I_{BL}$ is passed through the bit line BL and a current $I_{RWL}$ is passed through the write-in word line RWL, to form a synthetic magnetic field, and the direction of magnetization of the second ferromagnetic layer (memory layer 35) is changed by means of the synthetic magnetic field, whereby "1" or "0" is recorded into the second ferromagnetic layer (memory layer 35).

Data is read out by bringing the transistor for selection TR into an ON-state, passing a current through the bit line BL and detecting a tunnel current change caused by a magnetoresistance effect with the sense line 16. When the magnetization direction of the memory layer 35 and the counterpart of the pinned magnetic layer 33 are the same, a low-resistance state results (this state represents, for example, "0"), and when the magnetization direction of the memory layer 35 and the counterpart of the pinned magnetic layer 33 are antiparallel, a high-resistance state results (this state represents, for example, "1").

FIG. 38 shows an asteroid curve of the MRAM. A current is passed through the bit line BL and a current is passed through the write-in word line RWL, and as a result, a synthetic magnetic field is generated. Data is written into the tunnel magnetoresistance device TMJ constituting the MRAM on the basis of the synthetic magnetic field. A magnetic field ($H_{EA}$) in the easy-magnetization axis direction of the memory layer 35 is formed due to a writing-in current flowing in the bit line BL, and a magnetic field ($H_{HA}$) in the difficult-magnetization axis direction of the memory layer 35 is formed due to a current flowing in the write-in word line RWL. In some MRAM constitution, a magnetic field ($H_{HA}$) in the difficult-magnetization axis direction of the memory layer 35 is formed due to a writing-in current flowing in the bit line BL, and a magnetic field ($H_{EA}$) in the easy-magnetization axis direction of the memory layer 35 is formed due to a current flowing in the write-in word line RWL.

The asteroid curve shows an inversion threshold value of magnetization direction of the memory layer 35 due to the synthetic magnetic field (synthesis of magnetic field vectors of the magnetic field HA and the magnetic field $H_{EA}$ to be exerted on the memory layer 35). When a synthetic magnetic field corresponding to an outside ($OUT_1$, $OUT_2$) of the asteroid curve is generated, the magnetization direction of the memory layer 35 is inverted, so that data writing is performed. When a synthetic magnetic field corresponding to an inside (IN) of the asteroid curve is generated, the inversion of magnetization of the memory layer 35 does not take place. Further, onto the MRAM other than the MRAM which is positioned in the overlap region of the write-in word line RWL and the bit line BL in which the currents are flowing, a magnetic field is additionally exerted by the write-in word line RWL or bit line BL alone, and when such a magnetic field is greater than a unidirectional inversion magnetic field $H_K$ [in a region ($OUT_2$) outside dotted lines in FIG. 38], the magnetization direction of the memory layer 35 constituting the MRAM other than the MRAM which is positioned in the overlap region is also inverted. Therefore, only when the synthetic magnetic field is outside the asteroid curve and is in a region ($OUT_1$) inside the dotted lines in FIG. 38, selective writing into the selected MRAM is possible.

As described above, TMR-type MRAM has an advantage that a higher speed and a higher degree of integration are easily attained. Actually, however, a magnetic field generated during writing data into a certain MRAM may destroy data stored in MRAM adjacent to the above MRAM.

As shown in FIG. 39, there is assumed a state where three conductor lines ($L_1$, $L_0$, $L_2$) have an infinite length, these conductor lines are placed apart side by side at a distance of d, a current of $I_0$ (ampere) flows in the conductor line $L_0$ and a current of $-I_0$ (ampere) flows in each of the conductor lines $L_1$ and $L_2$. If distances from an arbitrary point P (X,Y) to the conductor lines $L_0$, $L_1$, $L_2$ are $r_0$, $r_1$ and $r_2$, the magnetic fields $H_X$ and $H_Y$ in the directions of X axis and Y axis can be determined on the basis of the following expressions (3-1) and (3-2). Angles at which the straight lines connecting the arbitrary point (X,Y) and the conductor lines $L_0$, $L_1$, $L_2$ form with the X axis are $\theta_0$, $\theta_1$ and $\theta_2$. In FIG. 39, further, the magnetic field generated by the conductor line $L_0$ is represented by an arrow $H_0$, the magnetic field generated by the conductor line $L_1$ is represented by $H_1$, and the magnetic field generated by the conductor line $L_2$ is represented by an arrow $H_2$.

$$H_X = [I_0/(2\pi r_0)]\sin(\theta_0) + \\ [I_1/(2\pi r_1)]\sin(\theta_1) + \\ [I_2/(2\pi r_2)]\sin(\theta_2) \quad (3\text{-}1)$$

$$H_Y = -[I_0/(2\pi r_0)]\cos(\theta_0) - \\ [I_1/(2\pi r_1)]\cos(\theta_1) - \\ [I_2/(2\pi r_2)]\cos(\theta_2) \quad (3\text{-}2)$$

wherein, $r_0 = (X^2+Y^2)^{1/2}$ $r_1 = \{(X+d)^2+Y^2\}^{1/2}$ $r_2 = \{(X-d)^2+Y^2\}^{1/2}$ As shown in FIG. 5, a distance from the center of the bit line BL in the thickness direction to the center of the second ferromagnetic layer (memory layer) 35 is assumed to be "h", and a distance from the center of the bit line in the width direction to the center of an adjacent bit line in the width direction is assumed to be "d". And, it is assumed that $\beta = (h/d)$.

The conductor lines $L_0$, $L_1$, $L_2$ are assumed to be three bit lines arranged in parallel in the X axis direction, the conductor line $L_0$ is assumed to pass the origin (0,0) of the Gauss' coordinate, and it is assumed that $I_1 = 0$ (ampere). In this case, the value of $H_{(x,h)}$ at a point represented by a coordinate (X,h) is calculated according to the following expression (4).

$$H_{(X,h)} = [I_0/(2\pi)] \times \left[1 / (X^2+h^2)^{1/2}\right] \times \left[h / (X^2+h^2)^{1/2}\right] \quad (4)$$
$$= h[I_0/(2\pi)]/(X^2+h^2)$$

In the above expression, $I_0$ is normalized such that when X=0, $H_{(x,h)}=1$. In this case, the value of $I_0$ is as follows.

$$I_0 = 2\pi \cdot h \quad (5)$$

The expression (5) is substituted in the expression (4) to give the following expression (6). A normalized magnetic field $H_{(X,h)}$ is represented by $H_{N(X,h)}$.

$$H_{N(X,h)} = h^2/(X^2+h^2) \quad (6)$$

When d·x is denoted by X, the expression (6) is substituted in the expression (7), using $\beta=(h/d)$.

$$H_{N(X,h)} = (\beta \cdot d)^2 / \{(d \cdot x)^2 + (\beta \cdot d)^2\} \quad (7)$$
$$= \beta / (x^2 + \beta^2)$$

FIG. 40 shows $H_{N(x,h)}$ that are calculation results from the expression (7) when the value of $\beta=(h/d)$ is 0.1, 0.5 and 1.0.

When the value of $\beta=(h/d)$ is 0.1, that is, when the distance "d" from the center of the bit line in the width direction to the center of the adjacent bit line in the width direction is 10 times the distance "h" to the center of the second ferromagnetic layer 35 in the thickness direction, $H_{N(x,h)}$ in the case of x=±1.0, that is, in the second ferromagnetic layer 35 of the adjacent tunnel magnetoresistance device TMJ, is nearly 0, and there is no interference of the magnetic fields between adjacent tunnel magnetoresistance devices TMJ.

However, when the value of β=(h/d) is 0.5, that is, when the distance "d" from the center of the bit line in the width direction to the center of the adjacent bit line in the width direction is 2 times the distance "h" to the center of the second ferromagnetic layer 35 in the thickness direction, $H_{N(x,h)}$ in the case of x=±1.0, that is, in the second ferromagnetic layer 35 of the adjacent tunnel magnetoresistance device TMJ, is 0.2. Whether or not this value of $H_{N(x,h)}$ poses a problem depends upon fluctuation of the magnetic field ($H_{EA}$) in the easy-magnetization axis direction of MRAM and fluctuation of the magnetic field ($H_{HA}$) in the hard-magnetization axis direction of MRAM in the asteroid curve of MRAM shown in FIG. 38. However, the value has a magnitude that cannot be ignored.

Further, when the value of β=(h/d) is 1.0, that is, when the distance "d" from the center of the bit line in the width direction to the center of the adjacent bit line in the width direction is 1 time the distance "h" to the center of the second ferromagnetic layer 35 in the thickness direction, $H_{N(x,h)}$ in the case of x=±1.0, that is, in the second ferromagnetic layer 35 of the adjacent tunnel magnetoresistance device TMJ, comes to be as large as 0.5. When such a magnetic field is generated, it is expectedly difficult to write data stably into a predetermined MRAM even if the fluctuation of the magnetic field ($H_{EA}$) in the easy-magnetization axis direction of MRAM and the fluctuation of the magnetic field ($H_{HA}$) in the hard-magnetization axis direction of MRAM can be controlled to be small.

In "Present State and Future View of MRAM" by Yoshiaki SAITO, FIG. 6 shows that when X=0 µm, $H_x \approx 10$ Oe, when X=0.2 µm, $H_x \approx 5$ Oe, and when X=0.4 µm, $H_x \approx 2$ Oe. That is, the value in the case of β=h/d=1.0 in FIG. 40 is more or less correspondent to the data shown in FIG. 6 of "Present State and Future View of MRAM" by Yoshiaki SAITO.

Although it is undeniable that the values differ when boundary conditions, etc., are strictly taken into account, it can be affirmed that even the model depicted by the expression (7) gives a good approximation for the purpose of studying the distribution and magnitude of the magnetic field.

While TMR-type MRAM has an advantage that a higher speed and a higher degree of integration are easily attained as described above, a magnetic field generated during writing data into a certain MRAM may destroy data stored in MRAM adjacent to the above MRAM as discussed above.

For example, JP-A-2002-20388 discloses a means of overcoming the above problem. In the technique disclosed in the above Japanese laid-open patent publication, programming currents ($I_{WL}$, $I_{BL2}$) are passed through a word line (WL1) and a bit line (BL2) constituting a memory cell ($I_2$). A compensatory current that provides a compensatory magnetic field to counteract a scattered magnetic field is passed through a word line (PWL) or a bit line (BL3,BL5) constituting at least one memory cell ($I_3,I_5$) adjacent to the memory cell ($I_2$).

However, the above Japanese laid-open patent publication describes no specific method or means with regard to what value should be employed for the compensatory current to flow or how the value of the compensatory current to flow should be determined.

Further, the above Japanese laid-open patent publication is silent concerning any specific method of simultaneously writing data in many adjacent MRAMs.

OBJECT AND SUMMARY OF THE INVENTION

It is therefore an object of the present invention to provide a nonvolatile magnetic memory device having such a constitution that a magnetic field generated during writing of data into a certain tunnel magnetoresistance device does not destroy data stored in a tunnel magnetoresistance device adjacent to the above tunnel magnetoresistance device, and a method of writing data into a tunnel magnetoresistance device in a nonvolatile magnetic memory device, which can prevent an error in writing data even when data are simultaneously written into adjacent many MRAMs.

The nonvolatile magnetic memory device according to a first aspect of the present invention for achieving the above object (more specifically, nonvolatile magnetic memory device having TMR-type MRAM) is a nonvolatile magnetic memory device having a nonvolatile magnetic memory array comprising;

(A) write-in word line(s) that is(are) M (M≧1) in number, extending in a first direction, (B) bit lines that are N (N≧2) in number, extending in a second direction different from the first direction, and (C) tunnel magnetoresistance devices, each being formed in an overlap region of the write-in word line and the bit line and having a stacking structure of a first ferromagnetic layer, a tunnel barrier and a second ferromagnetic layer, the first ferromagnetic layer being electrically insulated from the write-in word line, and the second ferromagnetic layer being electrically connected to the bit line, wherein:

when data is written into the tunnel magnetoresistance device positioned in the overlap region of the m-th-place write-in word line (m is one of 1, 2, ... M) and the n-th-place bit line (n is one of 1, 2, ... N), a current $I(m)_{RWL}$ is passed through (or flowed in) the m-th-place write-in word line and a current $g(0) \cdot I(n)_{BL}$ [g(0):coefficient] is passed through (or flowed in) the n-th-place bit line, and at the same time, a current $g(k) \cdot I(n)_{BL}$ [g(k):coefficient] is passed through (or flowed in) the q-th-place bit line (q=n+k, k is ±1, ±2, ..., and the total number of the lines is K), a spatial FIR filter assuming magnetic fields, which are supposed to be formed in the n-th-place bit line and the bit lines that are K in number by the current $I(n)_{BL}$, to be discrete pulse response and assuming the coefficients g(0) and g(k) to be tap-gains is constituted of the n-th-place bit line and the bit lines that are K in number, and the coefficients g(0) and g(k) are defined such that data is written into the tunnel magnetoresistance device positioned in the overlap region of the m-th-place write-in word line and the n-th-place bit line and no data are written into the tunnel magnetoresistance devices positioned in the overlap regions of the m-th-place write-in word line and the bit lines that are K in number by means of a synthetic magnetic field based on a magnetic field generated by the current $g(0) \cdot I(n)_{BL}$ flowing in the n-th-place bit line, magnetic fields generated by the currents $g(k) \cdot I(n)_{BL}$ flowing in the bit lines that are K in number, and a magnetic field generated by the current $I(m)_{RWL}$ flowing in the m-th-place write-in word line.

The nonvolatile magnetic memory device according to a second aspect of the present invention for achieving the above object (more specifically, nonvolatile magnetic memory device having TMR-type MRAM) is a nonvolatile magnetic memory device having a nonvolatile magnetic memory array comprising;

(A) write-in word lines that are M (M≧2) in number, extending in a first direction, (B) bit line(s) that is(are) N (N≧1) in number, extending in a second direction different from the first direction, (C) tunnel magnetoresistance devices, each being formed in an overlap region of the write-in word line and the bit line and having a stacking structure of a first ferromagnetic layer, a tunnel barrier and a second ferromagnetic layer, the first ferromagnetic layer being electrically insulated from the write-in word line, and the second ferromagnetic layer being electrically connected to the bit line, wherein:

when data is written into the tunnel magnetoresistance device positioned in the overlap region of the m-th-place write-in word line (m is one of 1, 2, . . . M) and the n-th-place bit line (n is one of 1, 2, . . . N), a current $I(n)_{BL}$ is passed through (or flowed in) the n-th-place bit line and a current $g(0) \cdot I(m)_{RWL}$ [g(0):coefficient] is passed through (or flowed in) the m-th-place write-in word line, and at the same time, a current $g(k) \cdot I(m)_{RWL}$ [g(k):coefficient] is passed through (or flowed in) the p-th-place write-in word line (p=n+k, k is ±2, ±2, . . . , and the total number of the lines is K), a spatial FIR filter assuming magnetic fields, which are supposed to be formed in the m-th-place write-in word line and the write-in word lines that are K in number by the current $I(m)_{RWL}$, to be discrete pulse response and assuming the coefficients g(0) and g(k) to be tap-gains is constituted of the m-th-place write-in word line and the write-in word lines that are K in number, and the coefficients g(0) and g(k) are defined such that data is written into the tunnel magnetoresistance device positioned in the overlap region of the m-th-place write-in word line and the n-th-place bit line and no data are written into the tunnel magnetoresistance devices positioned in the overlap regions of the n-th-place bit line and the write-in word lines that are K in number by means of a synthetic magnetic field based on a magnetic field generated by the current $g(0) \cdot I(m)_{RWL}$ flowing in the m-th-place write-in word line, magnetic fields generated by the currents $g(k) \cdot I(m)_{RWL}$ flowing in the write-in word lines that are K in number, and a magnetic field generated by the current $I(n)_{BL}$ flowing in the n-th-place bit line.

The method of writing data into a tunnel magnetoresistance device in a nonvolatile magnetic memory device (more specifically, nonvolatile magnetic memory device having TMR-type MRAM), according to a first aspect of the present invention for achieving the above object, is a method of writing data into a tunnel magnetoresistance device in a nonvolatile magnetic memory device having a nonvolatile magnetic memory array comprising;

(A) write-in word line(s) that is(are) M (M≧1) in number, extending in a first direction, (B) bit lines that are N (N≧2) in number, extending in a second direction different from the first direction, and (C) tunnel magnetoresistance devices, each being formed in an overlap region of the write-in word line and the bit line and having a stacking structure of a first ferromagnetic layer, a tunnel barrier and a second ferromagnetic layer, the first ferromagnetic layer being electrically insulated from the write-in word line, and the second ferromagnetic layer being electrically connected to the bit line, wherein:

when it is assumed that data is written into the tunnel magnetoresistance device positioned in the overlap region of the m-th-place write-in word line (m is one of 1, 2, . . . M) and the n-th-place bit line (n is one of 1, 2, . . . N), a current $I(m)_{RWL}$ is passed through (or flowed in) the m-th-place write-in word line and a current $g(0) \cdot I(n)_{BL}$ [g(0):coefficient] is passed through (or flowed in) the n-th-place bit line, and at the same time, a current $g(k) \cdot I(n)_{BL}$ [g(k):coefficient] is passed through (or flowed in) the q-th-place bit line (q=n+k, k is ±1, ±2, . . . , and the total number of the lines is K), a spatial FIR filter assuming magnetic fields, which are supposed to be formed in the n-th-place bit line and the bit lines that are K in number by the current $I(n)_{BL}$, to be discrete pulse response and assuming the coefficients g(0) and g(k) to be tap-gains is constituted of the n-th-place bit line and the bit lines that are K in number, and the coefficients g(0) and g(k) are defined such that data is written into the tunnel magnetoresistance device positioned in the overlap region of the m-th-place write-in word line and the n-th-place bit line and no data are written into the tunnel magnetoresistance devices positioned in the overlap regions of the m-th-place write-in word line and the bit lines that are K in number by means of a synthetic magnetic field based on a magnetic field generated by the current $g(0) \cdot I(n)_{BL}$ flowing in the n-th-place bit line, magnetic fields generated by the currents $g(k) \cdot I(n)_{BL}$ flowing in the bit lines that are K in number, and a magnetic field generated by the current $I(m)_{RWL}$ flowing in the m-th-place write-in word line, said method comprising letting the current $I(m)_{RWL}$ flow in the m-th-place write-in word line, and simultaneously letting the following currents $i(n)_{BL}$ flow in each of the first bit line to the N-th-place bit line, $$i(n)_{BL} = \sum_{k=-k_0}^{k_0} g(k) \cdot I(n-k)_{BL} \qquad (1)$$

wherein $k_0$ is an absolute value of the maximum value that k represents, and k in the expression (1) includes 0.

The method of writing data into a tunnel magnetoresistance device in a nonvolatile magnetic memory device (more specifically, nonvolatile magnetic memory device having TMR-type MRAM), according to a second aspect of the present invention for achieving the above object, is a method of writing data into a tunnel magnetoresistance device in a nonvolatile magnetic memory device having a nonvolatile magnetic memory array comprising;

(A) write-in word lines that are M (M≧2) in number, extending in a first direction, (B) bit line(s) that is(are) N (N≧1) in number, extending in a second direction different from the first direction, (C) tunnel magnetoresistance devices, each being formed in an overlap region of the write-in word line and the bit line and having a stacking structure of a first ferromagnetic layer, a tunnel barrier and a second ferromagnetic layer, the first ferromagnetic layer being electrically insulated from the write-in word line, and the second ferromagnetic layer being electrically connected to the bit line, wherein:

when it is assumed that data is written into the tunnel magnetoresistance device positioned in the overlap region of the m-th-place write-in word line (m is one of 1, 2, . . . M) and the n-th-place bit line (n is one of 1, 2, . . . N), a current $I(n)_{BL}$ is passed through (or flowed in) the n-th-place bit line and a current $g(0) \cdot I(m)_{RWL}$ [g(0):coefficient] is passed through (or flowed in) the m-th-place write-in word line, and at the same time, a current $g(k) \cdot I(m)_{RWL}$ [g(k):coefficient] is passed through (or flowed in) the p-th-place write-in word line (p=n+k, k is ±1, ±2, . . . , and the total number of the lines is K), a spatial FIR filter assuming magnetic fields, which are supposed to be formed in the m-th-place write-in word line and the write-in word lines that are K in number by the current $I(m)_{RWL}$, to be discrete pulse response and assuming the coefficients g(0) and g(k) to be tap-gains is constituted of the m-th-place write-in word line and the write-in word lines that are K in number, and the coefficients g(0) and g(k) are defined such that data is written into the tunnel magnetoresistance device positioned in the overlap region of the m-th-place write-in word line and the n-th-place bit line and no data are written into the tunnel magnetoresistance devices positioned in the overlap regions of the n-th-place bit line and the write-in word lines that are K in number by means of a synthetic magnetic field based on a magnetic field generated by the current $g(0) \cdot I(m)_{RWL}$ flowing in the m-th-place write-in word line, magnetic fields generated by the currents $g(k) \cdot I(m)_{RWL}$ flowing in the write-in word lines that are K in number, and a magnetic field generated by the current $I(n)_{BL}$ flowing in the n-th-place bit line, said method comprising letting the current $I(n)_{BL}$ flow in the n-th-place bit line, and simultaneously letting the following currents $i(m)_{RWL}$ flow in each of the first bit line to the M-th-place write-in word line, $$i(m)_{RWL} = \sum_{k=-k_0}^{k_0} g(k) \cdot I(m-k)_{RWL} \quad (2)$$

wherein $k_0$ is an absolute value of the maximum value that k represents, and k in the expression (2) includes 0.

In the nonvolatile magnetic memory device according to the first or second aspect of the present invention, or in the method of writing data into a tunnel magnetoresistance device in a nonvolatile magnetic memory device according to the first or second aspect of the present invention, (these will be sometimes generally referred to as "the present invention" hereinafter), the value of $I(m)_{RWL}$ may be changed depending upon the value of m, or may be constant regardless of the value of m. Further, the value of $I(n)_{BL}$ may be changed depending upon the value of n, or may be constant regardless of the value of n.

In the present invention, preferably, the coefficients g(0) and g(k) that are assumed to be tap-gains are defined so as to nearly satisfy the Nyquist's first criterion. The Nyquist's first criterion will be described later.

In the present invention, the value of the k can essentially cover values from 1 to an arbitrary positive number. However, the value of k preferably covers values of 1 and 2, for avoiding the complication of driving of the nonvolatile magnetic memory device. In this case, when the absolute value of the maximum value that k represents is $k_0$, the value of $k_0$ is 2.

In the nonvolatile magnetic memory device according to the first aspect of the present invention, or in the method of writing data into a tunnel magnetoresistance device in a nonvolatile magnetic memory device according to the first aspect of the present invention, for example, the main magnetic field is generated by the current flowing in the first bit line or the N-th-place bit line [magnetic field generated by the current $g(0) \cdot I(1)_{BL}$ or $g(0) \cdot I(N)_{BL}$], and the compensatory magnetic fields are generated by the currents flowing in the second, third, . . . bit lines or in . . . , (N−2)-th-place and (N−1)-th-place bit lines [magnetic fields generated by the currents $g(k) \cdot I(1)_{BL}$ or $g(k) \cdot I(N)_{BL}$]. The compensatory magnetic field is asymmetric, for example, with regard to the first bit line or the N-th-place bit line as a base.

Therefore, in the nonvolatile magnetic memory device according to the first aspect of the present invention, or in the method of writing data into a tunnel magnetoresistance device in a nonvolatile magnetic memory device according to the first aspect of the present invention, when the absolute value of the maximum value of the values that the k represents is $k_0$, a group of first dummy line(s) that is(are) $k_0$ in number is provided outside the first bit line and in parallel with the first bit line, a group of second dummy line(s) that is(are) $k_0$ in number is provided outside the N-th-place bit line and in parallel with the N-th-place bit line, and the current $g(k) \cdot I(n)_{BL}$ is passed through (or flowed in) a [(1−n)+|k|]-th-place first dummy line constituting the group of the first dummy line(s) or an [n−N+|k|]-th-place second dummy line constituting the group of the second dummy line(s), which is preferred for preventing the magnetic field from being asymmetrical, for example, with regard to the first bit line or the N-th-place bit line as a base.

In this case, the value of the k can essentially cover values from 1 to an arbitrary positive number. However, the value of k preferably covers values of 1 and 2, for avoiding the complication of driving of the nonvolatile magnetic memory device. In this case, the value of $k_0$ is 2.

In the nonvolatile magnetic memory device according to the second aspect of the present invention, or in the method of writing data into a tunnel magnetoresistance device in a nonvolatile magnetic memory device according to the second aspect of the present invention, the main magnetic field is generated by the current flowing in the first write-in word line or the M-th-place write-in word line [magnetic field generated by the current $g(0) \cdot I(1)_{RWL}$ or current $g(0) \cdot I(M)_{RWL}$], and the compensatory magnetic fields are generated by the currents flowing in the second, third, . . . write-in word lines or in . . . , (M−2)-th-place and (M−1)-th-place write-in word lines [magnetic fields generated by the currents $g(k) \cdot I(1)_{RWL}$ or $g(k) \cdot I(M)_{RWL}$]. The compensatory magnetic field is asymmetric, for example, with regard to the first write-in word line or the M-th-place write-in word line as a base.

Therefore, in the nonvolatile magnetic memory device according to the second aspect of the present invention, or in the method of writing data into a tunnel magnetoresistance device in a nonvolatile magnetic memory device according to the second aspect of the present invention, when the absolute value of maximum value of values that the k represents is $k_0$, a group of first dummy line(s) that is(are) $k_0$ in number is provided outside the first write-in word line and in parallel with the first write-in word line, a group of second dummy line(s) that is(are) $k_0$ in number is provided outside the M-th-place write-in word line and in parallel with the M-th-place write-in word line, and the current $g(k) \cdot I(m)_{RWL}$ is passed through (or flowed in) a [(1−m)+|k|]-th-place first dummy line constituting the group of the first dummy line(s) or an [m−M+|k|]-th-place second dummy line constituting the group of the second dummy line(s), which is preferred for preventing the magnetic field from being asymmetrical, for example, with regard to the first write-in word line or the M-th-place write-in word line as a base.

In this case, the value of the k can as well essentially cover values from 1 to an arbitrary positive number. However, the value of k preferably covers values of 1 and 2, for avoiding the complication of driving of the nonvolatile magnetic memory device. In this case, the value of $k_0$ is 2.

In the present invention, specific values of N include 8 and 16, and specific values of M include 16, 32 and 64.

In the present invention, preferably, the first ferromagnetic layer more specifically has a two-layer structure of an anti-ferromagnetic layer and a ferromagnetic layer (called a reference layer or a pinned magnetic layer as well), whereby the first ferromagnetic layer can have an intense unidirectional magnetic anisotropy due to an exchange interaction working between these two layers. The pinned magnetic layer is in contact with the tunnel barrier. The second ferromagnetic layer of which the magnetization direction relatively easily rotates is also called a free layer or a memory layer. The tunnel barrier works to disconnect a magnetic coupling between the second ferromagnetic layer (memory layer) and the pinned magnetic layer, and a tunnel current flows in the tunnel barrier.

The ferromagnetic layer (reference layer or pinned magnetic layer) and the second ferromagnetic layer (memory layer or free layer) can be constituted, for example, of a ferromagnetic material composed of a transition metal magnetic element, specifically, such as nickel (Ni), iron (Fe) or cobalt (Co) or a ferromagnetic material containing an alloy of these elements (for example, Co—Fe, Co—Fe—Ni, Ni—Fe or the like) as a main component. Further, a so-called half-metallic ferromagnetic material or an amorphous ferromagnetic material such as CoFe—B may be also used. Examples of the material for constituting the anti-ferromagnetic layer include an iron-manganese alloy, a nickel-manganese alloy, a platinum-manganese alloy, an iridium-manganese alloy, a rhodium-manganese alloy, a cobalt oxide and a nickel oxide. The above layers can be formed by a physical vapor deposition (PVD) method such as a sputtering method, an ion beam deposition method and a vacuum vapor deposition method, or a CVD method typified such as an ALD (Atomic Layer Deposition) method.

The insulating material for constituting the tunnel barrier includes an aluminum oxide ($AlO_x$), an aluminum nitride (AlN), a magnesium oxide (MgO), a magnesium nitride, a silicon oxide and a silicon nitride. Further, it also includes Ge, NiO, $CdO_x$, $HfO_2$, $Ta_2O_5$, BN and ZnS. The tunnel barrier can be obtained, for example, by oxidizing or nitriding a metal film formed by a sputtering method. More specifically, when an aluminum oxide ($AlO_x$) is used as an insulating material for constituting the tunnel barrier, the method for forming the tunnel barrier includes a method in which aluminum formed by a sputtering method is oxidized in atmosphere, a method in which aluminum formed by a sputtering method is plasma-oxidized, a method in which aluminum formed by a sputtering method is oxidized with IPC plasma, a method in which aluminum formed by a sputtering method is subject to natural oxidation in oxygen gas, a method in which aluminum formed by a sputtering method is oxidized with oxygen radicals, a method in which aluminum formed by a sputtering method is irradiated with ultraviolet rays while it is subjected to natural oxidation in oxygen gas, a method in which aluminum is formed by a reactive sputtering method, and a method in which an aluminum oxide is formed by a sputtering method. Alternatively, the tunnel barrier can be formed by a CVD method typified by an ALD method.

The stacking structure can be patterned, for example, by a reactive ion etching (RIE) method or an ion milling method. They can be also patterned by a so-called lift-off method as required.

The write-in word line, the bit line or the dummy line is composed, for example, of aluminum, an aluminum alloy such as Al—Cu, or copper (Cu), and it can be formed, for example, by a PVD method such as a sputtering method, a CVD method, or a plating method typified by an electrolytic plating method.

Although not limited, the nonvolatile magnetic memory device in the present invention may have a constitution in which the nonvolatile magnetic memory device comprises;
(a) a transistor for selection which is formed in a semiconductor substrate,
(b) a first insulating interlayer which covers the transistor for selection,
(c) a second insulating interlayer, and
(d) a third insulating interlayer,
in which the write-in word line is formed on the first insulating interlayer,
the second insulating interlayer covers the write-in word line and the first insulating interlayer,
the first ferromagnetic layer is formed on the second insulating interlayer,
the third insulating interlayer covers the tunnel magnetoresistance device and the second insulating interlayer,
an extended portion of the first ferromagnetic layer or a lead-out electrode extending from the first ferromagnetic layer on the second insulating interlayer is electrically connected to the transistor for selection through connecting holes (or connecting holes and a landing pad) provided in the second and first insulating interlayers, and
the bit line is formed on the third insulating interlayer.

The connecting hole can be constituted of a polysilicon doped with an impurity, and a refractory metal or metal silicide such as W, Ti, Pt, Pd, Cu, TiW, TiNW, $WSi_2$ or $MoSi_2$. It can be formed by a chemical vapor deposition method (CVD method), or a PVD method such as a sputtering method.

The transistor for selection can be constituted, for example, of a well-known MIS-type FET or MOS-type FET or a bipolar transistor.

Examples of the material for constituting the first, second or third insulating interlayer include silicon oxide ($SiO_2$), silicon nitride (SiN), SiON, SOG, NSG, BPSG, PSG, BSG, FSG, SiOC, SiC, an organic film (so-called Low-k material) and LTO.

In the nonvolatile magnetic memory device according to the first aspect of the present invention, or in the method of writing data into a tunnel magnetoresistance device in a nonvolatile magnetic memory device according to the first aspect of the present invention, the coefficients g(0) and g(k) are defined such that data is written into the tunnel magnetoresistance device positioned in the overlap region of the m-th-place write-in word line and the n-th-place bit line and no data are written into the tunnel magnetoresistance devices positioned in the overlap regions of the m-th-place write-in word line and the bit lines that are K in number by means of the synthetic magnetic field based on the magnetic field (to be referred to as "main magnetic field") generated by the current $g(0) \cdot I(n)_{BL}$ flowing in the n-th-place bit line, the magnetic fields (to be referred to as "compensatory magnetic fields") generated by the currents $g(k) \cdot I(n)_{BL}$ flowing in the bit lines that are K in number, and the magnetic field generated by the current $I(m)_{RWL}$ flowing in the m-th-place write-in word line. Meanwhile, the spatial FIR filter assuming the magnetic fields, which are supposed to be formed in the n-th-place bit line and the bit lines that are K in number by the current $I(n)_{BL}$, to be discrete pulse response and assuming the coefficients $g(0)$ and $g(k)$ to be tap-gains (to be also called "filter coefficient" or "tap coefficient") is constituted of the n-th-place bit line and the bit lines that are K in number.

In the nonvolatile magnetic memory device according to the second aspect of the present invention, or in the method of writing data into a tunnel magnetoresistance device in a nonvolatile magnetic memory device according to the second aspect of the present invention, the coefficients $g(0)$ and $g(k)$ are defined such that data is written into the tunnel magnetoresistance device positioned in the overlap region of the m-th-place write-in word line and the n-th-place bit line and no data are written into the tunnel magnetoresistance devices positioned in the overlap regions of the n-th-place bit line and the write-in word lines that are K in number by means of the synthetic magnetic field based on the magnetic field (main magnetic field) generated by the current $g(0) \cdot I(m)_{RWL}$ flowing in the m-th-place write-in word line, the magnetic fields (compensatory magnetic fields) generated by the currents $g(k) \cdot I(m)_{RWL}$ flowing in the write-in word lines that are K in number, and the magnetic field generated by the current $I(m)_{RWL}$ flowing in the n-th-place bit line. Meanwhile, the spatial FIR filter assuming the magnetic fields, which are supposed to be formed in the m-th-place write-in word line and the write-in word lines that are K in number by the current $I(m)_{RWL}$, to be discrete pulse response and assuming the coefficients $g(0)$ and $g(k)$ to be tap-gains is constituted of the m-th-place write-in word line and the write-in word lines that are K in number.

In the present invention, therefore, the coefficients $g(0)$ and $g(k)$ can be relatively easily obtained on the basis of a known calculation method in which an amplitude error between the intended property (for example, property satisfying the Nyquist's first criterion) and the filter output in the FIR filter is minimized. The above calculation methods includes well-known methods such as a method of designing a Wiener filter, a calculation method using a least-mean-square (LMS) algorism, a calculation method using a recursive least-mean-square (RLS) algorism, a calculation method using a steepest decent algorism and a calculation method using a learning identification method.

And, the coefficients $g(0)$ and $g(k)$ are defined, whereby erroneous data writing into an adjacent tunnel magnetoresistance device can be reliably prevented, and as a result, data can be simultaneously written into the adjacent tunnel magnetoresistance devices.

BRIEF DESCRIPTION OF THE DRAWINGS

FIG. 27B is a drawing after the equalization with three taps.

FIG. 28B is a drawing after the equalization with seven taps.

FIG. 29B is a drawing after the equalization with three taps.

FIG. 42 is a drawing showing a constitution example of a time-domain FIR filter.

DESCRIPTION OF THE PREFERRED EMBODIMENTS

Prior to the explanation of the nonvolatile magnetic memory device and the method of writing data into a tunnel magnetoresistance device in a nonvolatile magnetic memory device provided by the present invention, first, an example in which a magnetic field (main magnetic field) is generated by a current $g(n) \cdot I(n)$ [$g(0)$:coefficient] flowing in an n-th-place write-in conductor line (bit line or write-in word line) and magnetic fields (compensatory magnetic fields) are generated by currents $g(k) \cdot I(n)$ [$g(k)$:coefficient] flowing in q-th-place write-in conductor lines (q=n+k, k is ±1, ±2, . . . , total number of the write-in conductor lines is K, and $K=2k_0$ when the absolute value of the values that k represents is $k_0$) will be explained with regard to a constitution in which a spatial FIR filter assuming magnetic fields, which are supposed to be formed in the n-th-place write-in conductor line and the q-th-place write-in conductor lines by the current I(n), to be discrete pulse response and assuming the coefficients $g(0)$ and $g(k)$ to be tap-gains is constituted of the n-th-place write-in conductor line and the write-in conductor lines that are K in number (that is, the write-in conductor lines that are $k_0$ in number are arranged on one side of the n-th-place write-in conductor line, and the write-in conductor lines that are $k_0$ in number are arranged on the other side of the n-th-place write-in conductor line). A time-domain FIR filter will be explained beforehand.

Figure 41:
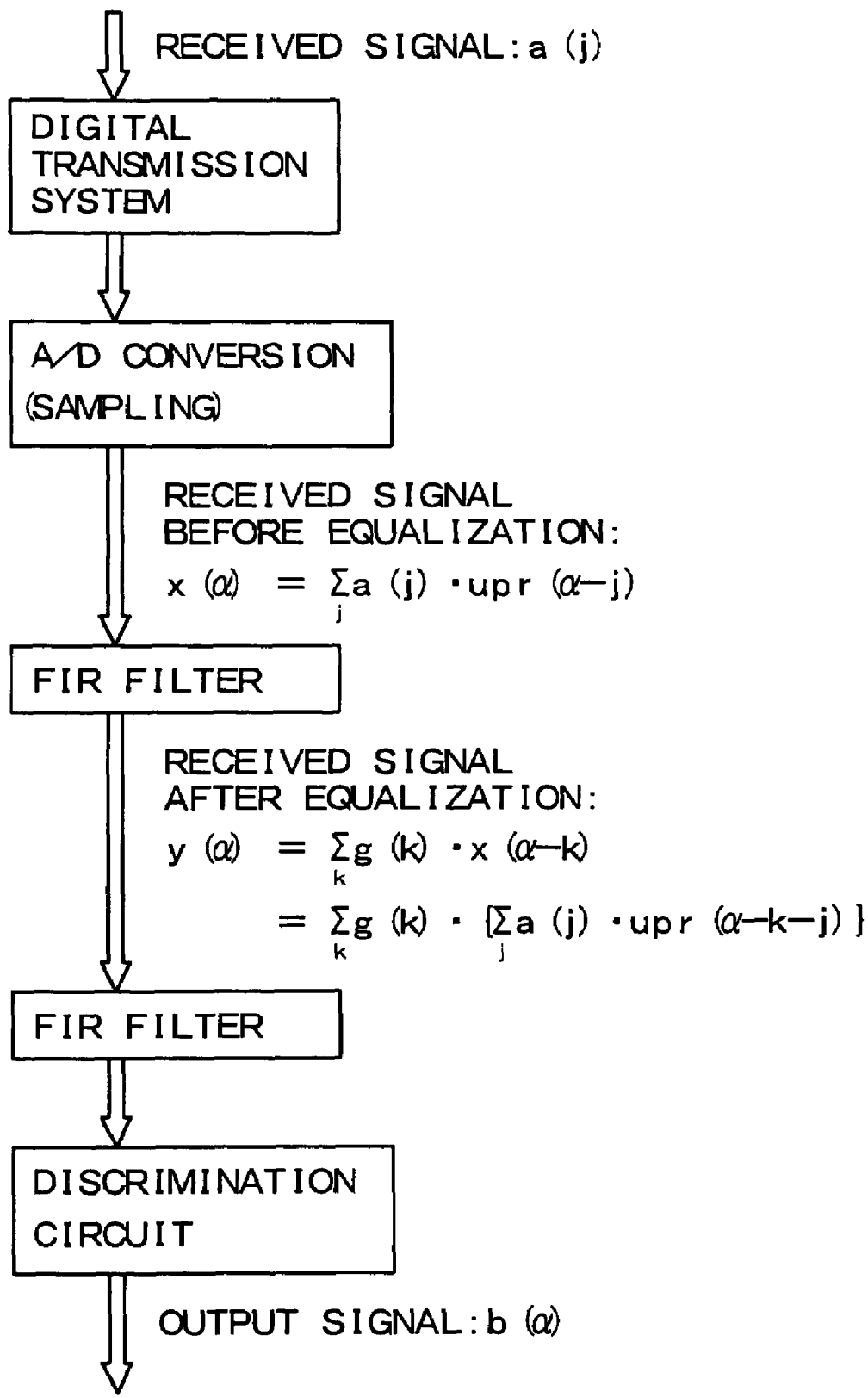
FIG. 41 is a drawing showing a constitution example of a digital transmission system using a time-domain FIR filter.

FIG. 41 shows a constitution of a digital transmission system using a time-domain FIR filter. A received signal a(j) in the digital transmission system represents ±1, and it represents 0 when none is transmitted. The received signal a(j) received in the digital transmission system is mostly AD-converted with a data rate clock to be converted to a discrete received signal $x(\alpha)$. The $x(\alpha)$ is a received signal before equalization and is a signal formed by linearly superimposing a product of the received signal a(j) and a pulse response function (transmission function) $upr(\alpha)$ of the digital transmission system. It can be represented by the following expression (8). "$\alpha$" is an integer representing a discrete time on a receiving side, and j is an integer representing a discrete time on a transmission side.

$$x(\alpha) = \sum_j a(j) \cdot upr(\alpha - j) \quad (8)$$

When the received signal x(α) before equalization passes through the FIR filter, a received signal y(α) after equalization is obtained. The received signal y(α) is a signal obtained by linearly superimposing a product of the tap-gain (g) of the FIR filter and x(α), and can be represented by the following expressions (9-1) and (9-2).

$$y(\alpha) = \sum_k g(k) \cdot x(\alpha - k) \quad (9\text{-}1)$$

$$= \sum_k g(k) \cdot \left\{ \sum_j a(j) \cdot upr(\alpha - k - j) \right\} \quad (9\text{-}2)$$

FIG. 42 shows a constitution example of a time-domain FIR filter. The discrete received signals x(α) before equalization sampled at the time intervals of T are inputted into delay elements FF (composed of flip-flops) having $(2|K_0|+1)$ stages, the outputs from the delay elements FF are multiplied by the tap-gain g(k), and the products are added up, whereby the received signal y(α) after equalization can be obtained.

FIG. 42 shows a case where $|k_0|=2$. That is, a FIR filter with five taps is shown, and when the received signals x(α) before equalization are inputted, the output represented by the following expression (10) is obtained.

$$y(\alpha) = \sum_{k=-2}^{2} g(k) \cdot x(\alpha - k) \quad (10)$$

A delay of time of T corresponds to exp(jwT) in frequency characteristic, so that the frequency characteristic of x(α) can be changed in various ways, and the output (received signal y(α) after equalization) having a desired waveform can be obtained although it depends upon the value of length $[2(|k_0|+1)]$ of the tap.

Figure 43A:
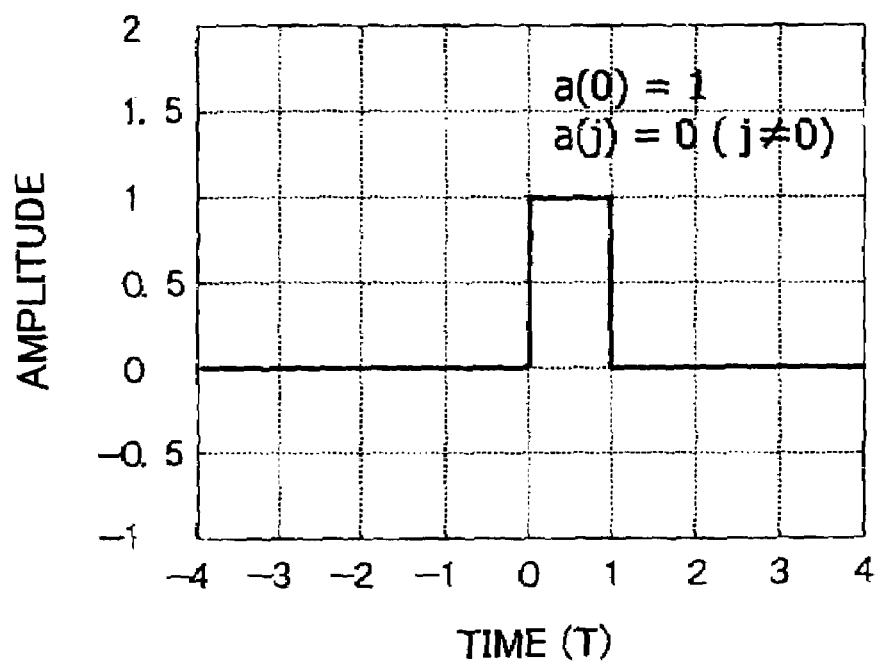
FIG. 43A is a drawing of a unit pulse.
Figure 43B:
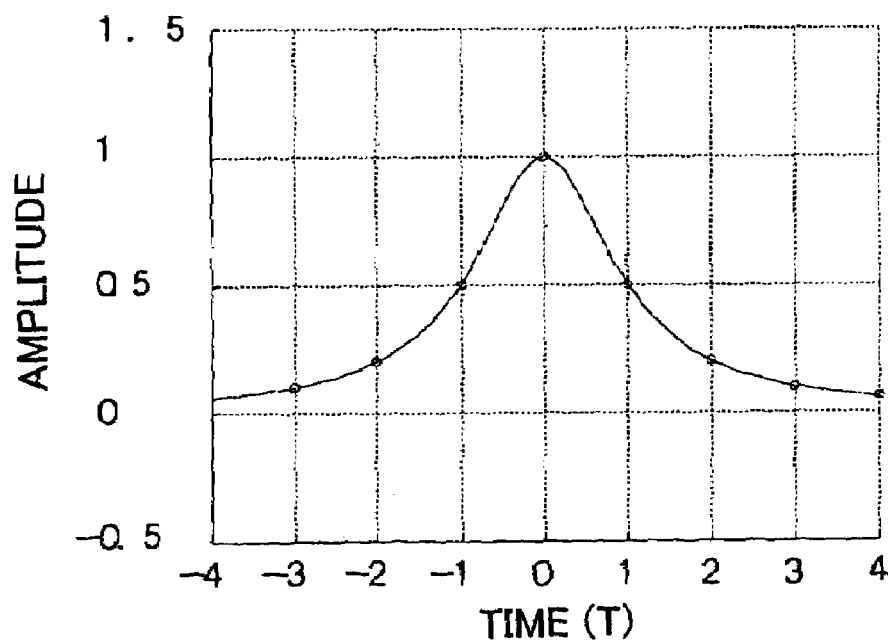
FIG. 43B is a drawing showing pulse response obtained when the unit pulse shown in FIG. 43A is passed through a digital transmission system.

A pulse that represents "1" only for a time period of one clock and represents "0" for other time period like ". . . 00010000 . . . " will be referred to as "unit pulse" in the present specification. A response when a digital transmission system shown, for example, in FIG. 41 receives the unit pulse will be referred to as "pulse response". This is a substitute for an impulse response in an analog transmission system. When the digital transmission system receives the unit pulse shown in FIG. 43A, for example, the pulse response shown in FIG. 43B is obtained.

Figure 44:
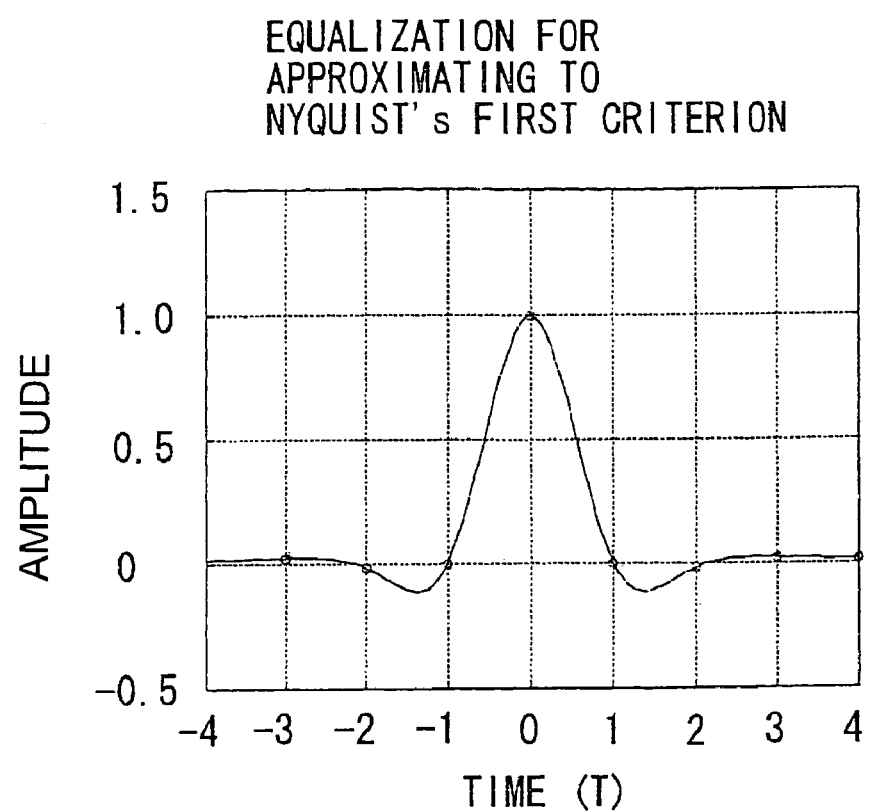
FIG. 44 is a drawing showing pulse response obtained when the unit pulse shown in FIG. 43A is passed through a digital transmission system and equalized so as to approximate to the Nyquist's first criterion.

Adjustment to a predetermined waveform with the time-domain FIR filter is referred to as equalization. In the simplest example of the equalization, the waveform is equalized so as to approximate to the Nyquist's first criterion as shown in FIG. 44. The Nyquist's first criterion means that the amplitude every T that is a sampling time cycle is so defined that the presence of a pulse represents "1" and that any other case represents "0".

The tap-gain g(k) of the time-domain FIR filter can be obtained on the basis of a calculation method in which the amplitude difference between the intended characteristic (Nyquist's first criterion) and the filter output is minimized. The above calculation method includes well-known calculation methods such as a method of designing a Wiener filter, a calculation method using a least-mean-square (LMS) algorithm, a calculation method using a recursive least-mean-square (RLS) algorithm, a calculation method using a steepest descent algorithm and a calculation method using a learning identification method.

Tap-gains g(k) in a 3-tap FIR filter, a 5-tap FIR filter and a 7-tap FIR filter, calculated by a method of designing a Wiener filter, are as shown in the following Tables 1, 2 and 3.

TABLE 1

| | |
|---|---|
| g(−1): | −0.6545 |
| g(0): | 1.6432 |
| g(1): | −0.6545 |

TABLE 2

| | |
|---|---|
| g(−2): | 0.0885 |
| g(−1): | −0.7603 |
| g(0): | 1.7222 |
| g(1): | −0.7603 |
| g(2): | 0.0885 |

TABLE 3

| | |
|---|---|
| g(−3): | −0.0477 |
| g(−2): | 0.1405 |
| g(−1): | −0.7871 |
| g(0): | 1.7373 |
| g(1): | −0.7871 |
| g(2): | 0.1405 |
| g(3): | −0.0477 |

Figure 45A:
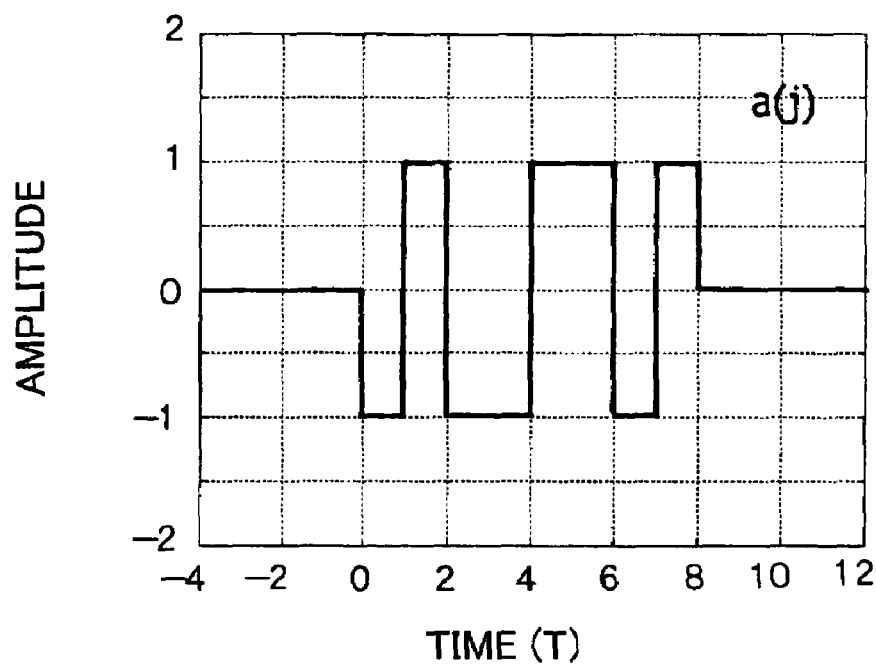
FIG. 45A is a drawing showing transmitted data when data of [0, 0, −1, +1, −1, −1, +1, +1, −1, +1, 0, 0] are transmitted in the digital transmission system shown in FIG. 41.
Figure 45B:
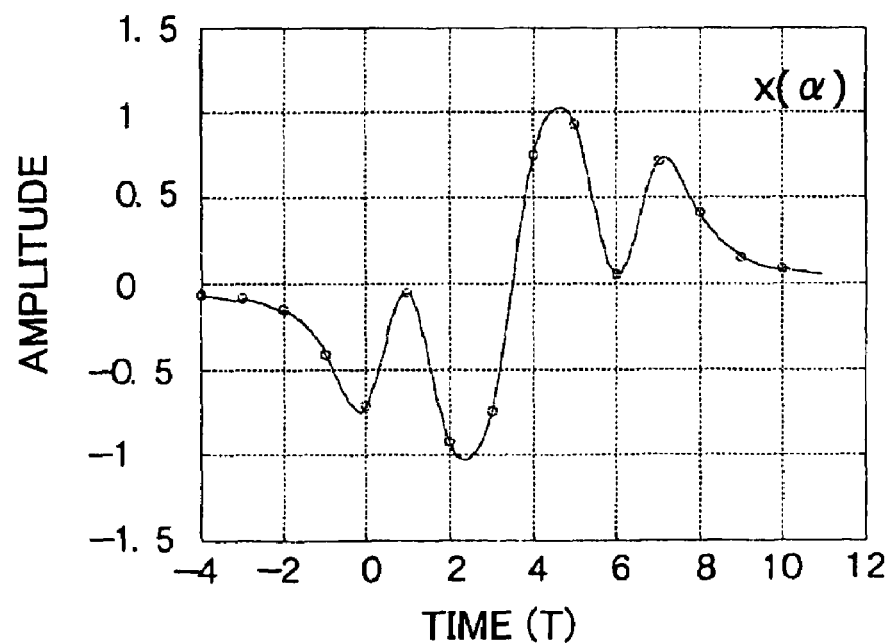
FIG. 45B is a drawing showing a received signal $x(\alpha)$ before equalization of these transmitted data.
Figure 46:
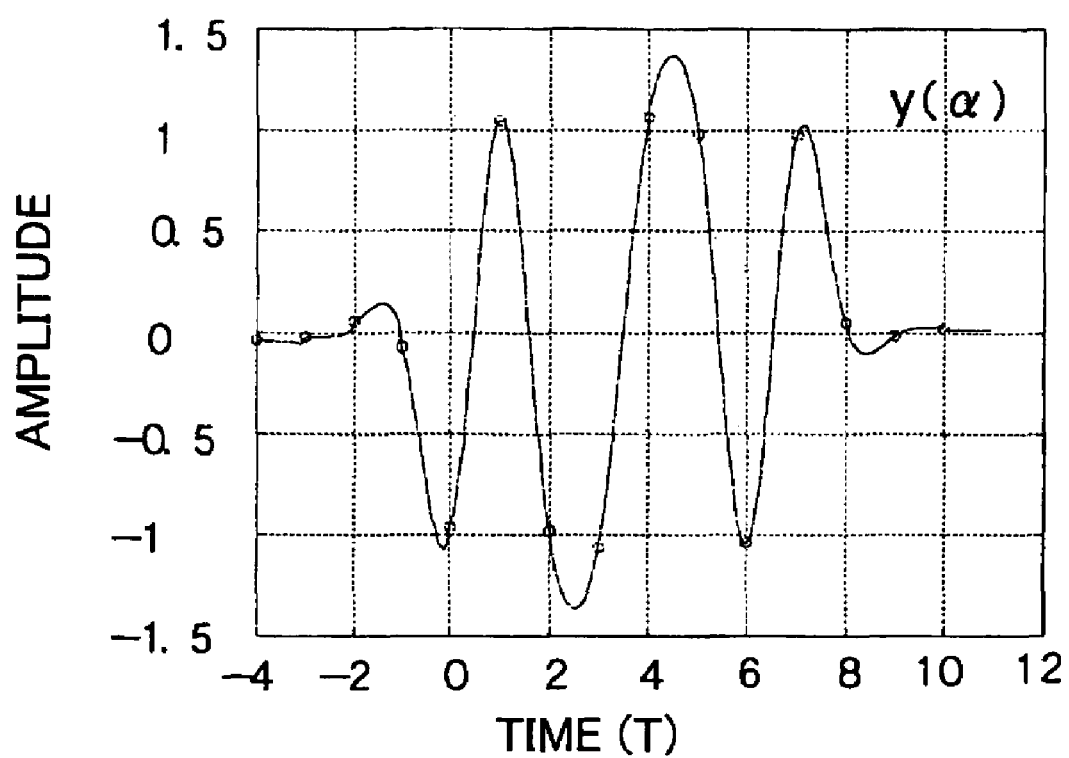
FIG. 46 is a drawing showing a received signal $y(\alpha)$ equalized and obtained by passing the received signal $x(\alpha)$ before equalization shown in FIG. 45B through an FIR filter.

When it is assumed that the digital transmission system shown in FIG. 41 receives data of "0, 0, 0, 0, −1, +1, −1, −1, +1, +1, −1, +1, 0, 0, 0, 0", the transmission data will be as illustrated in FIG. 45A. In this case, if the transmission characteristic is the same as the transmission characteristic shown in FIG. 43B, the pulse response at a time when transmission data is "+1" has the waveform shown in FIG. 43B, and the pulse response at a time when transmission data is "−1" has a waveform obtained by inverting the waveform shown in FIG. 43B. A received signal x(α) before equalization shown in FIG. 45B is obtained by superimposing such waveforms of these pulse responses. When the received signal x(α) before equalization passes through the FIR filter, the received signal y(α) after equalization as shown in FIG. 46 is obtained. The received signal y(α) after equalization is a signal equalized so as to approximate to the Nyquist's first criterion, so that the transmitted data is "+1" at a time of "+1", "−1" at a time of "−1", and "0" at a time of "0". An original transmission data can be therefore easily restored with a discrimination circuit.

Figure 4:
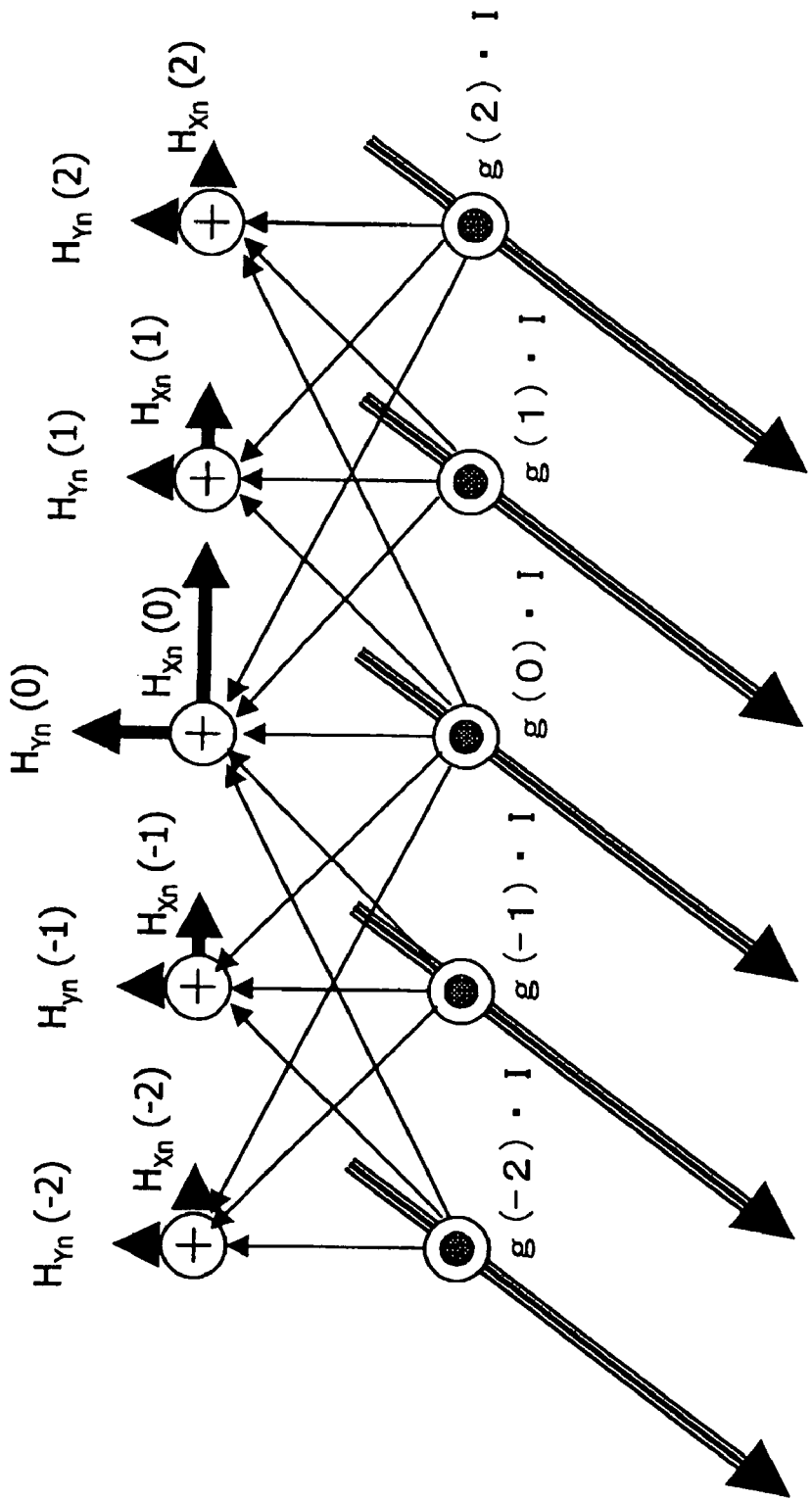
FIG. 4 is a drawing for explaining that write-in conductor lines of a tunnel magnetoresistance device constitute a spatial FIR filter.

FIG. 4 is a drawing for explaining it on the basis of preliminary knowledge on the time-domain FIR filter used in the digital transmission shown in FIGS. 41 to 46, that the write-in conductor lines (bit lines or write-in word lines) of the tunnel magnetoresistance device constitute the spatial FIR filter.

It is assumed that the write-in conductor lines, that are $(2k_0+1)$ in number and have an indefinite length, are arranged in points of (d·k,0) [k is ±1, ±2, . . . ] and in parallel at a distance of "d", and that a current I(0) is passed only through the k-th-place write-in conductor line. The magnetic fields $H_X(0,h)_k$ and $H_Y(0,h)_k$ in the X-axis and Y-axis directions at a point of $(0,h)$ can be determined on the basis of the following expressions (11-1) and (11-2) derived from the expressions (3-1) and (3-2).

$$H_X(0,h)_k = I(0) \cdot \{\sin(\theta_{0,k})/2\pi r_{0,k}\} \tag{11-1}$$

$$H_Y(0,h)_k = I(0) \cdot \{-\cos(\theta_{0,k})/2\pi r_{0,k}\} \tag{11-2}$$

In the expressions (11-1) and (11-2), $r_{0,k}$, $\sin(\theta_{0,k})$ and $\cos(\theta_{0,k})$ are as follows.

$$r_{0,k} = \{(d \cdot k)^2 + h^2\}^{1/2}$$

$$\sin(\theta_{0,k}) = h/r_{0,k}$$

$$\cos(\theta_{0,k}) = -d \cdot k/r_{0,k}$$

Further, when the current $I(0)$ flows in all of the parallel write-in conductor lines that are $(2k_0+1)$ in number, the magnetic fields $H'_X(0,h)_{SUM}$ and $H'_Y(0,h)_{SUM}$ in the X-axis and Y-axis directions at the point of $(0,h)$ can be determined on the basis of the following expressions (12-1) and (12-2), provided that $k_0$ is an absolute value of the maximum value that k represents.

$$H'_X(0,h)_{SUM} = \sum_{k=-k_0}^{k} I(0) \cdot \frac{\sin\theta_{0,k}}{2\pi r_{0,k}} \tag{12-1}$$

$$H'_Y(0,h)_{SUM} = \sum_{k=-k_0}^{k} I(0) \cdot \frac{-\cos\theta_{0,k}}{2\pi r_{0,k}} \tag{12-2}$$

Figure 40:
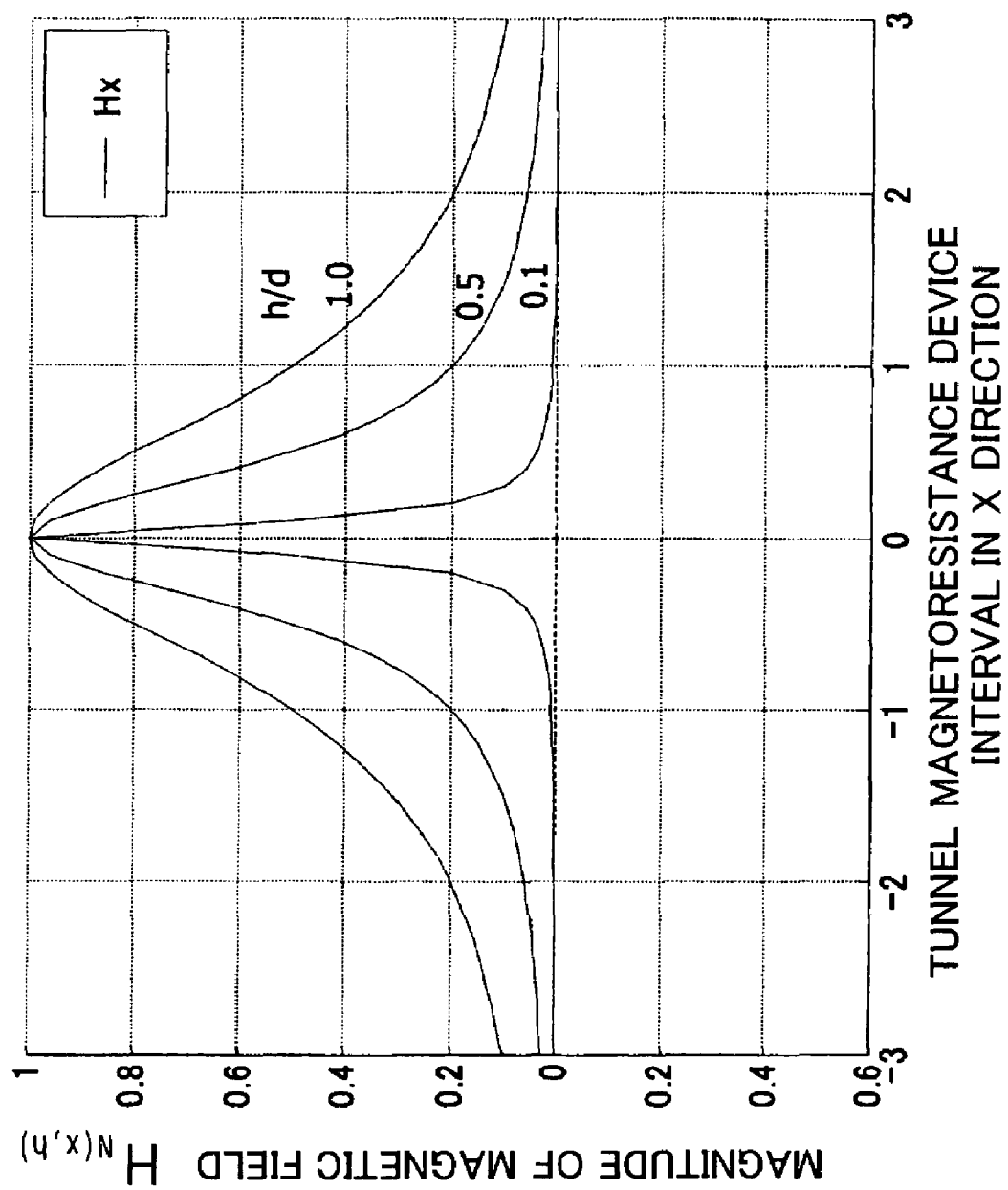
FIG. 40 is a graph showing values of magnetic fields $H_{N(x,H)}$ calculated on the basis of the model drawing shown in FIG. 39.

Meanwhile, when it is supposed that the current $I(0)$ flows only in the 0-place write-in conductor line in the parallel write-in conductor lines that are $(2k_0+1)$ in number (this state corresponds to the above-described unit pulse), the magnetic field in this case is as shown in FIG. 40. This magnetic field corresponds to the pulse response that has been already explained and is shown in FIG. 43B. Further, this magnetic field also corresponds to $x(\alpha-0)$ in the expression (9-1) or $x(\alpha)$ shown in FIG. 42. When it is supposed that the current $I(0)$ flows only in the k-th-place write-in conductor line in the parallel write-in conductor lines that are $(2k_0+1)$ in number, the magnetic field in this case corresponds to $x(\alpha-k)$ in the expression (9-1) or $x(\alpha-k)$ shown in FIG. 42. Therefore, the magnetic fields that are supposed to be formed in the 0-place write-in conductor line and the write-in conductor lines that are $2k_0$ by the current $I(0)$ can be regarded as discrete pulse response.

When a current $g(0) \cdot I(0)$ obtained by multiplying the current $I(0)$ by a proper coefficient $g(0)$ is passed through (or flowed in) the 0-place write-in conductor line and when a current $g(k) \cdot I(0)$ obtained by multiplying the current $I(0)$ by a proper coefficient $g(k)$ is passed through (or flowed in) the k-th-place write-in conductor line, the magnetic fields $H_X(0,h)_{SUM}$ and $H_Y(0,h)_{SUM}$ in the X-axis and Y-axis directions at the point of $(0,h)$ can be determined on the basis of the following expressions (13-1) and (13-2), provided that $k_0$ is an absolute value of the maximum value that k represents.

$$H_X(0,h)_{SUM} = \sum_{k=-k_0}^{k} g(k) \cdot I(0) \cdot \frac{\sin\theta_{0,k}}{2\pi r_{0,k}} \tag{13-1}$$

-continued $$H_Y(0,h)_{SUM} = \sum_{k=-k_0}^{k_0} g(k) \cdot I(0) \cdot \frac{-\cos\theta_{0,k}}{2\pi r_{0,k}} \tag{13-2}$$

Meanwhile, since the magnetic fields, that are supposed to be formed in the 0-place write-in conductor line and the write-in conductor lines that are $2k_0$ in number by the current $I(0)$, can be regarded as discrete pulse response, the coefficients $g(0)$ and $g(k)$ in the expressions (13-1) and (13-2) correspond to tap-gains. Ultimately, it can be said that the spatial FIR filter assuming magnetic fields, which are supposed to be formed in the 0-place write-in conductor line and the write-in conductor lines that are $2k_0$ in number by the current $I(0)$, to be discrete pulse response and assuming the coefficients $g(0)$ and $g(k)$ to be tap-gains is constituted of the 0-place write-in conductor line and the write-in conductor lines that are $2k_0$ in number.

If the coefficients $g(0)$ and $g(k)$ are defined so as to nearly satisfy the Nyquist's first criterion, that is, if the coefficients $g(0)$ and $g(k)$ are defined such that when it is supposed that the current $I(0)$ flows in the k-th-place write-in conductor line [position coordinates:$(d \cdot k, 0)$], the magnetic field at a point of $(d \cdot k, h)$ is a predetermined value $H_0$ or an approximate value to the predetermined value $H_0$, that when it is supposed that the current $I(0)$ does not flow in the k-th-place write-in conductor line, the magnetic field at the point of $(d \cdot k, h)$ is a value of 0 or an approximate value to 0, and that when it is supposed that the current $-I(0)$ flows in the k-th-place write-in conductor line, the magnetic field in the point of $(d \cdot k, h)$ is a predetermined value $-H_0$ or an approximate value to the predetermined value $-H_0$, the occurrence of erroneous data writing can be reliably prevented when data are written into the tunnel magnetoresistance devices in the nonvolatile magnetic memory device to be described below.

More specifically, it is sufficient to define the coefficients $g(0)$ and $g(k)$ such that;

[A] when it is supposed that the current $I(n)_{BL}$ is passed through (or flowed in) the n-th-place (n=1, 2, . . . N) bit line in the bit lines that are N in number and arranged side by side at a distance of "d", the magnetic field generated in the second ferromagnetic layer (memory layer or free layer) of the tunnel magnetoresistance device electrically connected to the n-th-place bit line by the current $I(N)_{BL}$ has a predetermined value $H_0$ or an approximate value to the predetermined value $H_0$,

[B] when it is supposed that the current $I(n)_{BL}$ is not passed through (or flowed in) the n-th-place bit line, the magnetic field, due to such a current $I(n)_{BL}$, in the second ferromagnetic layer of the tunnel magnetoresistance device electrically connected to the n-th-place bit line has a value of 0 or an approximate value to 0, and

[C] when it is supposed that the current $-I(n)_{BL}$ is passed through (or flowed in) the n-th-place bit line, the magnetic field generated in the second ferromagnetic layer of the tunnel magnetoresistance device electrically connected to the n-th-place bit line by the current $-I(n)_{BL}$ has a predetermined value $-H_0$ or an approximate value to the predetermined value $-H_0$.

Alternatively, more specifically, it is sufficient to define the coefficients $g(0)$ and $g(k)$ such that;

[A] when it is supposed that the current $I(m)_{RWL}$ is passed through (or flowed in) the m-th-place (m=1, 2, . . . M) write-in word line in the write-in word lines that are M in number and arranged side by side at a distance of "d", the magnetic field generated in the second ferromagnetic layer (memory layer or free layer) of the tunnel magnetoresistance device opposed to the m-th-place write-in word line by the current $I(m)_{RWL}$ has a predetermined value $H'_0$ or an approximate value to the predetermined value $H'_0$.

[B] when it is supposed that the current $I(m)_{RWL}$ is not passed through (or flowed in) the m-th-place write-in word line, the magnetic field, due to such a current $I(m)_{RWL}$, in the second ferromagnetic layer of the tunnel magnetoresistance device opposed to the m-th-place write-in word line has a value of 0 or an approximate value to 0, and

[C] when it is supposed that the current $-I(m)_{RWL}$ is passed through (or flowed in) the m-th-place write-in word line, the magnetic field generated in the second ferromagnetic layer of the tunnel magnetoresistance device opposed to the m-th-place write-in word line by the current $-I(n)_{RWL}$ has a predetermined value $-H'_0$ or an approximate value to the predetermined value $-H'_0$.

In the example shown in FIG. 4, five write-in conductor lines are present, a write-in current $g(k) \cdot I(0)$ flows in the k-th-place write-in conductor line (k is 0, ±1, ±2). In FIG. 4, the current $I(0)$ is shown as "I". The magnetic fields $H_X(d \cdot s, h)_{SUM}$ and $H_Y(d \cdot s, h)_{SUM}$ in the X-axis and Y-axis directions at a point (d·s,h) where the memory layer of the s-th-place tunnel magnetoresistance device ("s" is one of −2, −1, 0, 1, 2) is positioned, generated by the current flowing in the k-th-place write-in conductor line, can be determined on the basis of the expressions (14-1) and (14-2). "$k_0$" is an absolute value of the maximum value that k represents, and in the example shown in FIG. 4, $k_0=2$. Further, in FIG. 4, the magnetic fields $H_X(d \cdot s,h)_{SUM}$ and $H_Y(d \cdot s,h)_{SUM}$ are shown as $H_{Xn}(s)$ and $H_{Yn}(s)$ for convenience.

$$H_X(d \cdot s, h)_{SUM} = \sum_{k=-k_0}^{k_0} g(k) \cdot I(0) \cdot \frac{\sin\theta_{d \cdot s,k}}{2\pi r_{d \cdot s,k}} \tag{14-1}$$

$$H_Y(d \cdot s, h)_{SUM} = \sum_{k=-k_0}^{k_0} g(k) \cdot I(0) \cdot \frac{-\cos\theta_{d \cdot s,k}}{2\pi r_{d \cdot s,k}} \tag{14-2}$$

wherein $$r_{d \cdot s,k} = [\{(s-k)d\}^2 + h^2]^{1/2}$$

$$\sin\theta_{d \cdot s,k} = \frac{h}{r_{d \cdot s,k}}$$

$$\cos\theta_{d \cdot s,k} = \frac{(s-k)d}{r_{d \cdot s,k}}$$

Figure 2:
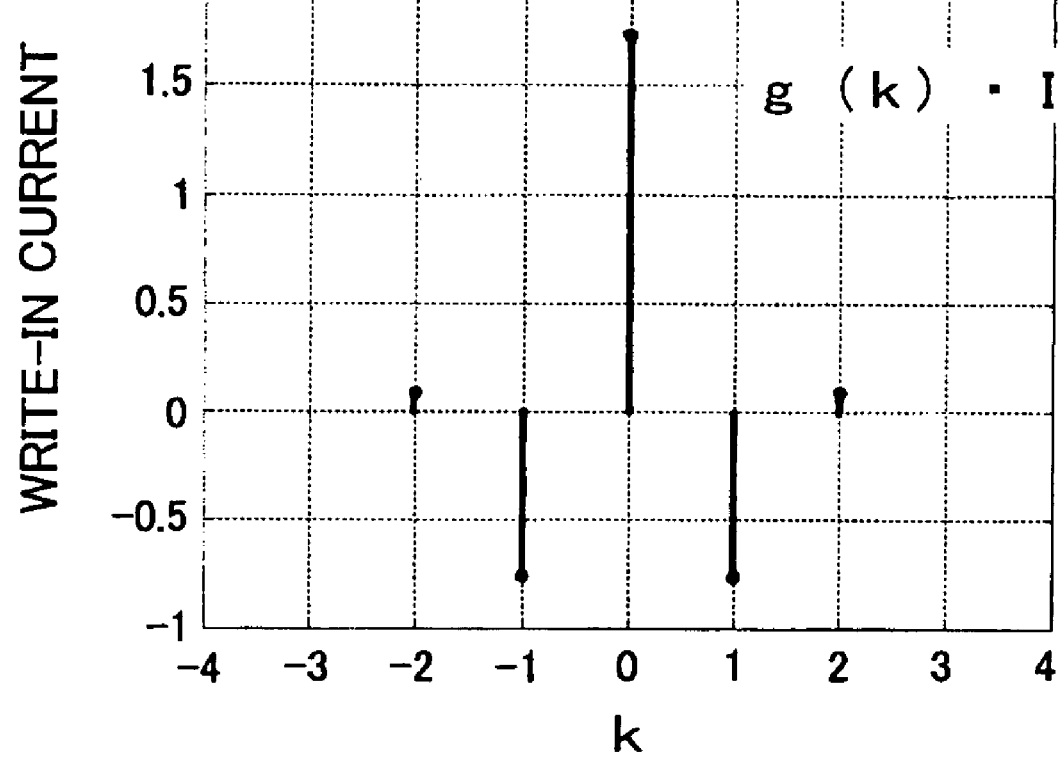
FIG. 2 shows results obtained by adjusting the currents flowing in the write-in conductor lines so that the currents approximate to the Nyquist's first criterion, when it is assumed that a spatial FIR filter is constituted of the five write-in conductor lines (bit lines or write-in word lines).

As described above, the spatial FIR filter is supposed to be constituted of the five write-in conductor lines. That is, it is supposed that the spatial FIR filter assuming the magnetic fields, which are supposed to be formed in the 0-place write-in conductor line and the write-in conductor lines that are $2k_0$ in number by the current $I(0)$, to be discrete pulse response (see FIG. 40) and assuming the coefficients $g(0)$ and $g(k)$ to be tap-gains is constituted of the 0-place write-in conductor line and the write-in conductor lines that are $2k_0$ in number, two of which are arranged on one side of the 0-place write-in conductor line and the balanced two of which are arranged on the other side the 0-place write-in conductor line. FIG. 2 shows the write-in currents (normalized write-in currents) when the currents $g(0) \cdot I(0)$ and $g(k) \cdot I(0)$ in proportion of the coefficients (tap-gains) $g(0)$ and $g(k)$ are passed through (or flowed in) the write-in conductors such that the magnetic fields generated in the positions where the tunnel magnetoresistance devices other the 0-place tunnel magnetoresistance device are positioned are made to be as small as possible. In this case, the currents flowing in the write-in conductor lines are adjusted so as to approximate to the Nyquist's first criterion as are shown in FIG. 44. Specifically, the coefficients (tap-gains) $g(0)$ and $g(k)$ are adjusted to the values shown in Table 2.

Figure 1:
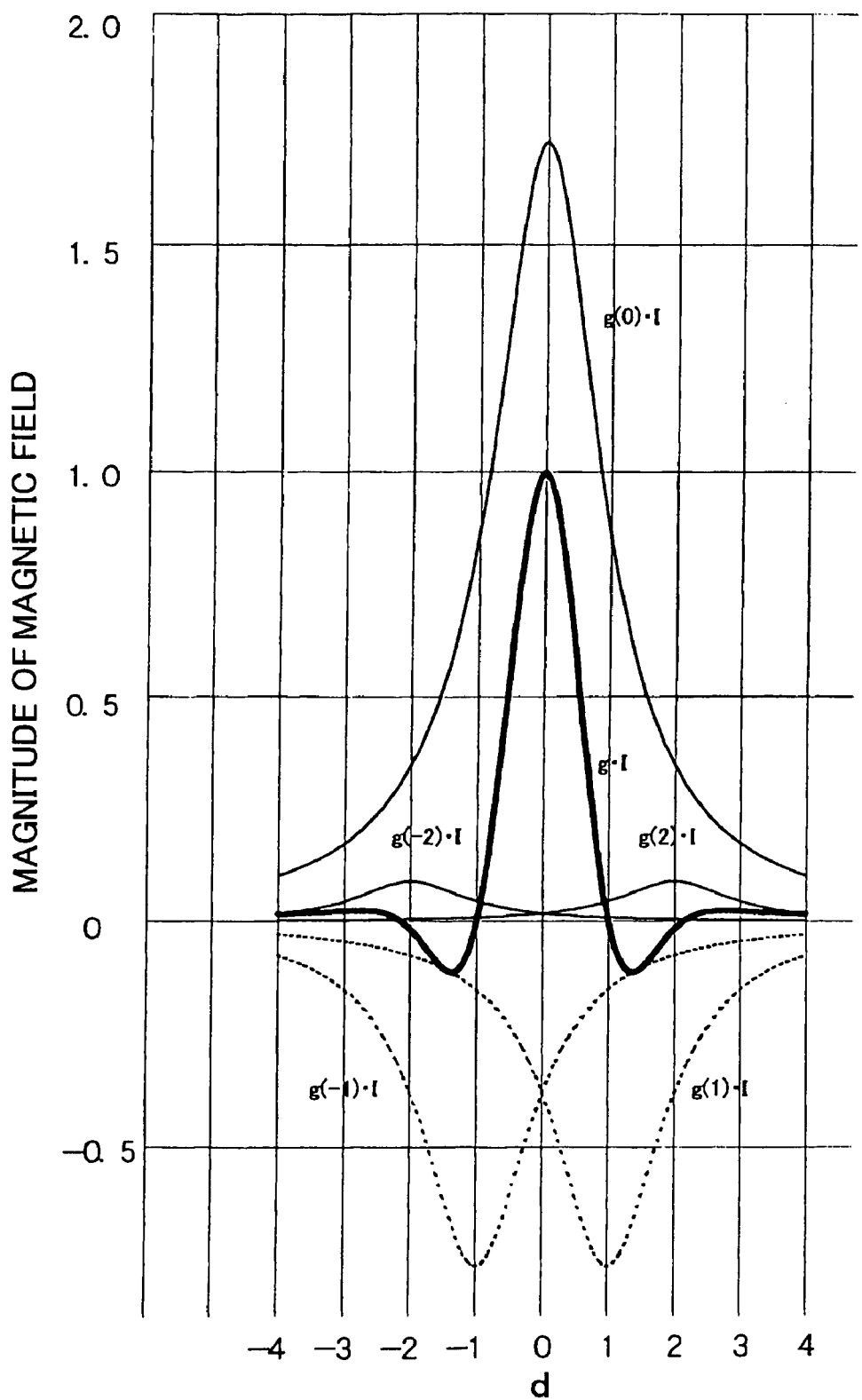
FIG. 1 shows a magnetic field generated by a current $g(0) \cdot I$ flowing in a 0-th-place write-in conductor line, magnetic fields generated by currents $g(k) \cdot I$ flowing in k-th-place write-in conductor lines, and a synthetic magnetic field of these magnetic fields, obtained by adjusting the currents flowing in the write-in conductor lines so that the currents approximate to the Nyquist's first criterion, when it is assumed that a spatial FIR filter is constituted of the five write-in conductor lines (bit lines or write-in word lines).

In this case, when the current $g(0) \cdot I(0)$ is passed through (or flowed in) the 0-place write-in conductor line, the magnetic field $H_{N(0,h)}$ in the X-axis direction in the point (0,h) where the 0-place tunnel magnetoresistance device is positioned is determined on the basis of the following expression based on the expression (7), and FIG. 1 shows the result by a solid line $g(0) \cdot I$. The unit in the axis of abscissas is "d". Further, $\beta=(h/d)=1.0$.

$$H_{N(0,h)}=g(0) \cdot \beta^2/(x^2+\beta^2) \tag{7-A}$$

Further, when the current $g(0) \cdot I(Q)$ is passed through (or flowed in) the first write-in conductor line, the magnetic field $H_{N(d,h)}$ in the X-axis direction in a point (d,h) where the first tunnel magnetoresistance device is positioned is determined on the basis of the following expression based on the expression (7), and FIG. 1 shows the result by a dotted line $g(1) \cdot I$.

$$H_{N(d,h)}=g(1) \cdot \beta^2/\{(x-1)^2+\beta^2\} \tag{7-B}$$

Further, when the current $g(-1) \cdot I(0)$ is passed through (or flowed in) the (−1)-place write-in conductor line, the magnetic field $H_{N(-d,h)}$ in the X-axis direction in a point (−d,h) where the (−1)-place tunnel magnetoresistance device is positioned is determined on the basis of the following expression based on the expression (7), and FIG. 1 shows the result by a dotted line $g(-1) \cdot I$.

$$H_{N(-d,h)}=g(-1) \cdot \beta^2/\{(x+1)^2+\beta^2\} \tag{7-C}$$

Further, when the current $g(2) \cdot I(0)$ is passed through (or flowed in) the second write-in conductor line, the magnetic field $H_{N(2d,h)}$ in the X-axis direction in a point (−2d,h) where the second tunnel magnetoresistance device is positioned is determined on the basis of the following expression based on the expression (7), and FIG. 1 shows the result by a solid line $g(2) \cdot I$.

$$H_{N(2d,h)}=g(2) \cdot \beta^2/\{(x-2)^2+\beta^2\} \tag{7-D}$$

Further, when the current $g(-2) \cdot I(0)$ is passed through (or flowed in) the (−2)-place write-in conductor line, the magnetic field $H_{N(-2d,h)}$ in the X-axis direction in a point (−2d,h) where the (−2)-place tunnel magnetoresistance device is positioned is determined on the basis of the following expression based on the expression (7), and FIG. 1 shows the result by a solid line $g(-2) \cdot I$.

$$H_{N(-2d,h)}=g(-2) \cdot \beta^2/\{(x+2)^2+\beta^2\} \tag{7-E}$$

In FIG. 1, a thick solid line g·I shows a graph obtained by superimposing the magnetic fields $H_{N(0,h)}$, $H_{N(d,h)}$, $H_{N(-d,h)}$, $H_{N(2d,h)}$ and $H_{N(-2d,h)}$, that is, a graph of the value $H_{N(x,h)SUM}$ based on the expression (16) which normalizes the magnetic field H (X,H) in the X-axis direction determined on the basis of the following expression (15) obtained by commonizing the expression (14-1).

$$H(X, h) = \sum_{k=-k_0}^{k_0} g(k) \cdot I(0) \cdot \frac{\sin\theta_k}{2\pi r_k} \tag{15}$$

-continued $$H_{N(x,h)SUM} = \sum_{k=-k_0}^{k_0} g(k) \cdot \frac{\beta^2}{(x-k)^2 + \beta^2} \quad (16)$$

In the expression (15), $r_k$ and $\sin(\theta_k)$ are as follows.

$r_k = \{(X-d \cdot k)^2 + h^2\}^{1/2}$ $\sin(\theta_k) = h/r_k$

As is clear from FIG. 1, in any tunnel magnetoresistance device other than the 0-place tunnel magnetoresistance device where data is to be written, the magnitude of the magnetic field in the X-axis direction is almost zero.

Figure 3A:
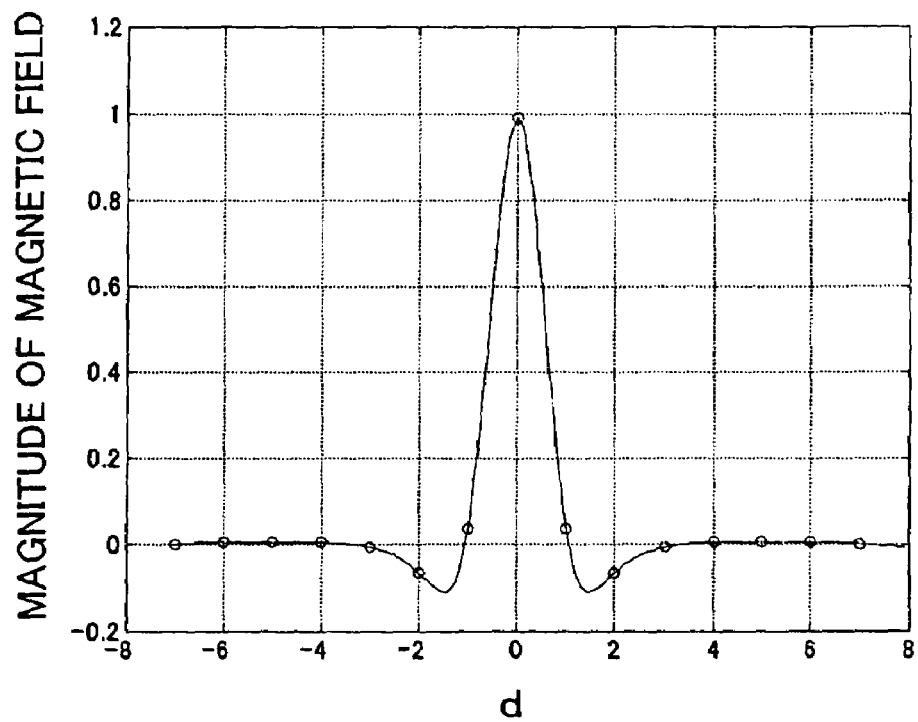
FIG. 3A shows a synthetic magnetic field of a magnetic field generated by a current $g(0) \cdot I$ flowing in a 0-th-place write-in conductor line and magnetic fields generated by currents $g(k) \cdot I$ flowing in k-th-place write-in conductor lines, obtained by adjusting the currents flowing in the write-in conductor lines so that the currents approximate to the Nyquist's first criterion, when it is assumed that a spatial FIR filter is constituted of the three write-in conductor lines (bit lines or write-in word lines)
Figure 3B:
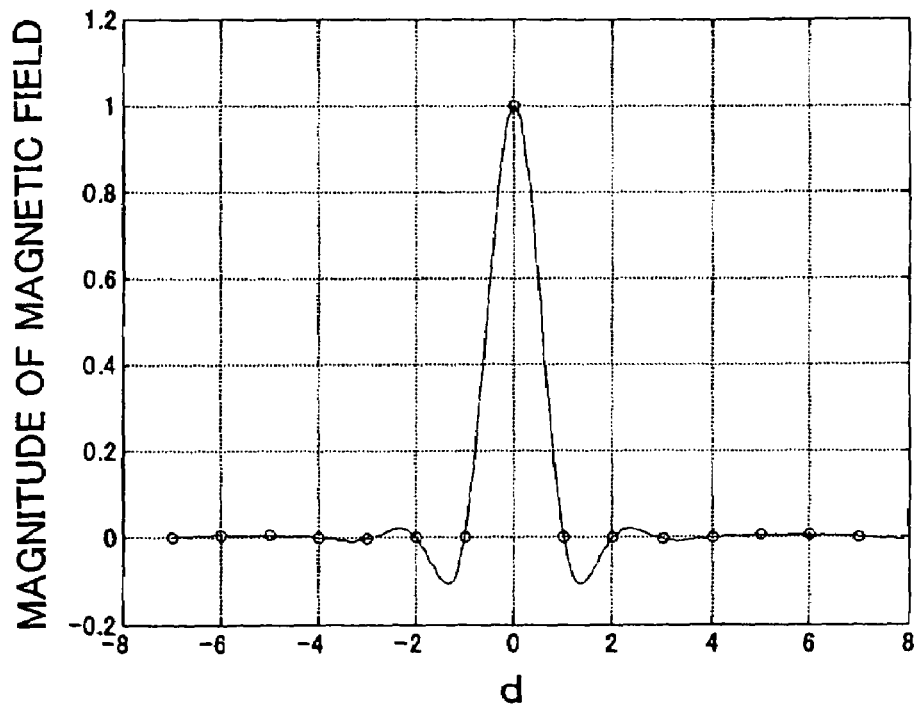
FIG. 3B shows a synthetic magnetic field of a magnetic field generated by a current $g(0) \cdot I$ flowing in a 0-th-place write-in conductor line and magnetic fields generated by currents $g(k) \cdot I$ flowing in k-th-place write-in conductor lines, obtained by adjusting the currents flowing in the write-in conductor lines so that the currents approximate to the Nyquist's first criterion, when it is assumed that a spatial FIR filter is constituted of the seven write-in conductor lines (bit lines or write-in word lines).

Similarly, when it is supposed that three and seven write-in conductor lines constitute spatial FIR filters, the values $H_{N(x,h)SUM}$ based on the expression (16) which normalizes the magnetic fields H(X,h) in the X-axis direction obtained by the expression (15) are as shown in FIGS. 3A and 3B. The unit of the axis of abscissas in each of FIGS. 3A and 3B is "d". In these cases, the currents flowing in the write-in conductor lines are adjusted so as to approximate to the Nyquist's first criterion as similarly as shown in FIG. 44. Specifically, the coefficients (tap-gains) g(0) and g(k) are determined as shown in Tables 1 and 3. Further, $\beta=(h/d)=1.0$. As are clear from FIGS. 3A and 3B, in any tunnel magnetoresistance device other than the 0-place tunnel magnetoresistance device where data is to be written, the magnitude of the magnetic field in the X-axis direction is almost zero.

The following Table 4 shows the values of tap-gains g(0) and g(k) when the value of $\beta=h/d$ is 0.1, 0.5 and 1.0 and three write-in conductor lines are regarded as a spatial FIR filter.

TABLE 4

| $\beta$ = h/d | 0.1 | 0.5 | 1.0 |
|---|---|---|---|
| g(−1) | −0.0099 | −0.2089 | −0.6545 |
| g(0) | 1.0002 | 1.0823 | 1.6432 |
| g(1) | −0.0099 | −0.2089 | −0.6545 |

On the basis of the above explanations, the present invention will be explained below with reference to drawings and on the basis of Examples.

EXAMPLE 1

Figure 5:
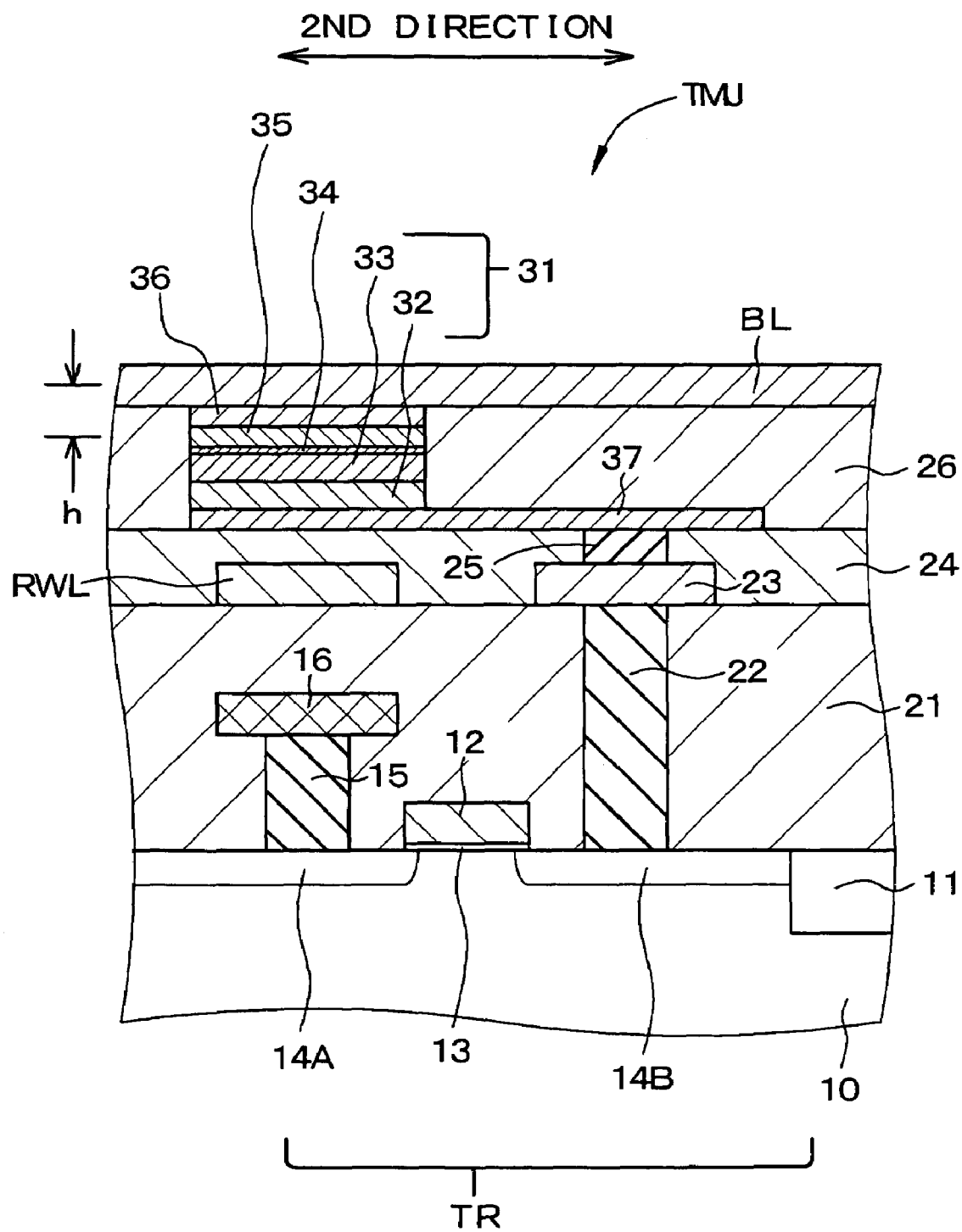
FIG. 5 is a schematic partial cross-sectional view of a nonvolatile magnetic memory device in Example 1.
Figure 6:
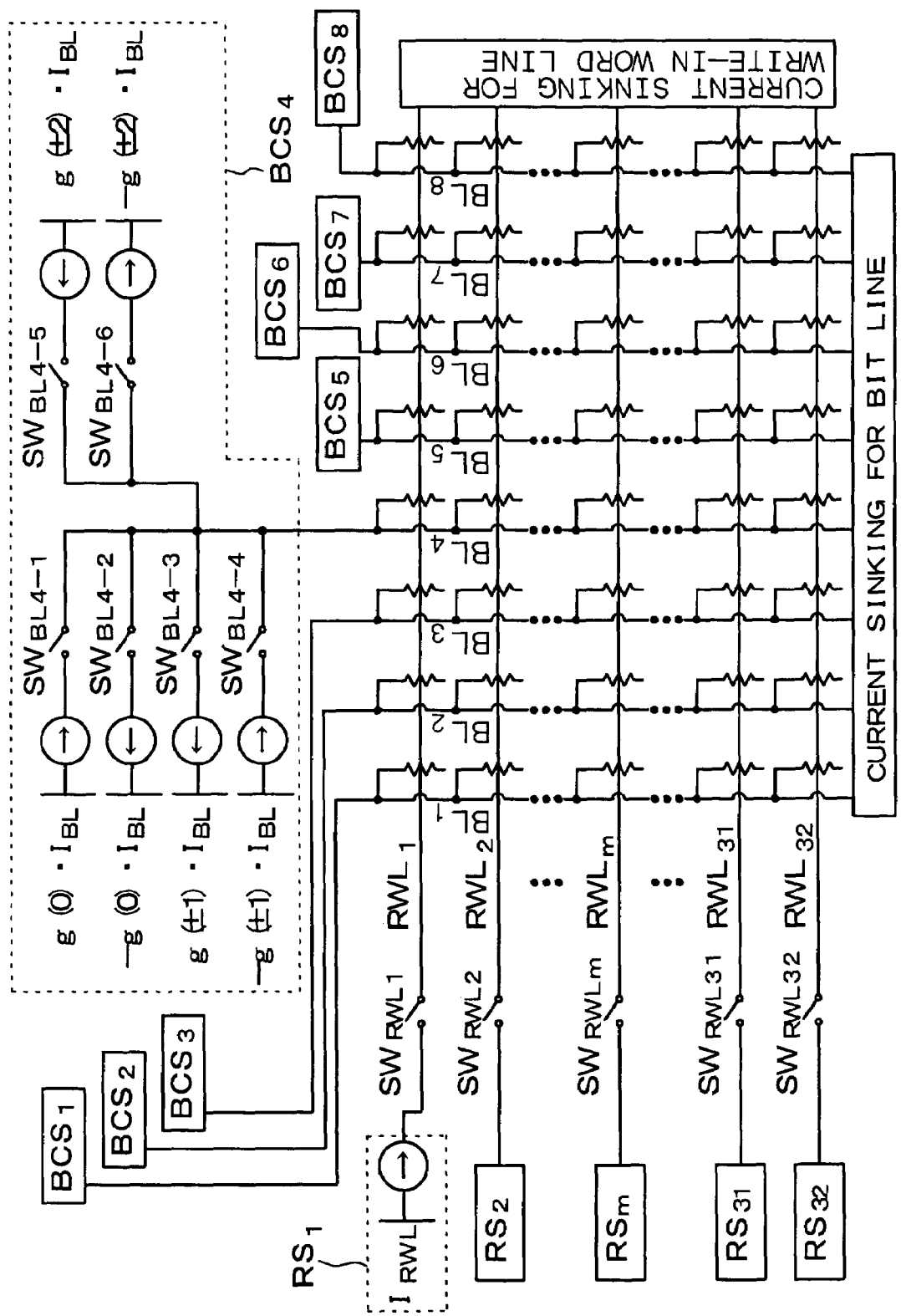
FIG. 6 is an equivalent circuit diagram of the nonvolatile magnetic memory device in Example 1.
Figure 7:
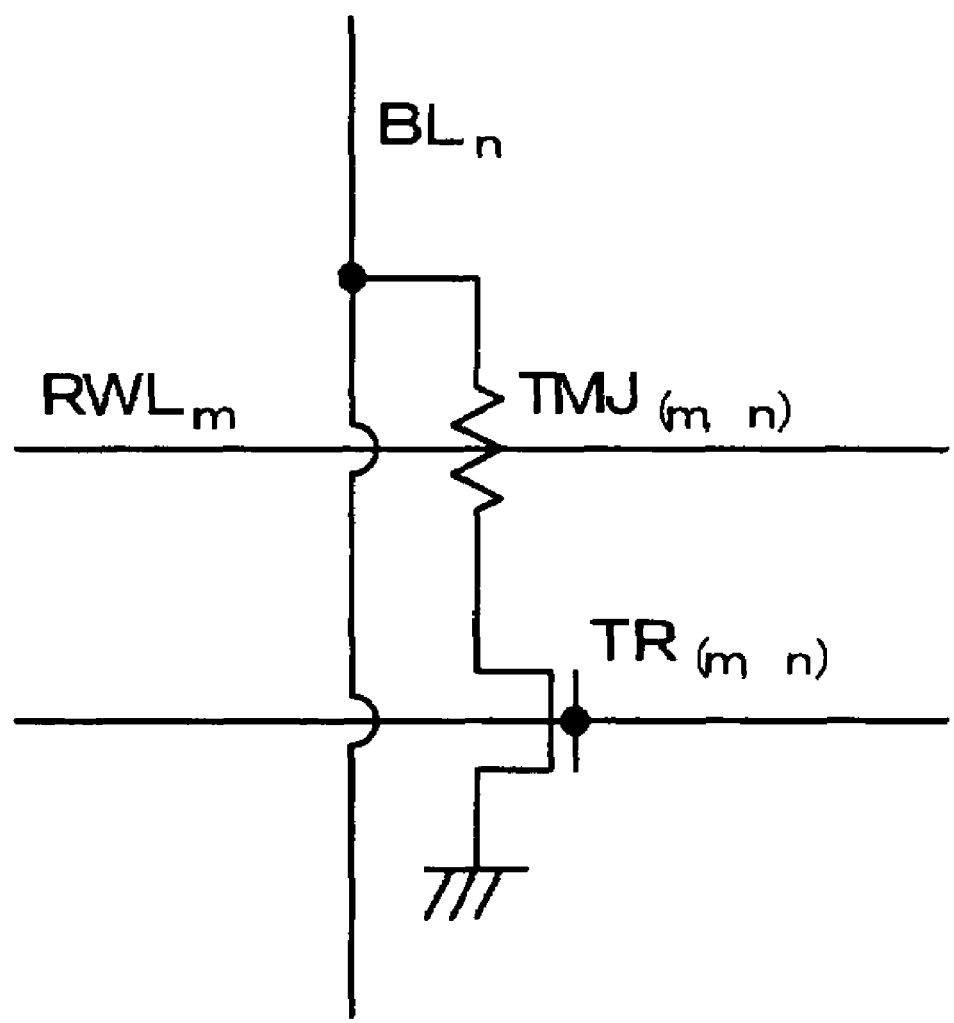
FIG. 7 is an equivalent circuit diagram of one TMR-type tunnel magnetoresistance device.

Example 1 is concerned with the nonvolatile magnetic memory device according to the first aspect of the present invention. FIG. 5 shows a schematic partial cross-sectional view of a TMR-type tunnel magnetoresistance device TMJ in Example 1, FIG. 6 shows an equivalent circuit diagram of the nonvolatile magnetic memory device, and FIG. 7 shows an equivalent circuit diagram of one TMR-type tunnel magnetoresistance device TMJ. In FIGS. 6, 8, 11, 17, 33 to 35 and 37, showing of an equivalent circuit of a transistor for selection TR is omitted. Further, the cross-sectional structure and the equivalent circuit diagram of one TMR-type tunnel magnetoresistance device TMJ can be similarly employed in Examples 2 to 10 to be described later.

One tunnel magnetoresistance device TMJ in Example 1 has a stacking structure of a first ferromagnetic layer 31, a tunnel barrier 34 made of $AlO_x$ and a second ferromagnetic layer 35 (also called a free layer or a memory layer) made of an Ni—Fe alloy which are positioned in this order from below. More specifically, the first ferromagnetic layer 31 has a two-layer structure of an anti-ferromagnetic layer 32 made of an Fe—Mn alloy and a pinned magnetic layer 33 made of an Ni—Fe alloy which are positioned in this order from below. The pinned magnetic layer 33 has its magnetization direction pinned by an exchange coupling with the anti-ferromagnetic layer 32. Due to an externally applied magnetic field (synthetic magnetic field described above), the magnetization direction of the second ferromagnetic layer (memory layer) 35 is changed to the direction in parallel or antiparallel with the magnetization direction of the pinned magnetic layer 33. The first ferromagnetic layer 31 is electrically insulated from the write-in word line RWL through a second insulating interlayer 24. The write-in word line RWL extends in a first direction (direction perpendicular to the paper surface of the drawing). The second ferromagnetic layer 35 is electrically connected to the bit line BT through a top coating film 36 formed of copper (Cu), tantalum (Ta), TiN or the like. The top coating film 36 works to prevent mutual diffusion of atoms constituting the bit line BL and atoms constituting the ferromagnetic layer (memory layer) 35, to reduce a contact resistance and to prevent the oxidation of the ferromagnetic layer (memory layer) 35. A third insulating interlayer 26 covers the tunnel magnetoresistance device TMJ and the second insulating interlayer 24. The bit line BL is formed on the third insulating interlayer 26 and extends to a second direction (right and left direction of the paper surface of the drawing) different from the first direction. In FIG. 5, reference numeral 37 indicates a lead-out electrode connected to the lower surface of the anti-ferromagnetic layer 32.

The transistor for selection TR constituted of a MOS-type FET is formed in a semiconductor substrate 10. More specifically, the transistor for selection TR is formed in an active region surrounded by a device isolation region 11, and comprises a gate electrode 12, a gate insulating film 13 and source/drain regions 14A and 14B. The first insulating interlayer 21 made, for example, of $SiO_2$ covers the transistor for selection TR. The first connecting hole 22 made of a tungsten plug is formed in a first opening portion formed through the first insulating interlayer 21, and is connected to one source/drain region 14B of the transistor for selection TR. The first connecting hole 22 is further connected to a landing pad 23 formed on the first insulating interlayer 21. The write-in word line RWL made of Al—Cu alloy is also formed on the first insulating interlayer 21. The second insulating interlayer 24 is formed on the write-in word line RWL and the first insulating interlayer 21. The lead-out electrode 37 is formed on the second insulating interlayer 24, and is connected to the landing pad 23 through a second connecting hole 25 made of a tungsten plug formed through the second insulating interlayer 24. The other source/drain region 14A of the transistor for selection TR is connected to a sense line 16 through a contact hole 15.

There are some cases where the transistor for selection TR is not required.

As shown in FIG. 6, the nonvolatile magnetic memory device in Example 1 has a nonvolatile magnetic memory array comprising;

(A) the write-in word lines $RWL_m$ that are M in number (m=1, 2, . . . M, M≧1 and M=32 in Example 1), extending in a first direction, (B) the bit lines $BL_n$ that are N in number (n=1, 2, ... N, N≧2 and N=8 in Example 1), extending in a second direction different from the first direction, and (C) the tunnel magnetoresistance devices TMJ described above that are N×M (=8×32) in number, each of which forms in the overlap region of the write-in word line $RWL_m$ and the bit line $BL_n$.

When data is written into the tunnel magnetoresistance device $TMJ_{(m,n)}$ positioned in the overlap region of the m-th-place write-in word line $RWL_m$ (m is one of 1, 2, ... M) and the n-th-place bit line $BL_n$ (n is one of 1, 2, ... N), a current $I(m)_{RWL}$ is passed through (or flowed in) the m-th-place write-in word line $RWL_m$, a current $g(0)\cdot I(n)_{BL}$ is passed through (or flowed in) the n-th-place bit line $BL_n$ [g(0):coefficient], and a current $g(k)\cdot I(n)_{BL}$ [g(k):coefficient] is passed through (or flowed in) the q-th-place bit line $BL_q$ (q=n+k, k represents ±1, ±2, ... , k, and in Example 1, represents a value of −2, −1, 1, 2, and the total number of the lines is K).

When the magnetic fields, which are supposed to be formed in the n-th-place bit line $BL_n$ and the bit lines $BL_q$ that are K in number by the current $I(n)_{BL}$, are assumed to be discrete pulse response, and when the coefficients g(0) and g(k) are assumed to be tap-gains, a spatial FIR filter is constituted of the n-th-place bit line $BL_n$ and the bit lines $BL_q$ that are K in number.

Further, the coefficients g(0) and g(k) are defined such that data is written into the tunnel magnetoresistance device $TMJ_{(m,n)}$ positioned in the overlap region of the m-th-place write-in word line $RWL_m$ and the n-th-place bit line $BL_n$ and no data are written into the tunnel magnetoresistance devices $TMJ_{(m,q)}$ positioned in the overlap regions of the m-th-place write-in word line and the bit lines $BL_q$ that are K in number by the synthetic magnetic field based on the magnetic field (main magnetic field) generated by the current $g(0)\cdot I(n)_{BL}$ flowing in the n-th-place bit line $BL_n$, the magnetic fields (compensatory magnetic fields) generated by the currents $g(k)\cdot I(n)_{BL}$ flowing in the bit lines $BL_q$ that are K in number, and the magnetic field generated by the current $I(m)_{RWL}$ flowing in the m-th-place write-in word line.

Figure 39:
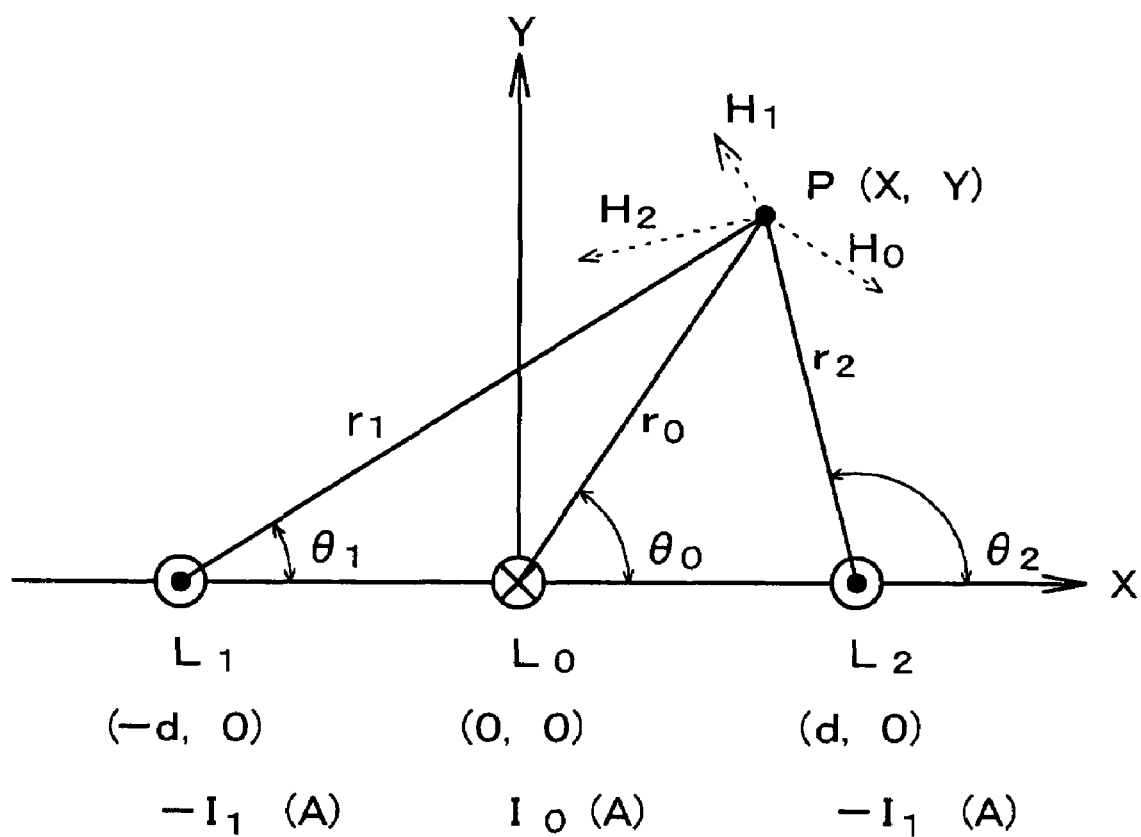
FIG. 39 is a model drawing for determining a magnetic field generated when three conductor lines have an infinite length and these three conductor lines are placed side by side apart at a distance of "d".

When the value of k represents ±1 and ±2 as examples, and when a simple model in FIG. 39 is used for approximation, the values of g(−2), g(−1), g(0), g(1) and g(2) when β=(h/d)=1.0 are as shown in Table 2. The absolute value $k_0$ of the maximum value that k represents is 2. Further, the value of n and the value of K have a relationship as shown in the following Table 5.

TABLE 5

When n = 1, K = 2.
When n = 2, K = 3.
When 3 ≦ n ≦ (N − 2), K = 4.
When n = (N − 1), K = 3.
When n = N, K = 2.

The value of $I(m)_{RWL}$ may be changed depending upon the value of m, and the value of $I(n)_{BL}$ may be changed depending upon the value of n, while Examples 1 to 10 use a constant value as the value of $I(m)_{RWL}$ regardless of the value of m, and use a constant value as the value of $I(N)_{BL}$ regardless of the value of n. The value of a constant $I(n)_{RWL}$ is expressed as $I_{RWL}$, and the value of a constant $|I(n)_{BL}|$ is expressed as $I_{BL}$.

Meanwhile, the value of g(−2) and the value of g(2) are the same, and the value of g(−1) and the value of g(1) are the same. In the following explanation, therefore, the current source for letting the current $g(-1)\cdot I_{BL}$ flow and the current source for letting the current $g(1)\cdot I_{BL}$ flow are constituted of one current source, and the current source for letting the current $g(-2)\cdot I_{BL}$ flow and the current source for letting the current $g(2)\cdot I_{BL}$ flow are constituted of one current source. This will be also applicable to Examples 2 to 5.

That is, the bit line $BL_n$ is provided with a current source unit $BCS_n$ for letting the current $\pm g(0)\cdot I(n)_{BL}$ [more specifically, the current $g(0)\cdot I(n)_{BL}$ and the current $-g(0)\cdot I(n)_{BL}$], the current $\pm g(\pm 1)\cdot I(n)_{BL}$ [more specifically, the current $g(\pm 1)\cdot I_{BL}$ and the current $-g(\pm 1)\cdot I_{BL}$] and the current $\pm g(\pm 2)\cdot I(n)_{BL}$ [more specifically, the current $(\pm 2)\cdot I_{BL}$ and the current $-g(\pm 2)\cdot I_{BL}$] flow in the bit lines $BL_n$.

The current source unit $BCS_n$ is provided with open/close circuits $SW_{BLn-i}$ (i=1, 2, 3, 4, 5, 6) constituted of a MOS-type FET each, and one of six currents, the current $g(0)\cdot I_{BL}$, the current $-g(0)\cdot I_{BL}$, the current $g(\pm 1)\cdot I_{BL}$, the current $-g(\pm 1)\cdot I_{BL}$, the current $g(\pm 2)\cdot I_{BL}$ and the current $-g(\pm 2)\cdot I_{BL}$, can be passed through (or flowed in) the bit line $BL_n$ from the current source unit $BCS_n$ by the ON/OFF operation of the open/close circuits $SW_{BLn-i}$. FIG. 6 shows the current source unit $BCS_4$ connected to the fourth bit line $BL_4$, while other current source units $BCS_1$ to $BCS_3$ and $BCS_5$ to $BCS_8$ have the same constitution as that of the current source unit $BCS_4$.

The current source units and a dummy line current source unit, a bit line current source unit and a write-in word line current source unit to be described later can have known circuit constitutions, and the switch circuit and the open/close circuit can be constituted, for example, of a MOS-type FET.

The current $g(0)\cdot I_{BL}$ or the current $-g(0)\cdot I_{BL}$ is a current (to be sometimes referred to as "main magnetic field generating current $\pm g(0)\cdot I_{BL}$") for generating a magnetic field for writing data into the tunnel magnetoresistance devices, that are M in number, (tunnel magnetoresistance device $TMJ_{(1,n)}$–tunnel magnetoresistance devices $TMJ_{(M,n)}$) electrically connected to the n-th-place bit line $BL_n$.

The current $g(\pm 1)\cdot I_{BL}$ or the current $-g(\pm 1)\cdot I_{BL}$ is a compensatory current (to be sometimes referred to as "first compensatory magnetic field generating current $\pm g(\pm 1)\cdot I_{BL}$") for generating the compensatory magnetic field for preventing the destruction of data stored in the tunnel magnetoresistance devices (tunnel magnetoresistance device $TMJ_{(1,n)}$–tunnel magnetoresistance device $TMJ_{(M,n)}$) electrically connected to the n-th-place bit line $BL_n$, which destruction is caused by the magnetic field generated as a result of the flowing of the main magnetic field generating current $\pm g(0)\cdot I_{BL}$ in the bit line $BL_n$, when data are written into the tunnel magnetoresistance devices (tunnel magnetoresistance device $TMJ_{(1,n')}$—tunnel magnetoresistance device $TMJ_{(M,n')}$) electrically connected to the bit line $BL_{n'}$, [n'=n±1, and 2≦n'≦(N−1)] adjacent to the n-th-place bit line $BL_n$.

Further, the current $g(\pm 2)\cdot I_{BL}$ or the current $-g(\pm 2)\cdot I_{BL}$ is a compensatory current (to be sometimes referred to as "second compensatory magnetic field generating current $\pm g(\pm 2)\cdot I_{BL}$") for generating the compensatory magnetic field for preventing the destruction of data stored in the tunnel magnetoresistance devices (tunnel magnetoresistance device $TMJ_{(1,n)}$–tunnel magnetoresistance device $TMJ_{(M,n)}$) electrically connected to the n-th-place bit line $BL_n$, which destruction is caused by the magnetic field generated as a result of the flowing of the main magnetic field generating current $\pm g(0)\cdot I_{BL}$ in the bit line $BL_{n''}$ when data are written into the tunnel magnetoresistance devices (tunnel magnetoresistance device $TMJ_{(1,n'')}$–tunnel magnetoresistance device $TMJ_{(M,n''')}$ electrically connected to the bit line $BL_{n'''}$ [$n'''=n\pm2$, and $3 \leq n''' \leq (N-2)$] adjacent to the n-th-place bit line $BL_n$.

That is, when the main magnetic field generating current $\pm g(0) \cdot I_{BL}$ is passed through the adjacent bit line $BL_{n'}$, the first compensatory magnetic field generating current $\pm g(\pm1) \cdot I_{BL}$ is passed through the n-th-place bit line $BL_n$. Further, when the main magnetic field generating current $\pm g(0) \cdot I_{BL}$ is passed through the adjacent bit line $BL_{n'''}$, the second compensatory magnetic field generating current $\pm g(\pm2) \cdot I_{BL}$ is passed through the n-th-place bit line $BL_n$. When it is not required to write data into the tunnel magnetoresistance device TMJ, no current is passed through any bit line.

The write-in word line $RWL_m$ is connected to a write-in word line current source $RS_m$ through an open/close circuit $SW_{RWLm}$ constituted of a MOS-type FET. When the open/close circuit $SW_{RWLm}$ is in an ON-state, the current $I_{RWL}$ flows in the write-in word line $RWL_m$.

In the nonvolatile magnetic memory device in Example 1, when data is written into the tunnel magnetoresistance device TMJ, the open/close circuit $SW_{RWL1}$ is brought into an ON-state to pass (flow) the current $I_{RWL}$ through (in) the first write-in word line $RWL_1$ from the write-in word line current source $RS_1$. And, the main magnetic field generating current $\pm g(0) \cdot I_{BL}$ is passed through (or flowed in) the first bit line $BL_1$, the first compensatory magnetic field generating current $\pm g(\pm1) \cdot I_{BL}$ is passed through (or flowed in) the second bit line $BL_2$, and the second compensatory magnetic field generating current $\pm g(\pm2) \cdot I_{BL}$ is passed through (or flowed in) the third bit line $BL_3$. These procedures are consecutively repeated from the second write-in word line $RWL_2$ to the M-th-place write-in word line $RWL_M$.

Then, again, the current $I_{RWL}$ is passed through (or flowed in) the first write-in word line $RWL_1$ from the write-in word line current source $RS_1$. And, the main magnetic field generating current $\pm g(0) \cdot I_{BL}$ is passed through (or flowed in) the second bit line $BL_2$, the first compensatory magnetic field generating currents $\pm g(\pm1) \cdot I_{BL}$ are passed through (or flowed in) the first bit line $BL_1$ and the third bit line $BL_3$, and the second compensatory magnetic field generating current $\pm g(\pm2) \cdot I_{BL}$ is passed through (or flowed in) the fourth bit line $BL_4$. These procedures are consecutively repeated from the second write-in word line $RWL_2$ to the M-th-place write-in word line $RWL_M$.

Further, again, the current $I_{RWL}$ is passed through (or flowed in) the first write-in word line $RWL_1$ from the write-in word line current source $RS_1$. And, the main magnetic field generating current $\pm g(0) \cdot I_{BL}$ is passed through (or flowed in) the third bit line $BL_3$, the first compensatory magnetic field generating currents $\pm g(\pm1) \cdot I_{BL}$ are passed through (or flowed in) the second bit line $BL_2$ and the fourth bit line $BL_4$, and the second compensatory magnetic field generating currents $\pm g(\pm2) \cdot I_{BL}$ are passed through (or flowed in) the first bit line $BL_1$ and the fifth bit line $BL_5$. These procedures are consecutively repeated from the second write-in word line $RWL_2$ to the M-th-place write-in word line $RWL_M$. Further, these procedures are consecutively repeated from the fourth bit line $BL_4$ to the (N–2)-th-place bit line $BL_{N-2}$.

Then, again, the current $I_{RWL}$ is passed through (or flowed in) the first write-in word line $RWL_1$ from the write-in word line current source $RS_1$. And, the main magnetic field generating current $\pm g(0) \cdot I_{BL}$ is passed through (or flowed in) the (N–1)-th-place bit line $BL_{N-1}$, the first compensatory magnetic field generating currents $\pm g(\pm1) \cdot I_{BL}$ are passed through (or flowed in) the (N–2)-th-place bit line $BL_{N-2}$ and the N-th-place bit line $BL_N$, and the second compensatory magnetic field generating current $\pm g(\pm2) \cdot I_{BL}$ is passed through (or flowed in) the (N–3)-th-place bit line $BL_{N-3}$. These procedures are consecutively repeated from the second write-in word line $RWL_2$ to the M-th-place write-in word line $RWL_M$.

Further, again, the current $I_{RWL}$ is passed through (or flowed in) the first write-in word line $RWL_1$ from the write-in word line current source $RS_1$. And, the main magnetic field generating current $\pm g(0) \cdot I_{BL}$ is passed through (or flowed in) the N-th-place bit line $BL_N$, the first compensatory magnetic field generating current $\pm g(\pm1) \cdot I_{BL}$ is passed through (or flowed in) the (N–1)-th-place bit line $BL_{N-1}$, and the second compensatory magnetic field generating current $\pm g(\pm2) \cdot I_{BL}$ is passed through (or flowed in) the (N–2)-th-place bit line $BL_{N-2}$. These procedures are consecutively repeated from the second write-in word line $RWL_2$ to the M-th-place write-in word line $RWL_M$.

The above-explained operation is given as an example and may be modified as required. In Examples 2 to 5, further, data can be written into tunnel magnetoresistance devices that are M×N in number, substantially by the same method.

[Writing of Data into Tunnel Magnetoresistance Device $TMJ_{(2,4)}$]

A case of writing data into the tunnel magnetoresistance device $TMJ_{(2,4)}$ connected to the fourth bit line $BL_4$ and positioned in the overlap region of the fourth bit line $BL_4$ and the second write-in word line $RWL_2$ (opposed to the second write-in word line $RWL_2$) will be explained below as an example.

Immediately before data is written, all of the open/close circuits $SW_{RWLm}$ (m=1, 2, ... M) are in an OFF-state. For starting the writing of data, the open/close circuit $SW_{RWL2}$ is brought into an ON-state, whereby the current $I_{RWL}$ is passed through (or flowed in) the second write-in word line $RWL_2$ from the write-in word line current source $RS_2$. In the current source unit $BCS_4$, the open/close circuit $SW_{BLn-i}$ (n=4, i=1 or 2) is selected and brought into an ON-state, depending upon which data, "1" or "0", is written into the tunnel magnetoresistance device $TMJ_{(2,4)}$. As a result, the main magnetic field generating current $g(0) \cdot I_{BL}$ (when data "1" is written) flows in the fourth bit line $BL_4$, or the main magnetic field generating current $-g(0) \cdot I_{BL}$ (when data "0" is written) flows in the fourth bit line $BL_4$.

When data "1" is written in the tunnel magnetoresistance device $TMJ_{(2,4)}$, in the current source unit $BCS_3$ and the current source unit $BCS_5$, the open/close circuits $SW_{BLn-i}$ (n=3 and 5, i=3) are selected to come into an ON-state. As a result, the first compensatory magnetic field generating currents $g(\pm1) \cdot I_{BL}$ flow in the third bit line $BL_3$ and the fifth bit line $BL_5$. On the other hand, when data "0" is written into the tunnel magnetoresistance device $TMJ_{(2,4)}$, in the current source unit $BCS_3$ and the current source unit $BCS_5$, the open/close circuits $SW_{BLn-i}$ (n=3 and 5, i=4) are selected to come into an ON-state. As a result, the first compensatory magnetic field generating currents $-g(\pm1) \cdot I_{BL}$ flow in the third bit line $BL_3$ and the fifth bit line $BL_5$.

Further, when data "1" is written in the tunnel magnetoresistance device $TMJ_{(2,4)}$, in the current source unit $BCS_2$ and the current source unit $BCS_6$, the open/close circuits $SW_{BLn-i}$ (n=2 and 6, i=5) are selected to come into an ON-state. As a result, the second compensatory magnetic field generating currents $g(\pm2) \cdot I_{BL}$ flow in the second bit line $BL_2$ and the sixth bit line $BL_6$. On the other hand, when data "0" is written in the tunnel magnetoresistance device TMJ $_{(2,4)}$, in the current source unit BCS$_2$ and the current source unit BCS$_6$, the open/close circuits SW$_{BLn-i}$ (n=2 and 6, i=6) are selected to come into an ON-state. As a result, the second compensatory magnetic field generating currents −g(±2)·I$_{BL}$ flow in the second bit line BL$_2$ and the sixth bit line BL$_6$.

By the synthetic field generated as the result of the above [synthetic magnetic field of (1) the magnetic field generated by the current I$_{RWL}$ flowing in the second write-in word line RWL$_2$; (2) the magnetic field generated by the main magnetic field generating current g(0)·I$_{BL}$ flowing in the fourth bit line BL$_4$; (3) the magnetic fields generated by the first compensatory magnetic field generating currents g(±1)·I$_{BL}$ flowing in the third and fifth bit lines BL$_3$ and BL$_5$; and (4) the magnetic fields generated by the second compensatory magnetic field generating currents g(±2)·I$_{BL}$ flowing in the second and sixth bit lines BL$_2$ and BL$_6$], the magnetization direction of the second ferromagnetic layer (memory layer) 35 in the tunnel magnetoresistance device TMJ$_{(2,4)}$ is changed, to record "1" in the second ferromagnetic layer (memory layer) 35. Alternatively, by the synthetic magnetic field [synthetic magnetic field of (1) the magnetic field generated by the current I$_{RWL}$ flowing in the second write-in word line RWL$_2$; (2) the magnetic field generated by the main magnetic field generating current −g(0)·I$_{BL}$ flowing in the fourth bit line BL$_4$; (3) the magnetic fields generated by the first compensatory magnetic field generating currents−g(±1)·I$_{BL}$ flowing in the third and fifth bit lines BL$_3$ and BL$_5$; and (4) the magnetic fields generated by the second compensatory magnetic field generating currents −g(±2)·I$_{BL}$ flowing in the second and sixth bit lines BL$_2$ and BL$_6$], the magnetization direction of the second ferromagnetic layer (memory layer) 35 in the tunnel magnetoresistance device TMJ$_{(2,4)}$ is changed, to record "0" in the second ferromagnetic layer (memory layer) 35. On the other hand, the magnetization direction of the second ferromagnetic layer (memory layer) 35 of each of the tunnel magnetoresistance devices TMJ$_{(2,2)}$, TMJ$_{(2,3)}$, TMJ$_{(2,5)}$ and TMJ$_{(2,6)}$ remains unchanged by the above synthetic magnetic field.

Figure 38:
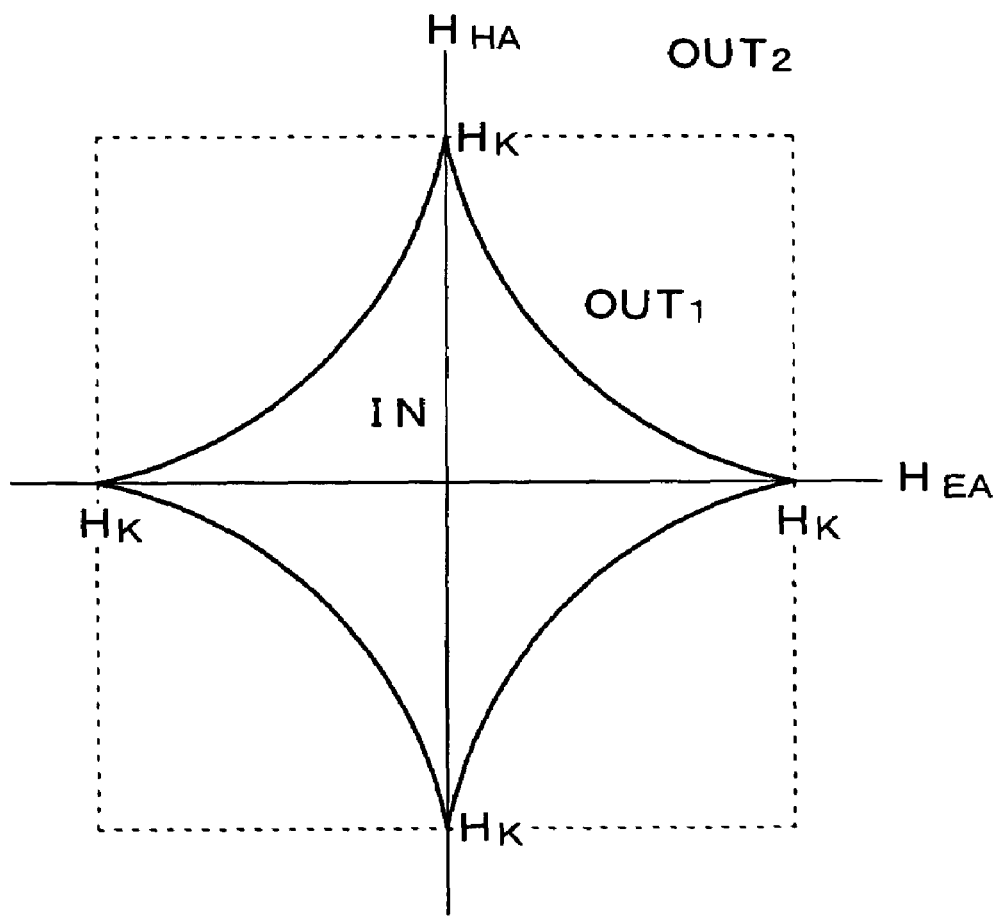
FIG. 38 is a schematic drawing of an asteroid curve of MRAM in a nonvolatile magnetic memory device.

The values of the current I$_{RWL}$ and the current I$_{BL}$ are determined beforehand such that the synthetic magnetic field in the second ferromagnetic layer (memory layer) 35 of the tunnel magnetoresistance device TMJ$_{(2,4)}$ has a value included in the region (OUT$_1$) in the asteroid curve shown in FIG. 38, and that the synthetic magnetic field in the second ferromagnetic layer (memory layer) 35 of each of the tunnel magnetoresistance devices TMJ$_{(2,2)}$, TMJ$_{(2,3)}$, TMJ$_{(2,5)}$ and TMJ$_{(2,6)}$ has a value included in the region (IN) in the asteroid curve shown in FIG. 38. The above is also applicable to Examples hereinafter.

There may be employed a constitution in which the magnetic field (H$_{EA}$) in the easy-magnetization axis direction of the memory layer 35 is generated by the current flowing in the bit line, and the magnetic field (H$_{HA}$) in the hard-magnetization direction of the memory layer 35 is generated by the current I$_{RWL}$ flowing in the write-in word line, or there may be employed a constitution in which the magnetic field (H$_{HA}$) in the hard-magnetization direction of the memory layer 35 is generated by the current flowing in the bit line, and the magnetic field (H$_{EA}$) in the easy-magnetization axis direction of the memory layer 35 is generated by the current I$_{RWL}$ flowing in the write-in word line. The above is also applicable to Examples 2 to 5 to be described later.

[Writing of Data into Tunnel Magnetoresistance Device TMJ$_{(m,n)}$]

Generally, when data is written into the tunnel magnetoresistance device TMJ$_{(m,n)}$ connected to the n-th-place bit line BL$_n$ [n=3, 4, . . . (N−3), (N−2)] and positioned in the overlap region of the n-th-place bit line BL$_n$ and the m-th-place write-in word line RWL$_m$ (opposed to the m-th-place write-in word line RWL$_m$), the following operation is carried out.

Immediately before data is written, all of the open/close circuits SW$_{RWLm}$ (m=1, 2, . . . M) are in an OFF-state. For starting the writing of data, the open/close circuit SW$_{RWLm}$ is brought into an ON-state, whereby the current I$_{RWL}$ is passed through (or flowed in) the m-th-place write-in word line RWL$_m$ from the write-in word line current source RS$_m$. In the current source unit BCS$_n$, the open/close circuit SW$_{BLn-i}$ (i=1 or 2) is selected to come into an ON-state, depending upon which data, "1" or "0", is written into the tunnel magnetoresistance device TMJ$_{(m,n)}$. As a result, the main magnetic field generating current g(0)·I$_{BL}$ (when data "1" is written) flows in the n-th-place bit line BL$_n$, or the main magnetic field generating current −g(0)·I$_{BL}$ (when data "0" is written) flows in the n-th-place bit line BL$_n$.

When data "1" is written into the tunnel magnetoresistance device TMJ$_{(m,n)}$, in the current source unit BCS$_{n-1}$ and the current source unit BCS$_{n+1}$, the open/close circuits SW$_{BLn'-i}$ [n'=(n−1) and (n+1), i=3] are selected to come into an ON-state. As a result, the first compensatory magnetic field generating currents g(±1)·I$_{BL}$ flow in the (n−1)-th-place bit line BL$_{n-1}$ and the (n+1)-th-place bit line BL$_{n+1}$. When data "0" is written in the tunnel magnetoresistance device TMJ$_{(m,n)}$, in the current source unit BCS$_{n-1}$ and the current source unit BCS$_{n+1}$, the open/close circuits SW$_{BLn'-i}$ [n'=(n+1) and (n−1), i=4] are selected to come into an ON-state. As a result, the first compensatory magnetic field generating currents−g(±1)·I$_{BL}$ flow in the (n−1)-th-place bit line BL$_{n-1}$ and the (n+1)-th-place bit line BL$_{n+1}$.

Further, when data "1" is written into the tunnel magnetoresistance device TMJ$_{(m,n)}$, in the current source unit BCS$_{n-2}$ and the current source unit BCS$_{n+2}$, the open/close circuits SW$_{BLn''-i}$ [n''=(n−2) and (n+2), i=5] are selected to come into an ON-state. As a result, the second compensatory magnetic field generating currents g(±2)·I$_{BL}$ flow in the (n−2)-th-place bit line BL$_{n-2}$ and the (n+2)-th-place bit line BL$_{n+2}$. When data "0" is written into the tunnel magnetoresistance device TMJ$_{(m,n)}$, in the current source unit BCS$_{n-2}$ and the current source unit BCS$_{n+2}$, the open/close circuits SW$_{BLn''-i}$ [n=(n−2) and (n+2), i=6] are selected to come into an ON-state. As a result, the second compensatory magnetic field generating currents −g(±2)·I$_{BL}$ flow in the (n−2)-th-place bit line BL$_{n-2}$ and the (n+2)-th-place bit line BL$_{n+2}$.

[Writing of Data into Tunnel Magnetoresistance Device TMJ$_{(m,1)}$ or TMJ$_{(m,N)}$]

When data is written into the tunnel magnetoresistance device TMJ$_{(m,Q)}$ connected to the Q-th-place bit line BL$_Q$ [Q=1 or N] and positioned in the overlap region of the Q-th-place bit line and the m-th-place write-in word line RWL$_m$ (opposed to the m-th-place write-in word line RWL$_m$), the following operation is carried out.

Immediately before data is written, all of the open/close circuits SW$_{RWLm}$ (m=1, 2, . . . M) are in an OFF-state. For starting the writing of data, the open/close circuit SW$_{RWLm}$ is brought into an ON-state, whereby the current I$_{RWL}$ is passed through (or flowed in) the m-th-place write-in word line RWL$_m$ from the write-in word line current source RS$_m$. In the current source unit BCS$_Q$, the open/close circuit $SW_{BLQ-i}$ (i=1 or 2) is selected to come into an ON-state, depending upon which data, "1" or "0", is written into the tunnel magnetoresistance device $TMJ_{(m,Q)}$. As a result, the main magnetic field generating current $g(0) \cdot I_{BL}$ (when data "1" is written) flows in the Q-th-place bit line $BL_Q$, or the main magnetic field generating current $-g(0) \cdot I_{BL}$ (when data "0" is written) flows in the Q-th-place bit line $BL_Q$.

When data "1" is written into the tunnel magnetoresistance device $TMJ_{(m,Q)}$, in the current source unit $BCS_2$ or the current source unit $BCS_{N-1}$ the open/close circuit $SW_{BLQ'-i}$ [Q'=2 or (N-1), i=3] is selected to come into an ON-state. As a result, the first compensatory magnetic field generating current $g(\pm 1) \cdot I_{BL}$ flows in the second bit line $BL_2$ or the (N-1)-th-place bit line $BL_{N-1}$. When data "0" is written in the tunnel magnetoresistance device $TMJ_{(m,Q)}$, in the current source unit $BCS_2$ or the current source unit $BCS_{N-1}$, the open/close circuit $SW_{BLQ'-i}$ [Q'=2 or (N-1), i=4] is selected to come into an ON-state. As a result, the first compensatory magnetic field generating current $-g(\pm 1) \cdot I_{BL}$ flows in the second bit line $BL_2$ or the (N-1)-th-place bit line $BL_{N-1}$.

Further, when data "1" is written into the tunnel magnetoresistance device $TMJ_{(m,Q)}$, in the current source unit $BCS_3$ or the current source unit $BCS_{N-2}$, the open/close circuit $SW_{BLQ''-i}$ [Q''=3 or (N-2), i=5] is selected to come into an ON-state. As a result, the second compensatory magnetic field generating current $g(\pm 2) \cdot I_{BL}$ flows in the third bit line $BL_3$ or the (N-2)-th-place bit line $BL_{N-2}$. When data "0" is written into the tunnel magnetoresistance device $TMJ_{(m,Q)}$, in the current source unit $BCS_3$ or the current source unit $BCS_{N-2}$, the open/close circuit $SW_{BLQ''-i}$ [Q''=3 or (N-2), i=6] is selected to come into an ON-state. As a result, the second compensatory magnetic field generating current $-g(\pm 2) \cdot I_{BL}$ flows in the third bit line $BL_3$ or the (N-2)-th-place bit line $BL_{N-2}$.

[Writing of Data into Tunnel Magnetoresistance Device $TMJ_{(m,2)}$ or $TMJ_{(m,N-1)}$]

When data is written into the tunnel magnetoresistance device $TMJ_{(m,Q)}$ connected to the Q-th-place bit line $BL_Q$ [Q=2 or (N-1)] and positioned in the overlap region of the Q-th-place bit line $BL_Q$ and the m-th-place write-in word line $RWL_m$ (opposed to the m-th-place write-in word line $RWL_m$), the following operation is carried out.

Immediately before data is written, all of the open/close circuits $SW_{RWLm}$ (m=1, 2, . . . M) are in an OFF-state. For starting the writing of data, the open/close circuit $SW_{RWLm}$ is brought into an ON-state, whereby the current $I_{RWL}$ is passed through (or flowed in) the m-th-place write-in word line $RWL_m$ from the write-in word line current source $RS_m$. In the current source unit $BCS_Q$, the open/close circuit $SW_{BLQ-j}$ (i=1 or 2) is selected to come into an ON-state, depending upon which data, "1" or "0", is written into tunnel magnetoresistance device $TMJ_{(m,Q)}$. As a result, the main magnetic field generating current $g(0) \cdot I_{BL}$ (when data "1" is written) flows in the Q-th-place bit line $BL_Q$, or the main magnetic field generating current $-g(0) \cdot I_{BL}$ (when data "0" is written) flows in the Q-th-place bit line $BL_Q$.

When data "1" is written into the tunnel magnetoresistance device $TMJ_{(m,Q)}$, in the current source unit $BCS_1$ and the current source unit $BCS_3$, or in the current source unit $BCS_{N-2}$ and the current source unit $BCS_N$, the open/close circuits $SW_{BLQ'-i}$ [Q'=1 and 3, or Q'=(N-2) and N, i=3] are selected to come into an ON-state. As a result, the first compensatory magnetic field generating currents $g(\pm 1) \cdot I_{BL}$ flow in the first bit line $BL_1$ and the third bit line $BL_3$, or in the (n-2)-th-place bit line $BL_{N-2}$ and the N-th-place bit line $BL_N$. When data "0" is written in the tunnel magnetoresistance device $TMJ_{(m,Q)}$, in the current source unit $BCS_1$ and the current source unit $BCS_3$, or in the current source unit $BCS_{N-2}$ and the current source unit $BCS_N$, the open/close circuits $SW_{BLQ'-i}$ [Q'=1 and 3, or Q'=(N-2) and N, i=4] are selected to come into an ON-state. As a result, the first compensatory magnetic field generating currents $-g(\pm 1) \cdot I_{BL}$ flow in the first bit line $BL_1$ and the third bit line $BL_3$, or in the (N-2)-th-place bit line $BL_{N-2}$ and the N-th-place bit line $BL_N$.

Further, when data "1" is written into the tunnel magnetoresistance device $TMJ_{(m,Q)}$, in the current source unit $BCS_4$ or the current source unit $BCS_{N-3}$, the open/close circuit $SW_{BLQ''-i}$ [Q''=4 or (N-3), i=5] is selected to come into an ON-state. As a result, the second compensatory magnetic field generating current $g(\pm 2) \cdot I_{BL}$ flows in the fourth bit line $BL_4$ or the (N-3)-th-place bit line $BL_{N-3}$. When data "0" is written into the tunnel magnetoresistance device $TMJ_{(m,Q)}$, in the current source unit $BCS_4$ or the current source unit $BCS_{N-3}$, the open/close circuit $SW_{BLQ''-i}$ [Q''=4 or (N-3), i=6] is selected to come into an ON-state. As a result, the second compensatory magnetic field generating current $-g(\pm 2) \cdot I_{BL}$ flows in the fourth bit line $BL_4$ or the (N-3)-th-place bit line $BL_{N-3}$.

In the nonvolatile magnetic memory device in Example 1, when data is written into the tunnel magnetoresistance device $TMJ_{(m,n)}$, the main magnetic field generating current $\pm g(0) \cdot I_{BL}$ is passed through (or flowed in) the bit line $BL_n$ from the current source unit $BCS_n$, and the compensatory magnetic field generating currents $\pm g(\pm 1) \cdot I_{BL}$ and $\pm g(\pm 2) \cdot I_{BL}$ are passed through (or flowed in) the bit lines $BL_{n-1}$, $BL_{n+1}$, $BL_{n-2}$ and $BL_{n+2}$ from the current source units $BCS_{n-1}$, $BCS_{n+1}$, $BCS_{n-2}$ and $BCS_{n+2}$. As a result, the destruction of data stored in the tunnel magnetoresistance devices $TMJ_{(m,n-2)}$, $TMJ_{(m,n-1)}$, $TMJ_{(m,n+1)}$ and $TMJ_{(m,n+2)}$ electrically connected to the bit lines $BL_{n-2}$, $BL_{n-1}$, $BL_{n+1}$ and $BL_{n+2}$ can be reliably prevented.

EXAMPLE 2

Figure 8:
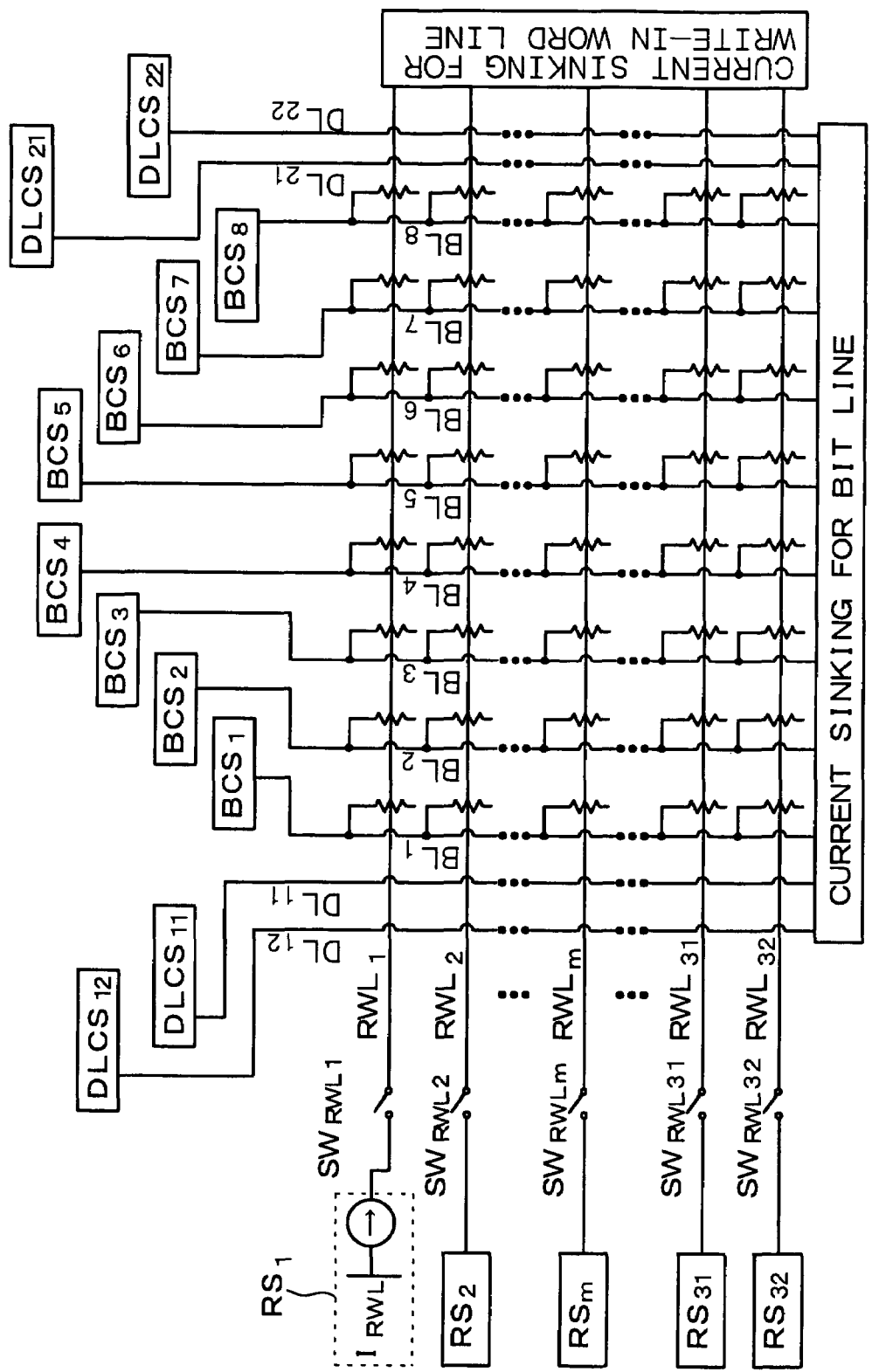
FIG. 8 is an equivalent circuit diagram of a nonvolatile magnetic memory device in Example 2.

Example 2 is a variant of Example 1. FIG. 8 shows an equivalent circuit diagram of a nonvolatile magnetic memory device in Example 2.

In the nonvolatile magnetic memory device explained in Example 1, for example, the main magnetic field is generated by the current flowing in the first bit line $BL_1$ or the N-th-place bit line $BL_N$ [magnetic field generated by the current $g(0) \cdot I(1)_{BL}$ or current $g(0) \cdot I(N)_{BL}$], and the compensatory magnetic fields are generated by the currents flowing in the second and third bit lines $BL_2$ and $BL_3$ or the currents flowing in the (N-2)-th-place and (N-1)-th-place bit lines $BL_{(N-2)}$ and $BL_{(N-1)}$ [magnetic fields generated by the current $g(1) \cdot I(1)_{BL}$ and the current $g(2) \cdot I(1)_{BL}$, or by the current $g(-2) \cdot I(N)_{BL}$ and the current $g(-1) \cdot I(N)_{BL}$], while these compensatory magnetic fields become asymmetric, for example, with regard to the first bit line $BL_1$ or the N-th-place bit line $BL_N$.

In the nonvolatile magnetic memory device in Example 2, therefore, when the absolute value of the maximum value that k represents is $k_0$ ($k_0=2$ in Example 2), a group of first dummy lines that are $k_0$ in number (first dummy lines $DL_{11}$ and $DL_{12}$) is provided outside the first bit line $BL_1$ and in parallel with the first bit line $BL_1$, a group of second dummy lines that are $k_0$ in number (second dummy lines $DL_{21}$ and $DL_{22}$) is provided outside the N-th-place bit line $BL_N$ and in parallel with the N-th-place bit line $BL_N$, and a current $g(k) \cdot I(n)_{BL}$ is passed through (or flowed in) the [(1−n)+|k|]-th-place first dummy line constituting the group of the first dummy lines or the [n−N+|k|]-th-place second dummy line constituting the group of the second dummy lines.

Specifically, when the main magnetic field generating current $\pm g(0) \cdot I_{BL}$ is passed through (or flowed in) the first bit line $BL_1$, the first compensatory magnetic field generating current $\pm g(-1) \cdot I(n)_{BL}$ is passed through (or flowed in) the [(1−n)+|k|]-th-place first dummy line $DL_{11}$ (n=1, k=−1, first-place first dummy line) constituting the group of the first dummy lines, and the second compensatory magnetic field generating current $\pm g(-2) \cdot I(n)_{BL}$ is passed through (or flowed in) the [(1−n)+|k|]-th-place first dummy line $DL_{12}$ (n=1, k=−2, and second-place first dummy line) constituting the group of the first dummy lines. Further, when the main magnetic field generating current $\pm g(0) \cdot I_{BL}$ is passed through (or flowed in) the second bit line $BL_2$, the second compensatory magnetic field generating current $\pm g(-2) \cdot I(n)_{BL}$ is passed through (or flowed in) the [(1−n)+|k|]-th-place first dummy line $DL_{11}$ (n=2, k=−2, first-place first dummy line) constituting the group of the first dummy lines.

On the other hand, when the main magnetic field generating current $\pm g(0) \cdot I_{BL}$ is passed through (or flowed in) the N-th-place bit line $BL_N$, the first compensatory magnetic field generating current $\pm g(1) \cdot I(n)_{BL}$ is passed through (or flowed in) the [n−N+|k|]-th-place second dummy line $DL_{21}$ (n=N, k=1, first-place second dummy line) constituting the group of the second dummy lines, and the second compensatory magnetic field generating current $\pm g(-2) \cdot I(n)_{BL}$ is passed through (or flowed in) the [n−N+|k|]-th-place second dummy line $DL_{22}$ (n=N, k=2, and second-place second dummy line) constituting the group of the second dummy lines. Further, when the main magnetic field generating current $\pm g(0) \cdot I_{BL}$ is passed through (or flowed in) the (N−1)-th-place bit line $BL_{N-1}$, the second compensatory magnetic field generating current $\pm g(2) \cdot I(n)_{BL}$ is passed through (or flowed in) the [n−N+|k|]-th-place second dummy line $DL_{21}$ (n=N−1, k=2, first-place second dummy line) constituting the group of the second dummy lines.

Figure 9A:
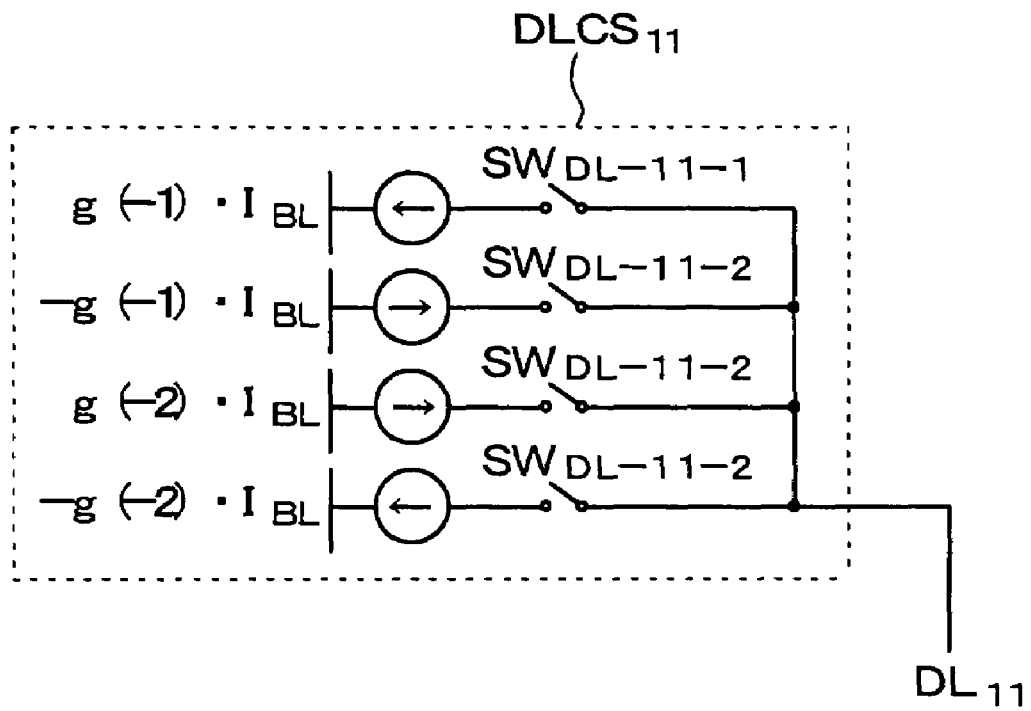
FIGS. 9A and 9B are equivalent circuit diagrams of first dummy line current sources.
Figure 9B:
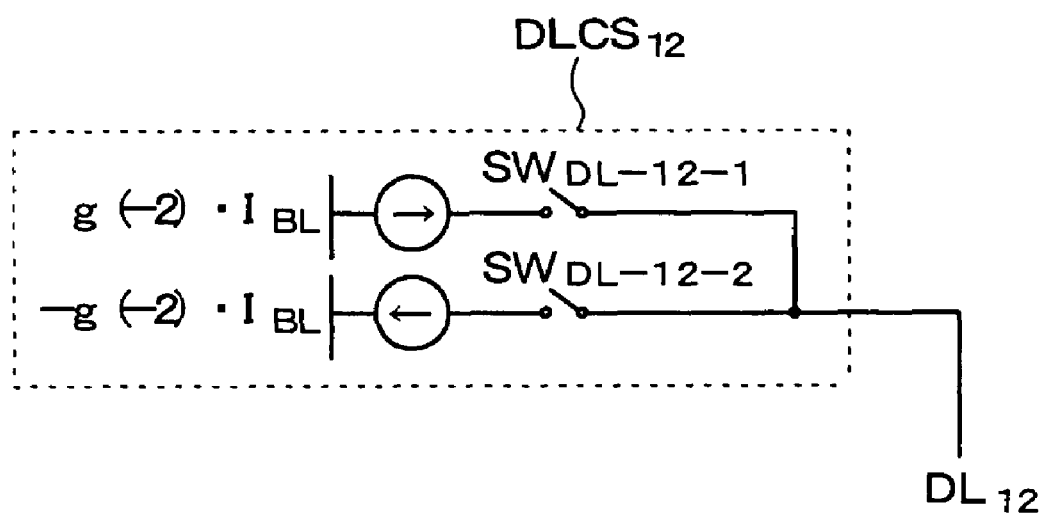
Figure 10A:
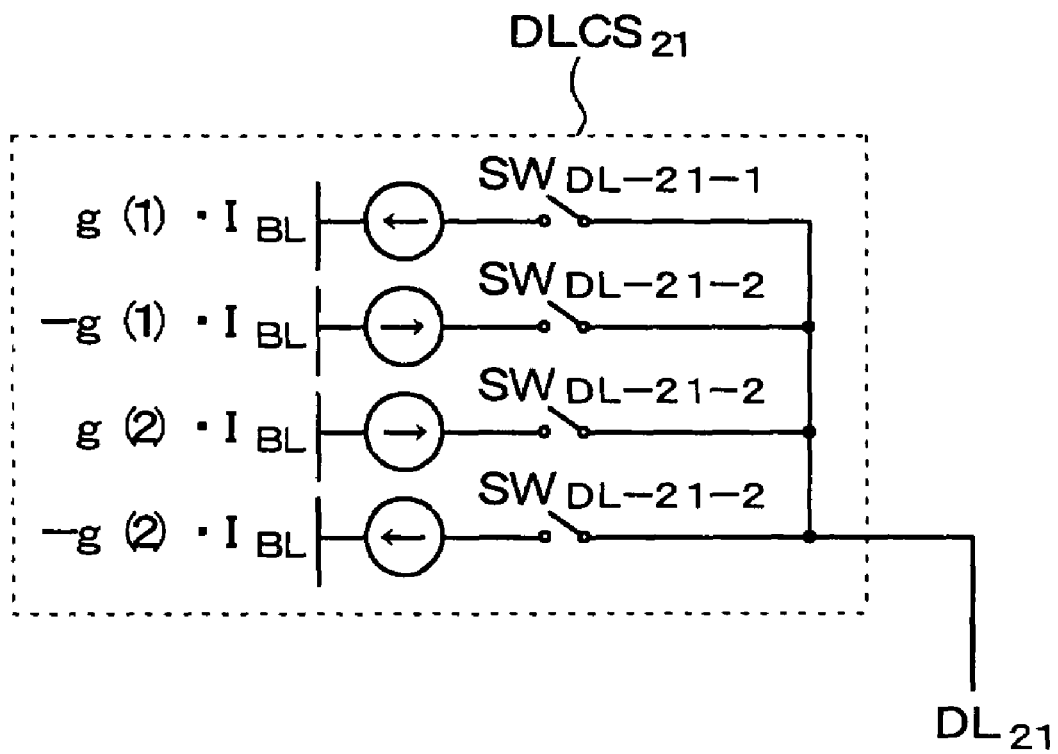
FIGS. 10A and 10B are equivalent circuit diagrams of second dummy line current sources.
Figure 10B:
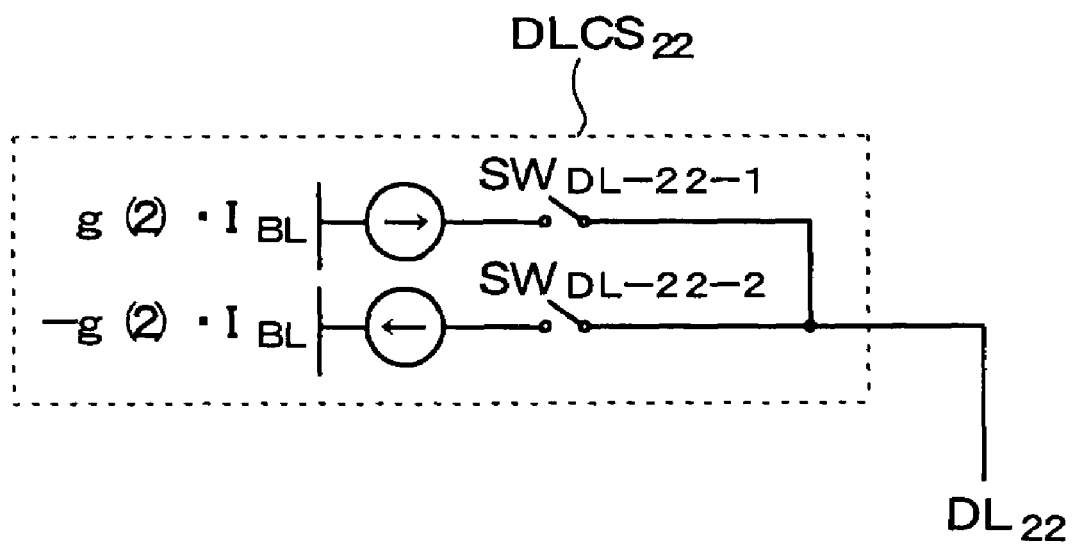

The first-place first dummy line $DL_{11}$ constituting the group of the first dummy lines is connected to a first dummy line current source $DLCS_{11}$ (see an equivalent circuit diagram of FIG. 9A), the second-place first dummy line $DL_{12}$ constituting the group of the first dummy lines is connected to a first dummy line current source $DLCS_{12}$ (see an equivalent circuit diagram of FIG. 9B), the first-place second dummy line $DL_{21}$ constituting the group of the second dummy lines is connected to a second dummy line current source $DLCS_{21}$ (see an equivalent circuit diagram of FIG. 10A), and the second-place second dummy line $DL_{22}$ constituting the group of the second dummy lines is connected to a second dummy line current source $DLCS_{22}$ (see an equivalent circuit diagram of FIG. 10B).

The first dummy line current source $DLCS_{11}$ is provided with open/close circuits $SW_{DL-11-i}$ (i=1, 2, 3, 4) constituted of a MOS-type FET each, and by the ON/OFF operation of the open/close circuit $SW_{DL-11-i}$, one of four currents, the current $g(-1) \cdot I_{BL}$, the current $-g(-1) \cdot I_{BL}$, the current $g(-2) \cdot I_{BL}$ and the current $-g(-2) \cdot I_{BL}$, can be passed through (or flowed in) the first-place first dummy line $DL_{11}$ constituting the group of the first dummy lines from the first dummy line current source $DLCS_{11}$. The second dummy line current source $DLCS_{21}$ is provided with open/close circuits $SW_{DL-21-i}$ (i=1, 2, 3, 4) constituted of a MOS-type FET each, and by the ON/OFF operation of the open/close circuit $SW_{DL-21-i}$, one of four currents, the current $g(1) \cdot I_{BL}$, the current $-g(1) \cdot I_{BL}$, the current $g(2) \cdot I_{BL}$ and the current $-g(2) \cdot I_{BL}$, can be passed through (or flowed in) the first-place second dummy line $DL_{21}$ constituting the group of the second dummy lines from the second dummy line current source $DLCS_{21}$.

Further, the first dummy line current source $DLCS_{12}$ is provided with open/close circuits $SW_{DL-12-i}$ (i=1, 2) constituted of a MOS-type FET each, and by the ON/OFF operation of the open/close circuit $SW_{DL-12-i}$, one of two currents, the current $g(-2) \cdot I_{BL}$ and the current $-g(-2) \cdot I_{BL}$, can be passed through (or flowed in) the second-place first dummy line $DL_{12}$ constituting the group of the first dummy lines from the first dummy line current source $DLCS_{12}$. The second dummy line current source $DLCS_{22}$ is provided with open/close circuits $SW_{DL-22-i}$ (i=1, 2) constituted of a MOS-type FET each, and by the ON/OFF operation of the open/close circuit $SW_{DL-22-i}$, one of two currents, the current $g(2) \cdot I_{BL}$ and the current $-g(2) \cdot I_{BL}$, can be passed through (or flowed in) the second-place second dummy line $DL_{22}$ constituting the group of the second dummy lines from the second dummy line current source $DLCS_{22}$.

The constitution, structure and operation of the nonvolatile magnetic memory device in Example 2 can be the same as those of the nonvolatile magnetic memory device in Example 1 except for the above points, so that a detailed explanation thereof will be omitted. The values of the coefficients $g(1)$, $g(-1)$, $g(2)$ and $g(-2)$ can be determined so as to be the same as those in Example 1.

In the nonvolatile magnetic memory device in Example 2, the compensatory magnetic field for preventing the destruction of data stored in the tunnel magnetoresistance device becomes symmetric with regard to the first bit line $BL_1$, the second bit line $BL_2$, the (N−1)-th-place bit line $BL_{N-1}$ and the N-th-place bit line $BL_N$, so that the operation of writing data into the nonvolatile magnetic memory device is more stabilized.

EXAMPLE 3

Figure 11:
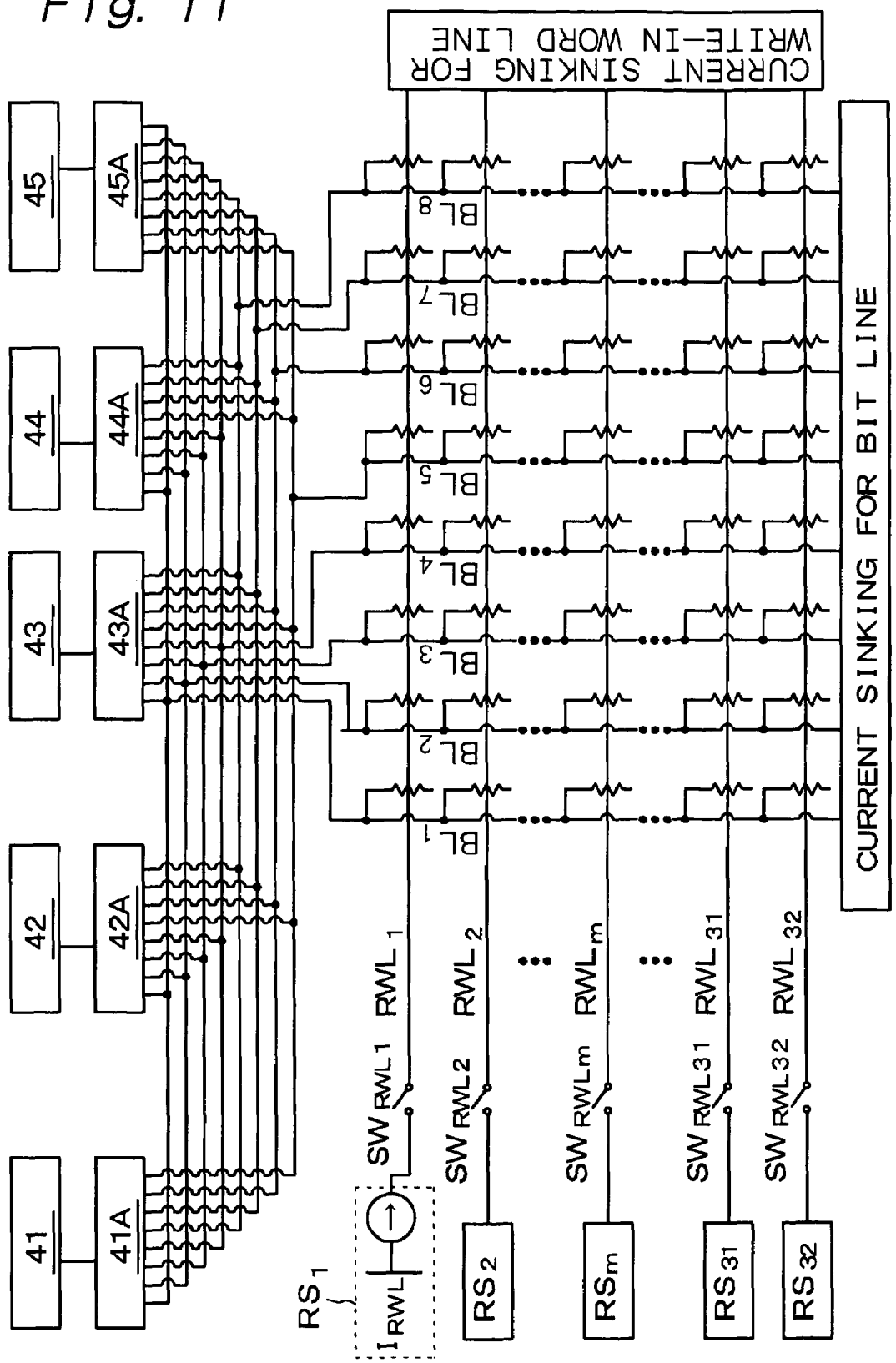
FIG. 11 is an equivalent circuit diagram of a nonvolatile magnetic memory device in Example 3.
Figure 12:
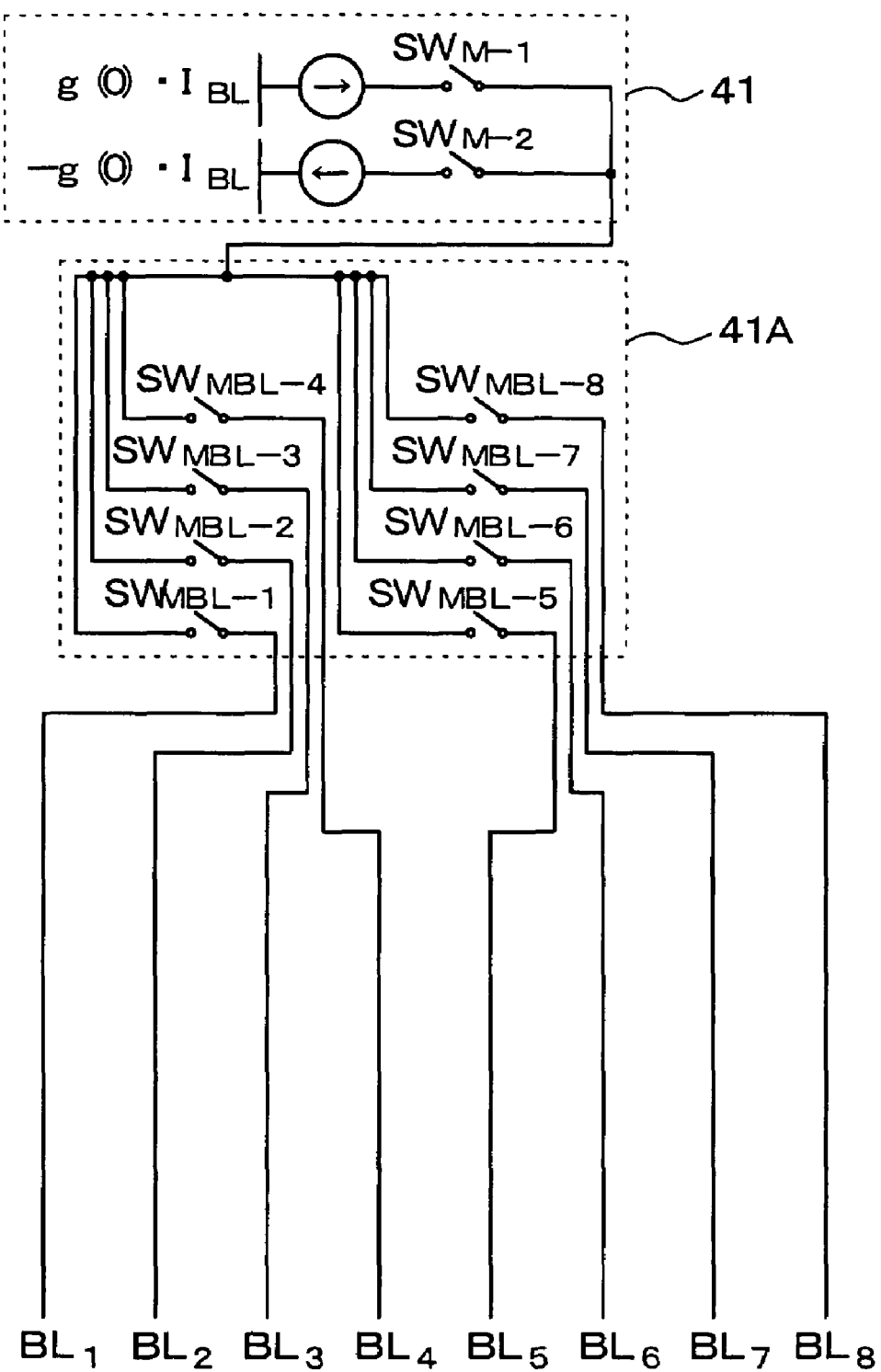
FIG. 12 is an equivalent circuit diagram of a first current source unit and a first switching circuit in the nonvolatile magnetic memory device in Example 3.
Figure 13:
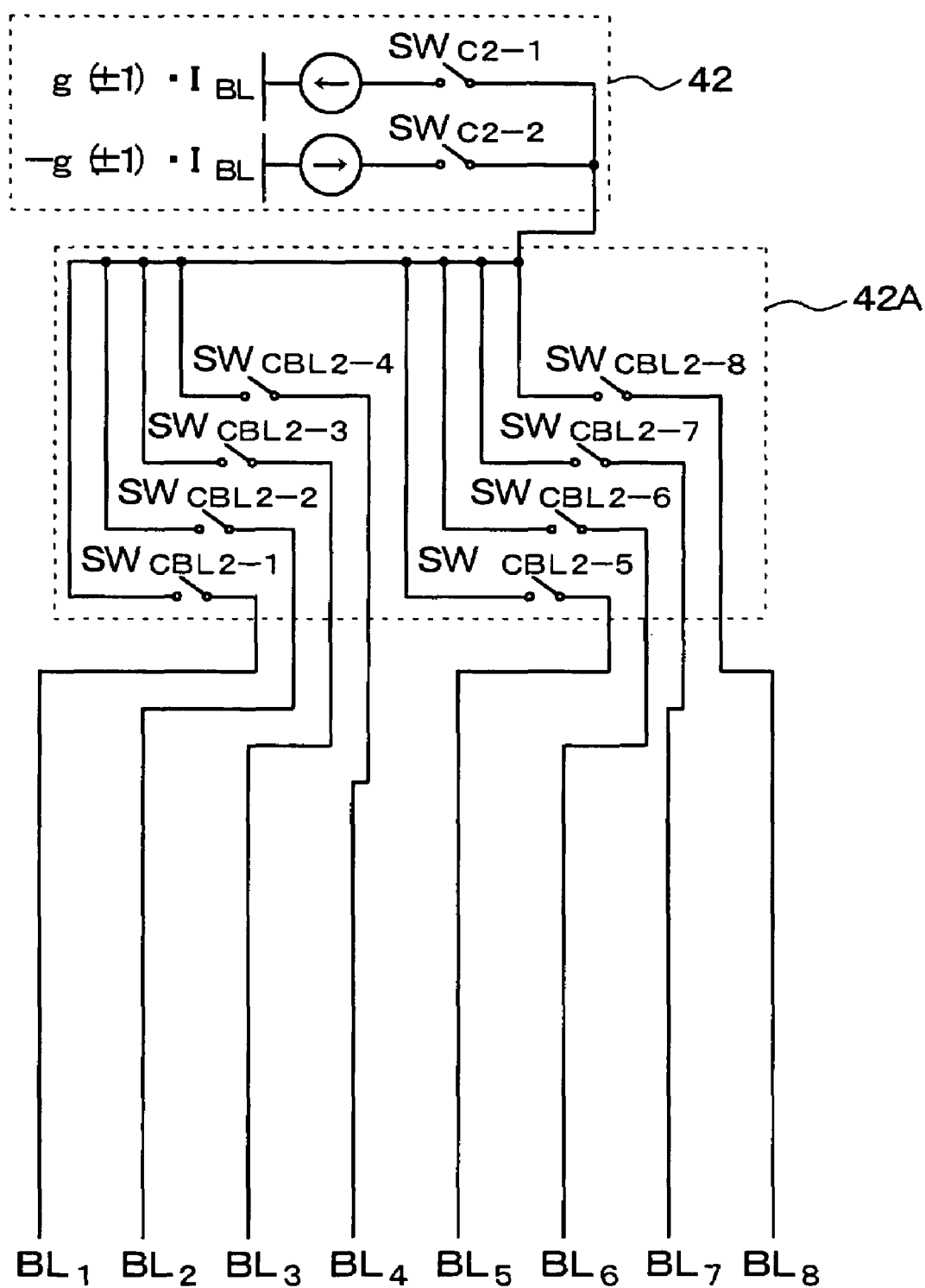
FIG. 13 is an equivalent circuit diagram of a second current source unit and a second switching circuit in the nonvolatile magnetic memory device in Example 3.
Figure 14:
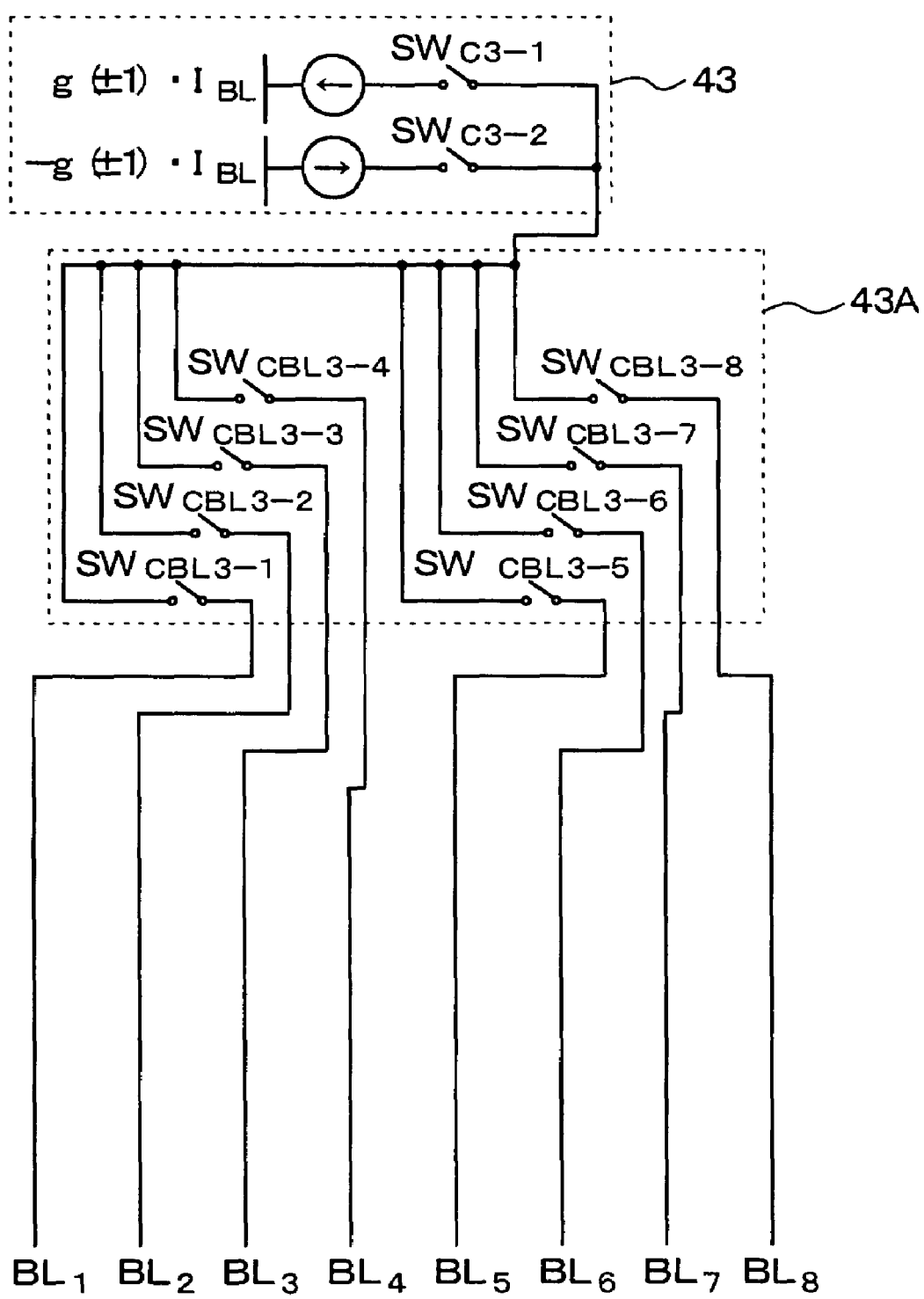
FIG. 14 is an equivalent circuit diagram of a third current source unit and a third switching circuit in the nonvolatile magnetic memory device in Example 3.
Figure 15:
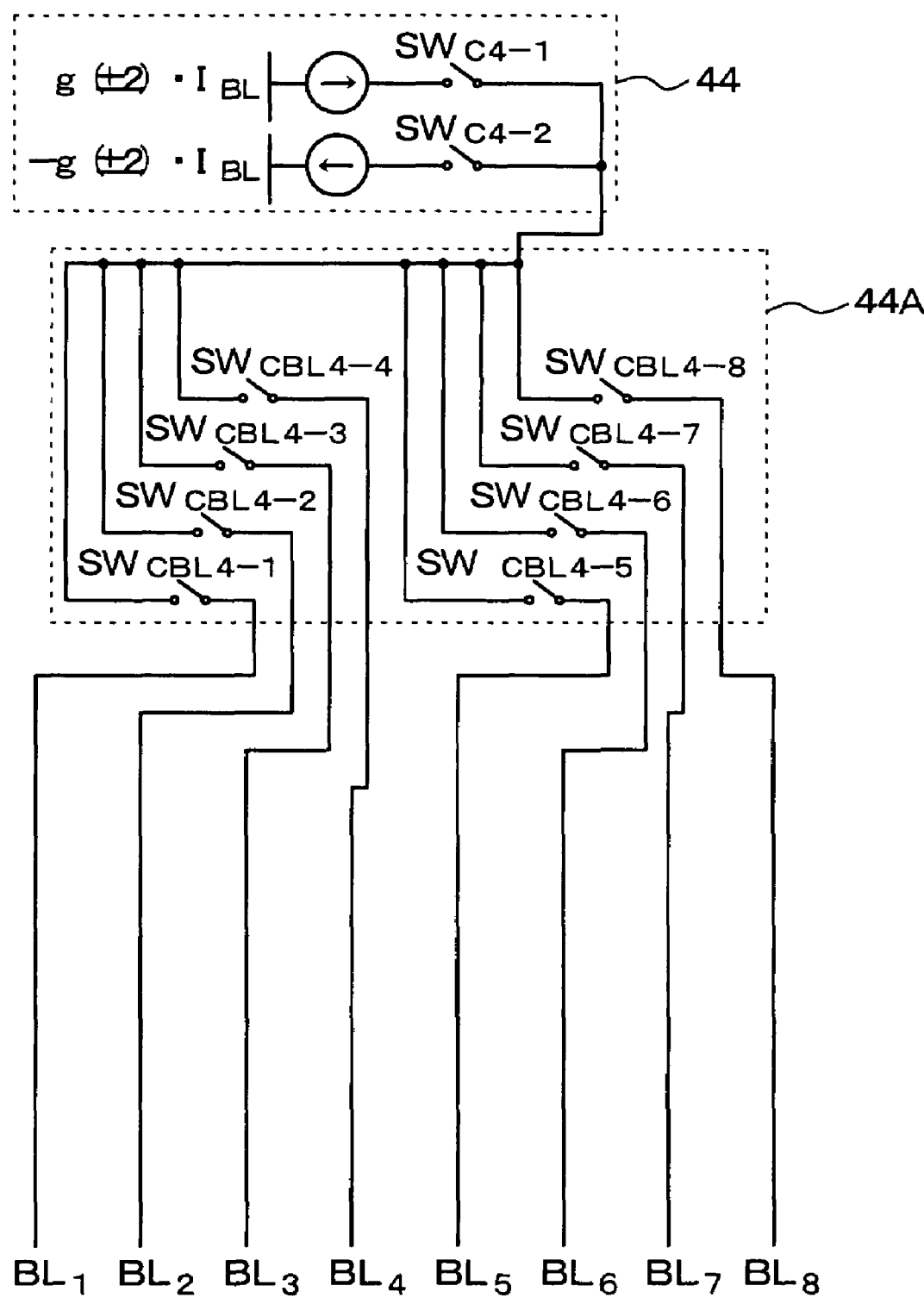
FIG. 15 is an equivalent circuit diagram of a fourth current source unit and a fourth switching circuit in the nonvolatile magnetic memory device in Example 3.
Figure 16:
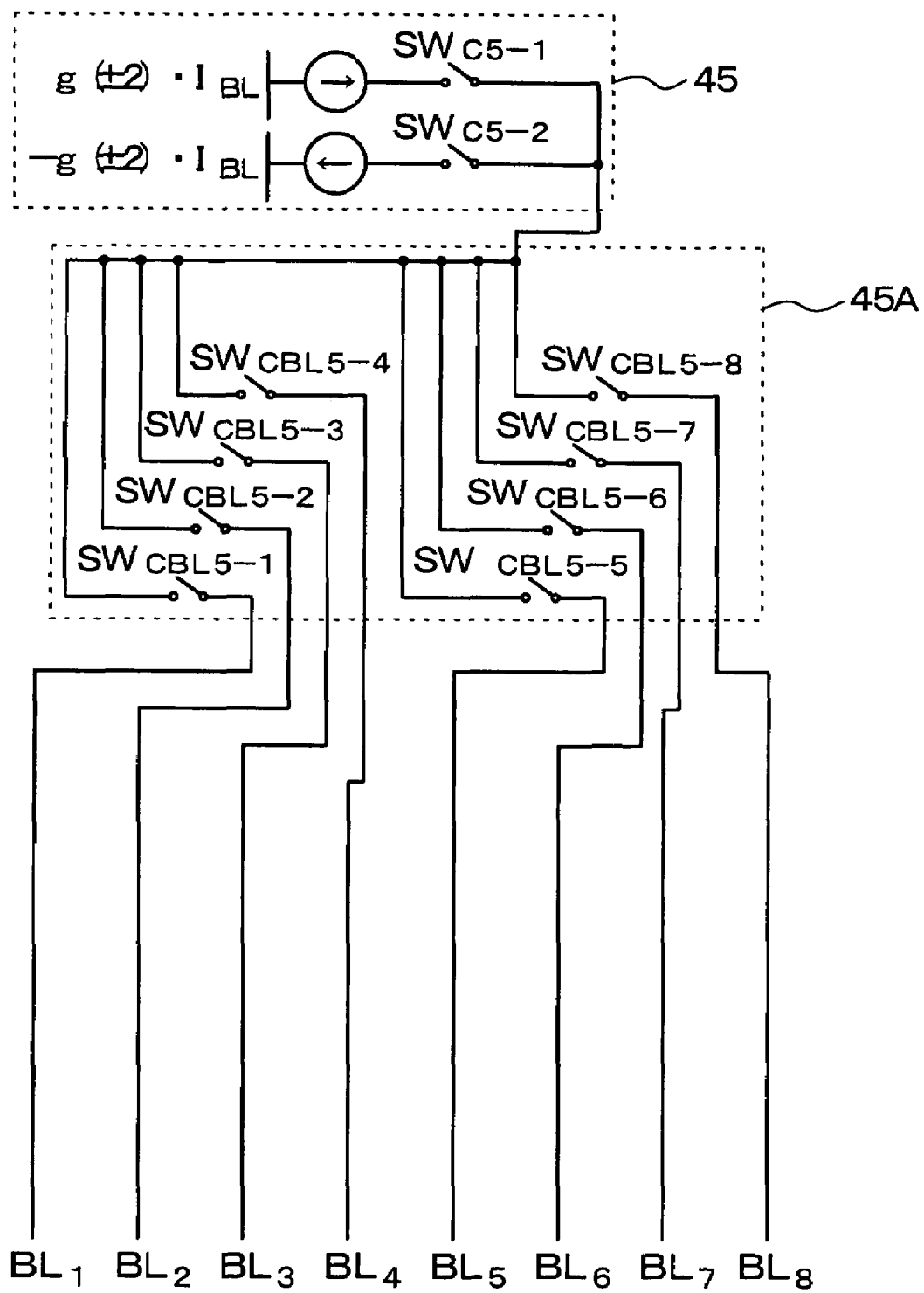
FIG. 16 is an equivalent circuit diagram of a fifth current source unit and a fifth switching circuit in the nonvolatile magnetic memory device in Example 3.

Example 3 is also a variant of Example 1. FIG. 11 shows an equivalent circuit diagram of a nonvolatile magnetic memory device in Example 3. FIG. 12 shows an equivalent circuit diagram of a first current source unit 41 and a first switch circuit 41A in the nonvolatile magnetic memory device in Example 3. FIG. 13 shows an equivalent circuit diagram of a second current source unit 42 and a second switch circuit 42A. FIG. 14 shows an equivalent circuit diagram of a third current source unit 43 and a third switch circuit 43A. FIG. 15 shows an equivalent circuit diagram of a fourth current source unit 44 and a fourth switch circuit 44A. FIG. 16 shows an equivalent circuit diagram of a fifth current source unit 45 and a fifth switch circuit 45A.

In Example 3, the current source does not comprise the current source units that are N in number, but comprises the first current source unit 41, the second current source unit 42, the third current source unit 43, the fourth current source unit 44 and the fifth current source unit 45. The first current source unit 41 for letting the main magnetic field generating current $\pm g(0) \cdot I_{BL}$ flow on the bit lines $BL_n$ is connected to the bit lines $BL_n$, that are N in number, through the first switch circuit 41A (comprising open/close circuits SW $SW_{MBL-1}$–$SW_{MBL-8}$ constituted of a MOS-type FET each). The second current source unit 42 for letting the first compensatory magnetic field generating current $\pm g(\pm 1) \cdot I_{BL}$ flow in the bit lines $BL_n$ is connected to the bit lines $BL_n$, that are N in number, through the second switch circuit 42A (comprising open/close circuits SW $SW_{CBL2-1}$–$SW_{CBL2-8}$ constituted of a MOS-type FET each). Further, the third current source unit 43 for letting the first compensatory magnetic field generating current $\pm g(\pm 1) \cdot I_{BL}$ flow in the bit lines $BL_n$ is connected to the bit lines $BL_n$, that are N in number, through the third switch circuit 43A (comprising open/close circuits SW $SW_{CBL3-1}$–$SW_{CBL3-8}$ constituted of a MOS-type FET each). The fourth current source unit 44 for letting the second compensatory magnetic field generating current $\pm g(\pm 2) \cdot I_{BL}$ flow in the bit lines $BL_n$ is connected to the bit lines $BL_n$, that are N in number, through the fourth switch circuit 44A (comprising open/close circuits SW $SW_{CBL4-1}$–$SW_{CBL4-8}$ constituted of a MOS-type FET each). Further, the fifth current source unit 45 for letting the second compensatory magnetic field generating current $\pm g(\pm 2) \cdot I_{BL}$ flow in the bit lines $BL_n$ is connected to the bit lines $BL_n$, that are N in number, through the fifth switch circuit 45A (comprising open/close circuits SW $SW_{CBL5-1}$–$SW_{CBL5-8}$ constituted of a MOS-type FET each).

The constitution, structure and operation of the nonvolatile magnetic memory device in Example 3 can be the same as those of the nonvolatile magnetic memory device in Example 1 except for the above points, so that a detailed explanation thereof will be omitted. In Example 3, the above constitution is employed, so that the number of the current source units can be decreased, and that the constitution of the nonvolatile magnetic memory device can be simplified.

[Writing of Data into Tunnel Magnetoresistance Device $TMJ_{(m,n)}$]

When data is written into the tunnel magnetoresistance device $TMJ_{(m,n)}$ connected to the n-th-place bit line $BL_n$ [n=3, 4, ... (N−2)] and positioned in the overlap region of the n-th-place bit line $BL_n$ and the m-th-place write-in word line $RWL_m$ (opposed to the m-th-place write-in word line $RWL_m$), the following operation is carried out.

Immediately before data is written, all of the open/close circuits $SW_{RWLm}$ (m=1, 2, . . . M) are in an OFF-state. For starting the writing of data, the open/close circuit $SW_{RWLm}$ is brought into an ON-state, whereby the current $I_{RWL}$ is passed through (or flowed in) the m-th-place write-in word line $RWL_m$ from the write-in word line current source $RS_m$. In the first current source unit 41, the open/close circuit $SW_{M-i}$ (i=1 or 2) constituted of a MOS-type FET is selected to come into an ON-state, depending on which data, "1" or "0", is written into the tunnel magnetoresistance device TMJ(m,n). Further, the open/close circuit $SW_{MBL-n}$ constituting the first switch circuit 41A is selected to come into an ON-state. As a result, the main magnetic field generating current $g(0) \cdot I_{BL}$ or $-g(0) \cdot I_{BL}$ flows in the n-th-place bit line $BL_n$.

When data "1" is written into the tunnel magnetoresistance device $TMJ_{(m,n)}$, in the second current source unit 42 and the third current source unit 43, the open/close circuit $SW_{C2-1}$ and the open/close circuit $SW_{C3-1}$ are selected to come into an ON-state. Further, the open/close circuit $SW_{CBL2-(q-1)}$ constituting the second switch circuit 42A is selected to come into an ON-state, and the open/close circuit $SW_{CBL3-(n+1)}$ constituting the third switch circuit 43A is selected to come into an ON-state. As a result, the first compensatory magnetic field generating currents $g(\pm 1) \cdot I_{BL}$ flow in the (n−1)-th-place bit line $BL_{n-1}$ and the (n+1)-th-place bit line $BL_{n+1}$. Further, in the fourth current source unit 44 and the fifth current source unit 45, the open/close circuit $SW_{C4-1}$ and the open/close circuit $SW_{C5-1}$ are selected to come into an ON-state. Further, the open/close circuit $SW_{CBL4-(q-2)}$ constituting the fourth switch circuit 44A is selected to come into an ON-state, and the open/close circuit $SW_{CBL5-(n+2)}$ constituting the fifth switch circuit 45A is selected to come into an ON-state. As a result, the second compensatory magnetic field generating currents $g(\pm 2) \cdot I_{BL}$ flow in the (n−2)-th-place bit line $BL_{n-2}$ and the (n+2)-th-place bit line $BL_{n+2}$.

When data "0" is written in the tunnel magnetoresistance device $TMJ_{(m,n)}$, in the second current source unit 42 and the third current source unit 43, the open/close circuit $SW_{C2-2}$ and the open/close circuit $SW_{C3-2}$ are selected to come into an ON-state. Further, the open/close circuit $SW_{CBL2-(n-1)}$ constituting the second switch circuit 42A is selected to come into an ON-state, and the open/close circuit $SW_{CBL3-(n+1)}$ constituting the third switch circuit 43A is selected to come into an ON-state. As a result, the first compensatory magnetic field generating currents $-g(\pm 1) \cdot I_{BL}$ flow in the (n−1)-th-place bit line $BL_{n-1}$ and the (n+1)-th-place bit line $BL_{n+1}$. Further, in the fourth current source unit 44 and the fifth current source unit 45, the open/close circuit $SW_{C4-2}$ and the open/close circuit $SW_{C5-2}$ are selected to come into an ON-state. Further, the open/close circuit $SW_{CBL4-(n-2)}$ constituting the fourth switch circuit 44A is selected to come into an ON-state, and the open/close circuit $SW_{CBL5-(n+2)}$ constituting the fifth switch circuit 45A is selected to come into an ON-state. As a result, the second compensatory magnetic field generating currents $-g(\pm 2) \cdot I_{BL}$ flow in the (n−2)-th-place bit line $BL_{n-2}$ and the (n+2)-th-place bit line $BL_{n+2}$.

By the synthetic magnetic field generated as the result of the above [synthetic magnetic field of (1) the magnetic field generated by the current flowing in the m-th-place write-in word line $RWL_m$; (2) the magnetic field generated by the main magnetic field generating current $g(0) \cdot I_{BL}$ flowing in the n-th-place bit line $BL_n$; (3) the magnetic fields generated by the first compensatory magnetic field generating currents $g(\pm 1) \cdot I_{BL}$ flowing in the (n−1)-th-place and (n+1)-th-place bit lines $BL_{n-1}$ and $BL_{n+1}$; and (4) the magnetic fields generated by the second compensatory magnetic field generating currents $g(\pm 2) \cdot I_{BL}$ flowing in the (n−2)-th-place and (n+2)-th-place bit lines $BL_{n-2}$ and $BL_{n+1}$], the magnetization direction of the second ferromagnetic layer (memory layer) 35 in the tunnel magnetoresistance device $TMJ_{(m,n)}$ is changed, to record "1" in the second ferromagnetic layer (memory layer) 35. Alternatively, by the synthetic magnetic field [the synthetic magnetic field of (1) the magnetic field generated by the current $I_{RWL}$ flowing in the m-th-place write-in word line $RWL_m$; (2) the magnetic field generated by the main magnetic field generating current $-g(0) \cdot I_{BL}$ flowing in the n-th-place bit line $BL_n$; (3) the magnetic fields generated by the first compensatory magnetic field generating currents $-g(\pm 1) \cdot I_{BL}$ flowing in the (n−1)-th-place and (n+1)-th-place bit lines $BL_{n-1}$ and $BL_{n+1}$; and (4) the magnetic fields generated by the second compensatory magnetic field generating currents $-g(\pm 2) \cdot I_{BL}$ flowing in the (n−2)-th-place and (n+2)-th-place bit lines $BL_{n-2}$ and $BL_{n+2}$], the magnetization direction of the second ferromagnetic layer (memory layer) 35 in the tunnel magnetoresistance device $TMJ_{(m,q)}$ is changed, to record "0" in the second ferromagnetic layer (memory layer) 35. On the other hand, the magnetization direction of the second ferromagnetic layer (memory layer) 35 of each of the tunnel magnetoresistance devices $TMJ_{(m,n-2)}$, $TMJ_{(m,n-1)}$, $TMJ_{(m,n+1)}$ and $TMJ_{(m,n+2)}$ remains unchanged by the above synthetic magnetic field.

[Writing of Data into Tunnel Magnetoresistance Device $TMJ_{(m,1)}$ or $TMJ_{(m,N)}$]

When data is written into the tunnel magnetoresistance device $TMJ_{(m,Q)}$ connected to the Q-th-place bit line $BL_Q$ [Q=1 or N] and positioned in the overlap region of the Q-th-place bit line $BL_Q$ and the m-th-place write-in word line $RWL_m$ (opposed to the m-th-place write-in word line $RWL_m$), the following operation is carried out.

Immediately before data is written, all of the open/close circuits $SW_{RWLm}$ (m=1, 2, ... M) are in an OFF-state. For starting the writing of data, the open/close circuit $SW_{RWLm}$ is brought into an ON-state, whereby the current $I_{RWL}$ is passed through (or flowed in) the m-th-place write-in word line $RWL_m$ from the write-in word line current source $RS_m$. In the first current source unit 41, the open/close circuit $SW_{M-i}$ (i=1 or 2) constituted of a MOS-type FET is selected to come into an ON-state, depending upon which data, "1" or "0", is written into the tunnel magnetoresistance device $TMJ_{(m,Q)}$. Further, the open/close circuit $SW_{MBL-Q}$ constituting the first switch circuit 41A is selected to come into an ON-state, whereby the main magnetic field generating current $\pm g(0) \cdot I_{BL}$ flows in the Q-th-place bit line $BL_Q$.

When data "1" is written into the tunnel magnetoresistance device $TMJ_{(m,Q)}$, in the second current source unit 42 or the third current source unit 43, the open/close circuit $SW_{C2-1}$ or the open/close circuit $SW_{C3-1}$ is selected to come into an ON-state. Further, the open/close circuit $SW_{CBL2-(N-1)}$ constituting the second switch circuit 42A is selected to come into an ON-state, or the open/close circuit $SW_{CBL3-2}$ constituting the third switch circuit 43A is selected to come into an ON-state, whereby the first compensatory magnetic field generating current $g(\pm 1) \cdot I_{BL}$ flows in the second bit line $BL_2$ or the (N–1)-th-place bit line $BL_{N-1}$. Further, in the fourth current source unit 44 or the fifth current source unit 45, the open/close circuit $SW_{C4-1}$ or the open/close circuit $SW_{C5-1}$ is selected to come into an ON-state. Further, the open/close circuit $SW_{CBL4-(N-2)}$ constituting the fourth switch circuit 44A is selected to come into an ON-state, or the open/close circuit $SW_{CBL5-3}$ constituting the fifth switch circuit 45A is selected to come into an ON-state. As a result, the second compensatory magnetic field generating current $g(\pm 2) \cdot I_{BL}$ flows in the third bit line $BL_3$ or the (N–2)-th-place bit line $BL_{N-2}$.

When data "0" is written in the tunnel magnetoresistance device $TMJ_{(m,n)}$, in the second current source unit 42 or the third current source unit 43, the open/close circuit $SW_{C2-2}$ or the open/close circuit $SW_{C3-2}$ is selected to come into an ON-state. Further, the open/close circuit $SW_{CBL2-(N-1)}$ constituting the second switch circuit 42A is selected to come into an ON-state, or the open/close circuit $SW_{CBL3-2}$ constituting the third switch circuit 43A is selected to come into an ON-state. As a result, the first compensatory magnetic field generating current $-g(\pm 1) \cdot I_{BL}$ flows in the second bit line $BL_2$ or the (N–1)-th-place bit line $BL_{N-1}$. Further, in the fourth current source unit 44 or the fifth current source unit 45, the open/close circuit $SW_{C4-2}$ or the open/close circuit $SW_{C5-2}$ is selected to come into an ON-state. Further, the open/close circuit $SW_{CBL4-(N-2)}$ constituting the fourth switch circuit 44A is selected to come into an ON-state, or the open/close circuit $SW_{CBL5-3}$ constituting the fifth switch circuit 45A is selected to come into an ON-state. As a result, the second compensatory magnetic field generating current $-g(\pm 2) \cdot I_{BL}$ flows in the third bit line $BL_3$, or the (N–2)-th-place bit line $BL_{N-2}$.

[Writing of Data into Tunnel Magnetoresistance Device $TMJ_{(m,2)}$ or $TMJ_{(m,N-1)}$]

When data is written into the tunnel magnetoresistance device $TMJ_{(m,Q)}$ connected to the Q-th-place bit line $BL_Q$ [Q=2 or (N–1)] and positioned in the overlap region of the Q-th-place bit line $BL_Q$ and the m-th-place write-in word line $RWL_m$ (opposed to the m-th-place write-in word line $RWL_m$), the following operation is carried out.

Immediately before data is written, all of the open/close circuits $SW_{RWLm}$ (m=1, 2, ... M) are in an OFF-state. For starting the writing of data, the open/close circuit $SW_{RWLm}$ is brought into an ON-state, whereby the current $I_{RWL}$ is passed through (or flowed in) the m-th-place write-in word line $RWL_m$ from the write-in word line current source $RS_m$. In the first current source unit 41, the open/close circuit $SW_{M-i}$ (i=1 or 2) constituted of a MOS-type FET is selected to come into an ON-state, depending upon which data, "1" or "0", is written into the tunnel magnetoresistance device $TMJ_{(m,Q)}$. Further, the open/close circuit $SW_{MBL-Q}$ constituting the first switch circuit 41A is selected to come into an ON-state. As a result, the main magnetic field generating current $\pm g(0) \cdot I_{BL}$ flows in the Q-th-place bit line $BL_Q$.

When data "1" is written into the tunnel magnetoresistance device $TMJ_{(m,Q)}$, in the second current source unit 42 and the third current source unit 43, the open/close circuit $SW_{C3-1}$ and the open/close circuit $SW_{C3-1}$ are selected to come into an ON-state. Further, the open/close circuit $SW_{CBL2-(Q-1)}$ constituting the second switch circuit 42A and the open/close circuit $SW_{CBL3-(Q+1)}$ constituting the third switch circuit 43A are selected to come into an ON-state, whereby the first compensatory magnetic field generating currents $g(\pm 1) \cdot I_{BL}$ flow in the first bit line $BL_1$ and the third bit line $BL_3$, or in the (N–2)-th-place bit line $BL_{N-2}$ and the N-th-place bit line $BL_N$. Further, in the fourth current source unit 44 or the fifth current source unit 45, the open/close circuit $SW_{C4-1}$ or the open/close circuit $SW_{C5-1}$ is selected to come into an ON-state. Further, the open/close circuit $SW_{CBL4-(N-3)}$ constituting the fourth switch circuit 44A or the open/close circuit $SW_{CBL5-4}$ constituting the fifth switch circuit 45A is selected to come into an ON-state. As a result, the second compensatory magnetic field generating current $g(\pm 2) \cdot I_{BL}$ flows in the fourth bit line $BL_4$ or the (N–3)-th-place bit line $BL_{N-3}$.

When data "0" is written into the tunnel magnetoresistance device $TMJ_{(m,Q)}$, in the second current source unit 42 and the third current source unit 43, the open/close circuit $SW_{C2-2}$ and the open/close circuit $SW_{C3-2}$ are selected to come into an ON-state. Further, the open/close circuit $SW_{CBL2-(Q-1)}$ constituting the second switch circuit 42A and the open/close circuit $SW_{CBL3-(Q+1)}$ constituting the third switch circuit 43A are selected to come into an ON-state. As a result, the first compensatory magnetic field generating currents $-g(\pm 1) \cdot I_{BL}$ flow in the first bit line $BL_1$ and the third bit line $BL_3$, or in the (N–2)-th-place bit line $BL_{N-2}$ and the N-th-place bit line $BL_N$. Further, in the fourth current source unit 44 or the fifth current source unit 45, the open/close circuit $SW_{C4-2}$ or the open/close circuit $SW_{C5-2}$ is selected to come into an ON-state. Further, the open/close circuit $SW_{CBL4-(N-3)}$ constituting the fourth switch circuit 44A is selected to come into an ON-state, or the open/close circuit $SW_{CBL5-4}$ constituting the fifth switch circuit 45A is selected to come into an ON-state. As a result, the second compensatory magnetic field generating current $-g(\pm 2) \cdot I_{BL}$ flows in the fourth bit line $BL_4$ or the (N–3)-th-place bit line $BL_{N-3}$.

In the nonvolatile magnetic memory device in Example 3, when data is written into the tunnel magnetoresistance device $TMJ_{(m,n)}$, the main magnetic field generating current $\pm g(0) \cdot I_{BL}$ is passed through (or flowed in) the bit line $BL_n$ from the first current source unit 41, and the compensatory magnetic field generating currents $\pm g(\pm 2) \cdot I_{BL}$, $\pm g(\pm 1) \cdot I_{BL}$, $\pm g(\pm 1) \cdot I_{BL}$ and $\pm g(+2) \cdot I_{BL}$ are passed through (or flowed in) the bit lines $BL_{n-2}$, $BL_{n-1}$, $BL_{n+1}$ and $BL_{n+2}$ from the fourth current source unit 44, the second current source unit 42, the third current source unit 43 and the fifth current source unit 45. As a result, the destruction of data stored in the tunnel magnetoresistance devices $TMJ_{(m,n-2)}$, $TMJ_{(m,n-1)}$, $TMJ_{(m,n+1)}$ and $TMJ_{(m,n+2)}$ electrically connected to the bit lines $BL_{n-2}$, $BL_{n-1}$, $BL_{n+1}$ and $BL_{n+2}$ can be reliably prevented as well.

EXAMPLE 4

Figure 17:
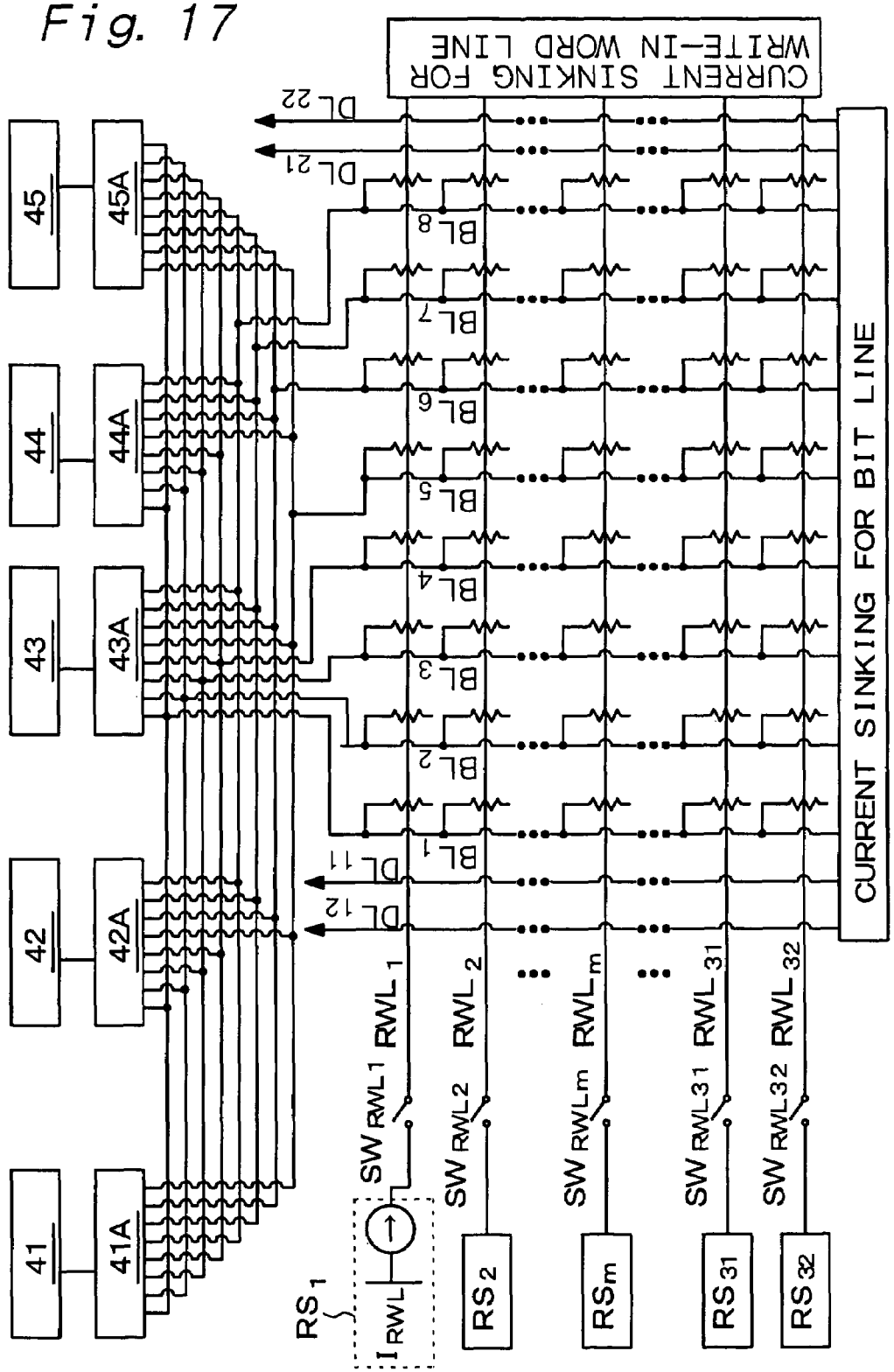
FIG. 17 is an equivalent circuit diagram of a nonvolatile magnetic memory device in Example 4.

Example 4 is a variant of Example 3. FIG. 17 shows an equivalent circuit diagram of a nonvolatile magnetic memory in Example 4.

In the nonvolatile magnetic memory device explained in Example 3, for example, the main magnetic field is generated by the current flowing in the first bit line $BL_1$ or the N-th-place bit line $BL_N$ [magnetic field generated by the current $g(0) \cdot I_{BL}$ or the current $g(0) \cdot I(N)_{BL}$], and the compensatory magnetic fields are generated by the currents flowing in the second and third bit lines $BL_2$ and $BL_3$ or in the (N−2)-th-place and (N−1)-th-place bit lines $BL_{(N-2)}$ and $BL_{(N-1)}$ [magnetic fields generated by the current $g(1) \cdot I(1)_{BL}$ and the current $g(2) \cdot I(1)_{BL}$ or by the current $g(-2) \cdot I(N)_{BL}$ and the current $g(-1) \cdot I(N)_{BL}$]. The above compensatory magnetic fields are asymmetric, for example, with regard to the first bit line $BL_1$ or the N-th-place bit line $BL_N$ as a base.

In the nonvolatile magnetic memory device in Example 4, therefore, when the absolute value of the maximum value that k represents is $k_0$ like Example 2 ($k_0=2$ in Example 4), a group of first dummy lines that are $k_0$ in number (first dummy lines $DL_{11}$ and $DL_{12}$) is provided outside the first bit line $BL_1$ and in parallel with the first bit line $BL_1$, a group of second dummy lines that are $k_0$ in number (second dummy lines $DL_{21}$ and $DL_{22}$) is provided outside the N-th-place bit line $BL_N$ and in parallel with the N-th-place bit line $BL_N$, and a current $g(k) \cdot I(n)_{BL}$ is passed through (or flowed in) the $[(1-n)+|k|]$-th-place first dummy line constituting the group of the first dummy lines or passed through (or flowed in) the $[n-N+|k|]$-th-place second dummy line constituting the group of the second dummy lines.

Specifically, like Example 2, when the main magnetic field generating current $\pm g(0) \cdot I_{BL}$ is passed through (or flowed in) the first bit line $BL_1$, the first compensatory magnetic field generating current $\pm g(\pm 1) \cdot I(n)_{BL}$ is passed through (or flowed in) the $[(1-n)+|k|]$-th-place first dummy line $DL_{11}$ (n=1, k=−1, first-place first dummy line) constituting the group of the first dummy lines, and the second compensatory magnetic field generating currents $\pm g(\pm 2) \cdot I(n)_{BL}$ is passed through (or flowed in) the $[(1-n)+|k|]$-th-place first dummy line $DL_{12}$ (n=1, k=−2, and second-place first dummy line) constituting the group of the first dummy lines. Further, when the main magnetic field generating current $\pm g(0) \cdot I_{BL}$ is passed through (or flowed in) the second bit line $BL_2$, the second compensatory magnetic field generating current $\pm g(\pm 2) \cdot I(n)_{BL}$ is passed through (or flowed in) the $[(1-n)+|k|]$-th-place first dummy line $DL_{11}$ (n=2, k=−2, first-place first dummy line) constituting the group of the first dummy lines.

When the main magnetic field generating current $\pm g(0) \cdot I_{BL}$ is passed through (or flowed in) the N-th-place bit line $BL_N$, the first compensatory magnetic field generating current $\pm g(\pm 1) \cdot I(n)_{BL}$ is passed through (or flowed in) the $[n-N+|k|]$-th-place second dummy line $DL_{21}$ (n=N, k=1, first-place second dummy line) constituting the group of the second dummy lines, and the second compensatory magnetic field generating current $\pm g(\pm 2) \cdot I(n)_{BL}$ is passed through (or flowed in) the $[n-N+|k|]$-th-place second dummy line $DL_{22}$ (n=N, k=2, and second-place second dummy line) constituting the group of the second dummy lines. Further, when the main magnetic field generating current $\pm g(0) \cdot I_{BL}$ is passed through (or flowed in) the (N−1)-th-place bit line $BL_{N-1}$, the second compensatory magnetic field generating current $\pm g(\pm 2) \cdot I(n)_{BL}$ is passed through (or flowed in) the $[n-N+|k|]$-th-place second dummy line $DL_{21}$ (n=N−1, k=2, first-place second dummy line) constituting the group of the second dummy lines.

The first-place first dummy line $DL_{11}$ constituting the group of the first dummy lines is connected to the third current source unit 43 through an open/close circuit that is not shown, and further, is connected to the fifth current source unit 45 through an open/close circuit that is not shown. Further, the first-place second dummy line $DL_{21}$ constituting the group of the second dummy lines is connected to the second current source unit 42 through an open/close circuit that is not shown, and further, is connected to the fourth current source unit 44 through an open/close circuit that is not shown. The second-place first dummy line $DL_{12}$ constituting the group of the first dummy lines is connected to the fifth current source unit 45 through an open/close circuit that is not shown. The second-place second dummy line $DL_{22}$ constituting the group of the second dummy lines is connected to the fourth current source unit 44 through an open/close circuit that is not shown.

The constitution, structure and operation of the nonvolatile magnetic memory device in Example 4 can be the same as those of the nonvolatile magnetic memory device in Example 3 except for the above points, so that a detailed explanation thereof is omitted. The operation of the dummy lines can be substantially the same as that explained in Example 2, so that a detailed explanation thereof is omitted.

EXAMPLE 5

Example 5 is concerned with the method for writing data into a tunnel magnetoresistance device in a nonvolatile magnetic memory device (more specifically, a nonvolatile magnetic memory device having TMR-type MRAM) according to the first aspect of the present invention.

The nonvolatile magnetic memory device in Example 5 has the constitution and the structure that are explained in Example 2. While each bit line $BL_n$ is provided with a current source unit $BCS_n$ like Example 2, a circuit (not shown) for adding the current $g(0) \cdot I_{BL}$, the current $-g(0) \cdot I_{BL}$, the current $g(\pm 1) \cdot I_{BL}$, the current $-g(\pm 1) \cdot I_{BL}$, the current $g(\pm 2) \cdot I_{BL}$ and the current $-g(\pm 2) \cdot I_{BL}$ is provided between the current source unit $BCS_n$ and the bit line $BL_n$. Further, similarly, circuits (not shown) for adding the currents are provided between the first dummy line current source $DLCS_{11}$ and the first-place first dummy line $DL_{11}$ and between the second dummy line current source $DLCS_{21}$ and the first-place second dummy line $DL_{21}$.

In Example 5, the current $I(m)_{RWL}$ is passed through (or flowed in) the m-th-place write-in word line, and the following currents $i(n)_{BL}$ are simultaneously passed through (or flowed in) the first to N-th-place bit lines. $k_0$ is the absolute value of the maximum value that k represents, and k in the expression (1) includes 0.

$$i(n)_{BL} = \sum_{k=-k_0}^{k_0} g(k) \cdot I(n-k)_{BL} \qquad (1)$$

Specifically, the currents $i(n)_{BL}$ shown in the following Table 6 are passed through (or flowed in) the first to N-th-place bit lines simultaneously.

TABLE 6

| | | | | | | | |
|---|---|---|---|---|---|---|---|
| Dummy Line DL$_{12}$ | g(−2)·I(1) | | | | | | |
| Dummy Line DL$_{11}$ | g(−1)·I(1) + | g(−2)·I(2) | | | | | |
| Bit Line BL$_1$ | g(0)·I(1) + | g(−1)·I(2) + | g(−2)·I(3) | | | | |
| Bit Line BL$_2$ | g(1)·I(1) + | g(0)·I(2) + | g(−1)·I(3) + | g(−2)·I(4) | | | |
| Bit Line BL$_3$ | g(2)·I(1) + | g(1)·I(2) + | g(0)·I(3) + | g(−1)·I(4) + | g(−2)·I(5) | | |
| Bit Line BL$_4$ | | g(2)·I(2) + | g(1)·I(3) + | g(0)·I(4) + | g(−1)·I(5) + | g(−2)·I(6) | |
| Bit Line BL$_5$ | | | g(2)·I(3) + | g(1)·I(4) + | g(0)·I(5) + | g(−1)·I(6) + | g(−2)·I(7) |
| Bit Line BL$_6$ | | | | g(2)·I(4) + | g(1)·I(5) + | g(0)·I(6) + | g(−1)·I(7) + | g(−2)·I(8) |
| Bit Line BL$_7$ | | | | | g(2)·I(5) + | g(1)·I(6) + | g(0)·I(7) + | g(−1)·I(8) |
| Bit Line BL$_8$ | | | | | | g(2)·I(6) + | g(1)·I(7) + | g(0)·I(8) |
| Dummy Line DL$_{21}$ | | | | | | | g(2)·I(7) + | g(1)·I(8) |
| Dummy Line DL$_{22}$ | | | | | | | | g(2)·I(8) |

It is supposed that the normalized currents $I(n)_{BL}$ shown in the following Table 7 are passed through (or flowed in) the bit lines $BL_n$.

normalized currents $i(n)_{BL}$ to be passed through (or flowed in) the bit lines $BL_n$ and the dummy lines $DL_{11}$, $DL_{12}$, $DL_{21}$ and $DL_{22}$.

TABLE 8

| | DL$_{12}$ | DL$_{11}$ | BL$_1$ | BL$_2$ | BL$_3$ | BL$_4$ | BL$_5$ | BL$_6$ | BL$_7$ | BL$_8$ | DL$_{21}$ | DL$_{22}$ |
|---|---|---|---|---|---|---|---|---|---|---|---|---|
| I (n)$_{BL}$ | | | −1 | 1 | −1 | −1 | 1 | 1 | −1 | 1 | | |
| g (k) I (n − k)$_{BL}$ | −0.0885 | 0.7603 | −1.7222 | 0.7603 | −0.0885 | | | | | | | |
| g (k) I (n − k)$_{BL}$ | | 0.0885 | −0.7603 | 1.7222 | −0.7603 | 0.0885 | | | | | | |
| g (k) I (n − k)$_{BL}$ | | | −0.0885 | 0.7603 | −1.7222 | 0.7603 | −0.0885 | | | | | |
| g (k) I (n − k)$_{BL}$ | | | | −0.0885 | 0.7603 | −1.7222 | 0.7603 | −0.0885 | | | | |
| g (k) I (n − k)$_{BL}$ | | | | | 0.0885 | −0.7603 | 1.7222 | −0.7603 | 0.0885 | | | |
| g (k) I (n − k)$_{BL}$ | | | | | | 0.0885 | −0.7603 | 1.7222 | −0.7603 | 0.0885 | | |
| g (k) I (n − k)$_{BL}$ | | | | | | | −0.0885 | 0.7603 | −1.7222 | 0.7603 | −0.0885 | |
| g (k) I (n − k)$_{BL}$ | | | | | | | | 0.0885 | −0.7603 | 1.7222 | −0.7603 | 0.0885 |
| i (n)$_{BL}$ | | | −2.571 | 3.1543 | −1.7222 | −1.5452 | 1.5452 | 1.7222 | −3.1543 | 2.571 | | |
| i (s) | −0.0885 | 0.8488 | −2.571 | 3.1543 | −1.7222 | −1.5452 | 1.5452 | 1.7222 | −3.1543 | 2.571 | −0.8488 | 0.0885 |
| s | −2 | −1 | 0 | 1 | 2 | 3 | 4 | 5 | 6 | 7 | 8 | 9 |
| i (t) | | | −2.571 | 3.1543 | −1.7222 | −1.5452 | 1.5452 | 1.7222 | −3.1543 | 2.571 | | |
| t | | | 0 | 1 | 2 | 3 | 4 | 5 | 6 | 7 | | |

TABLE 7

| Bit line | current I(n)$_{BL}$ |
|---|---|
| BL$_1$ | I(1)$_{BL}$ = −1 |
| BL$_2$ | I(2)$_{BL}$ = +1 |
| BL$_3$ | I(3)$_{BL}$ = −1 |
| BL$_4$ | I(4)$_{BL}$ = −1 |
| BL$_5$ | I(5)$_{BL}$ = +1 |
| BL$_6$ | I(6)$_{BL}$ = +1 |
| BL$_7$ | I(7)$_{BL}$ = −1 |
| BL$_8$ | I(8)$_{BL}$ = +1 |

Figure 18A:
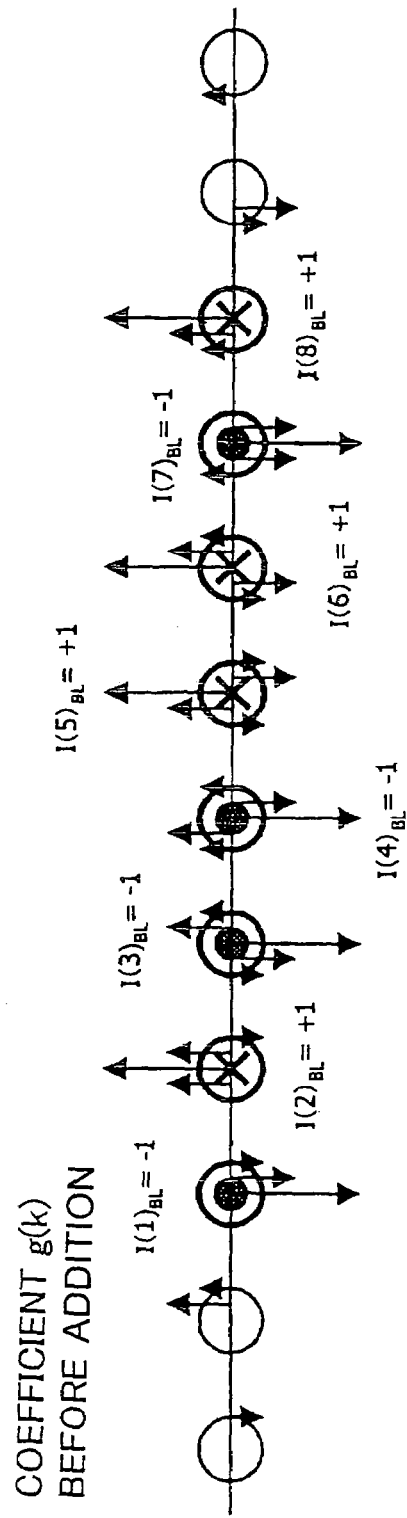
FIG. 18A schematically shows values of the coefficients (tap-gains) $g(0)$ and $g(k)$ before addition in each bit line $BL_n$ in a nonvolatile magnetic memory device in Example 5, and FIG. 18B schematically shows values of the coefficients (tap-gains) $g(0)$ and $g(k)$ after addition in each bit line $BL_n$ in the nonvolatile magnetic memory device in Example 5.
Figure 18B:
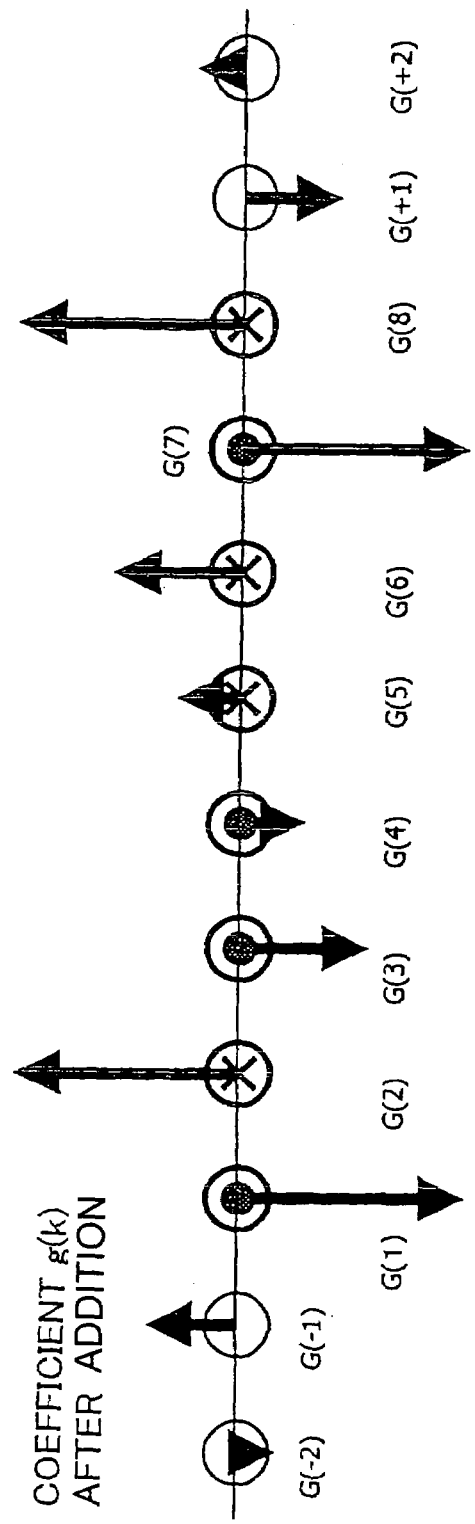
Figure 19:
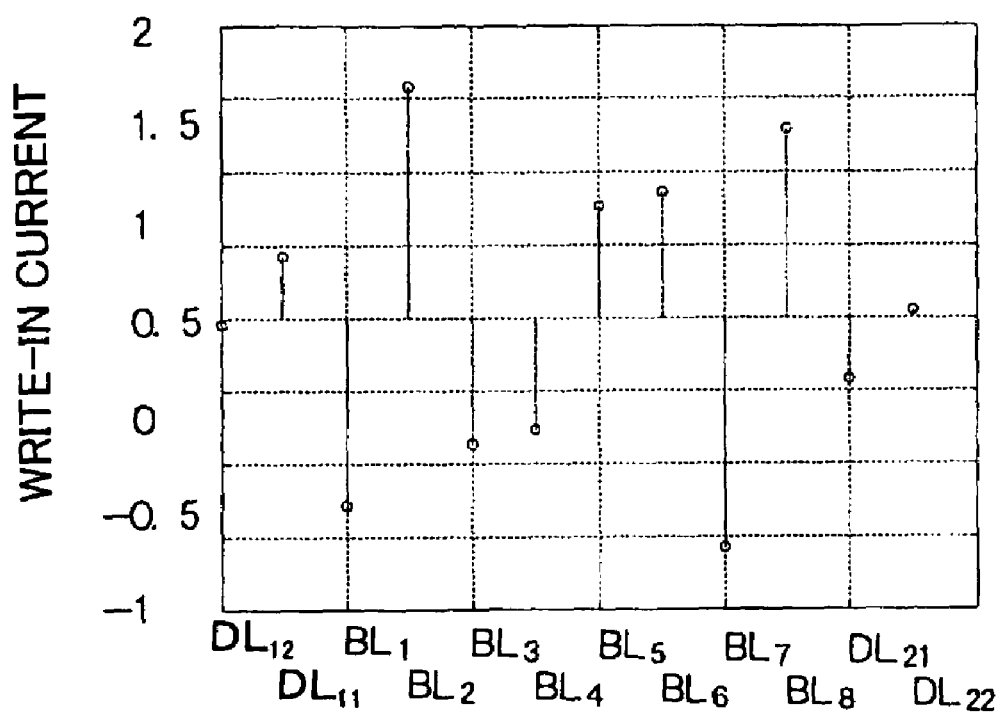
FIG. 19 shows normalized currents $i(n)_{BL}$ to be passed through the bit lines $BL_n$ in the nonvolatile magnetic memory device in Example 5.
Figure 20:
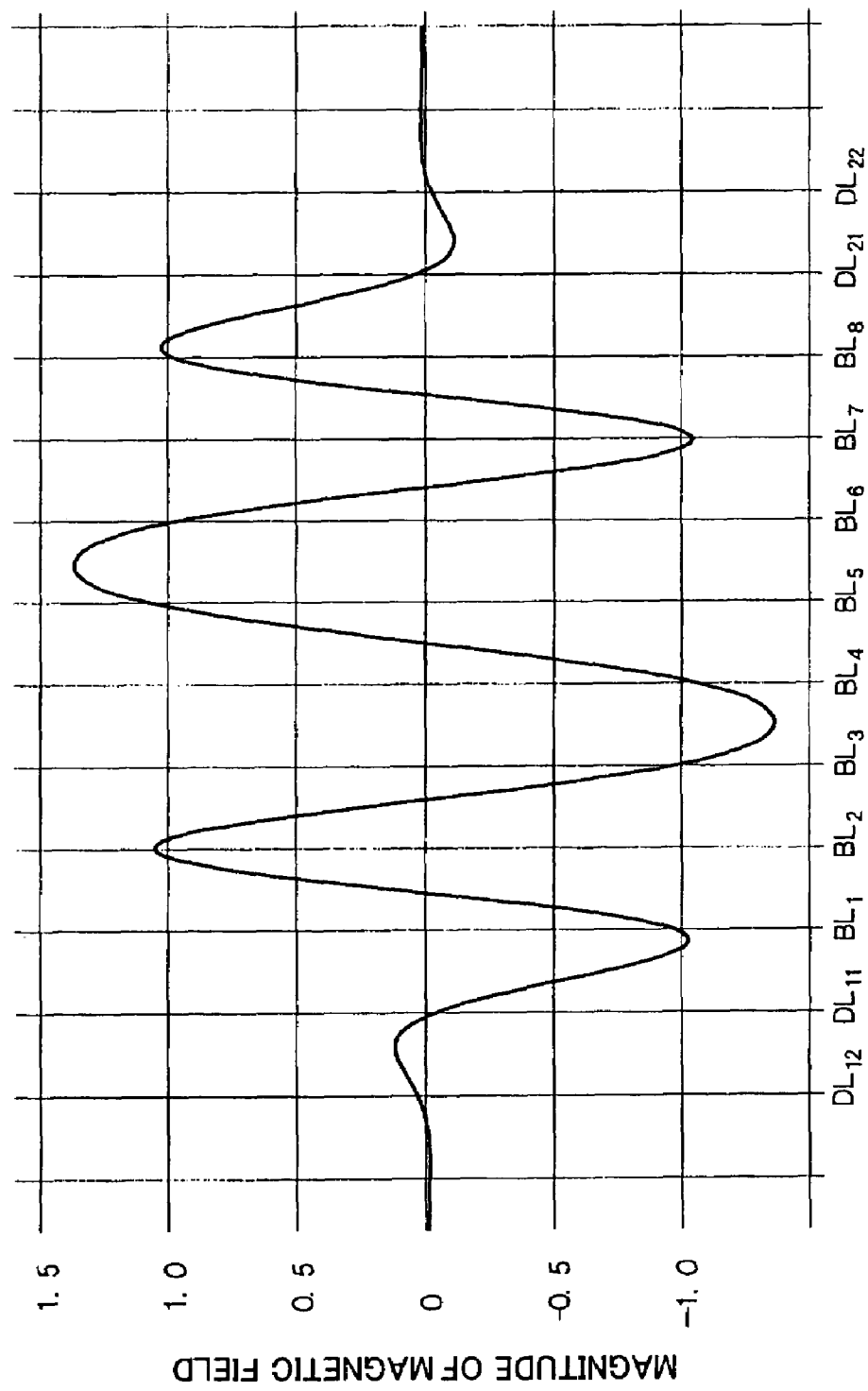
FIG. 20 is a graph of superposition of normalized magnetic fields in the X-axis direction, obtained on the basis of the expression (7) and on the basis of "s" and "i(s)" in Table 8.

FIG. 18A schematically shows the values of the coefficients (tap-gains) g(0) and g(k) before addition in each bit line $BL_n$ (n=1 to 8) by the arrow marks, and FIG. 18B schematically shows the values of the coefficients (tap-gains) G(n) after addition in each bit line $BL_n$ by the arrow marks. In FIG. 18B, the arrow marks G(−2), G(−1), G(+1) and G(+2) mean the coefficients (tap-gains) after addition in the second-place first dummy line $DL_{12}$ constituting the group of the first dummy lines, the first-place first dummy line $DL_{11}$ constituting the group of the first dummy lines, the first-place second dummy line $DL_{21}$ constituting the group of the second dummy lines and the second-place second dummy lines. The following Table 8 and FIG. 19 show the dummy line $DL_{22}$ constituting the group of the second Further, FIG. 20 shows a graph obtained by superimposing the normalized magnetic fields $[=\{i(S)\cdot\beta^2\}/\{(x-s)^2+\beta^2\}]$ in the X-axis direction, obtained on the basis of the expression (7) and "s" and "i(s)" in Table 8. In this case, the currents flowing in the write-in conductor lines are adjusted so as to approximate to the Nyquist's first criterion as shown in FIG. 44. As an example, ±1 and ±2 are used as values of k, and the values shown in Table 2 are employed as coefficients (tap-gains) g(0) and g(k) in β=(h/d)=1.0 when approximation is based on the simple model in FIG. 39. This is also applicable to FIGS. 22 to 26 to be explained later. As is clearly shown in FIG. 20, in the tunnel magnetoresistance device into which data "1" is to be written, the magnitude of the normalized magnetic field in the X-axis direction is almost "1", and in the tunnel magnetoresistance device into which data "0" is to be written, the magnitude of the normalized magnetic field in the X-axis direction is almost "−1". That is, it is seen that even when data are simultaneously written into the eight tunnel magnetoresistance devices arranged in parallel, no erroneous data writing occurs.

Figure 21A:
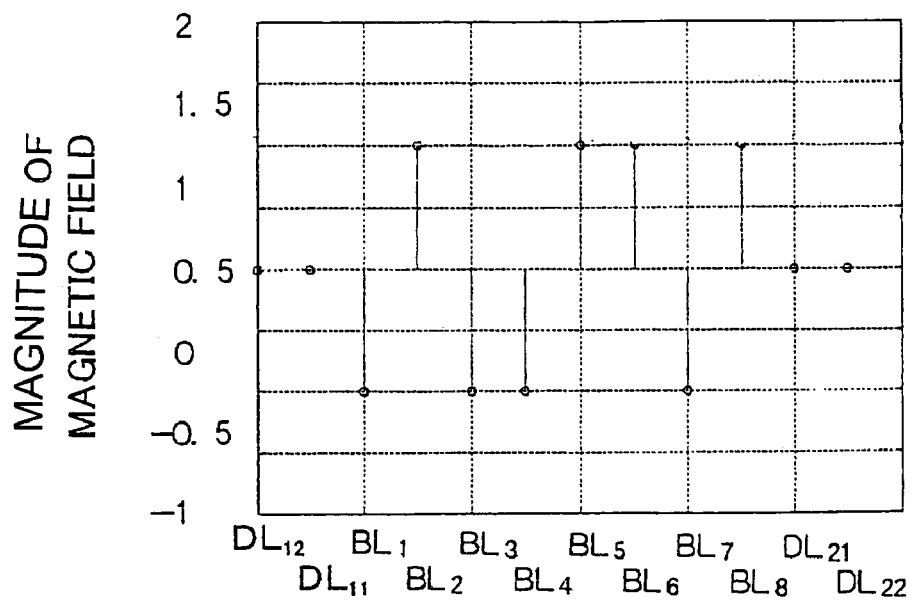
FIG. 21A is a graph of normalized currents $I(N)_{BL}$ shown in Table 7.
Figure 21B:
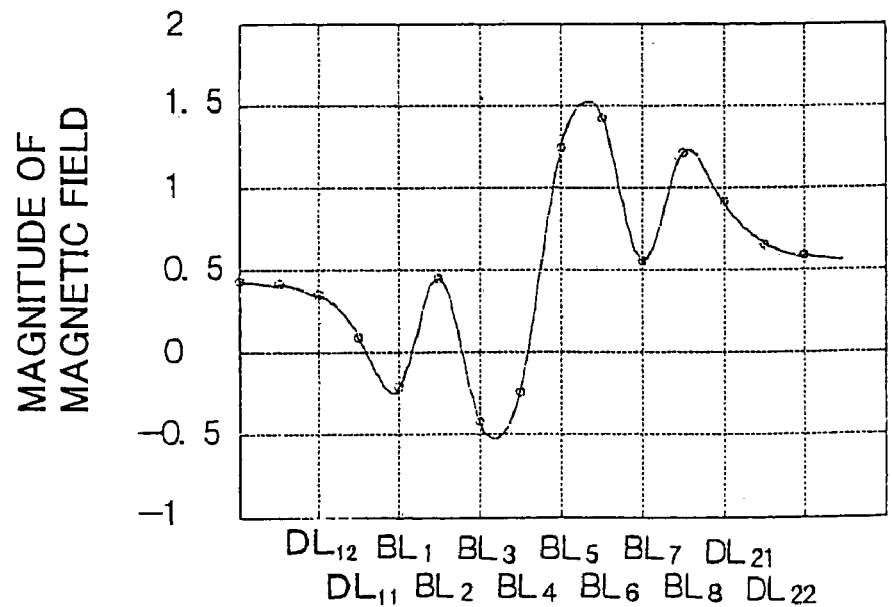
FIG. 21B is a graph of superposition of normalized magnetic fields in the X-axis direction similar to the graph shown in FIG. 20 when the normalized currents $I(n)_{BL}$ shown in Table 7 are passed through the bit lines $BL_n$.

FIG. 21B shows a graph obtained by superimposing the normalized magnetic fields in the X-axis direction like FIG. 20, when the normalized currents $I(n)_{BL}$ shown in Table 7 are passed through (or flowed in) the bit lines $BL_n$. FIG. 21A shows the normalized currents $i(n)_{BL}$ to be passed through (or flowed in) the bit lines $BL_n$. As is clearly shown in FIG. 21B, in the tunnel magnetoresistance device into which data "1" is to be written, the magnitude of the normalized magnetic field in the X direction cannot be "1" in some cases, and in the tunnel magnetoresistance device into which data "0" is to be written, the magnitude of the normalized-magnetic field in the X direction cannot be "−1" in some cases. That is, it is seen that when data are simultaneously written into the eight tunnel magnetoresistance devices arranged in parallel, erroneous data writing occurs.

Figure 22:
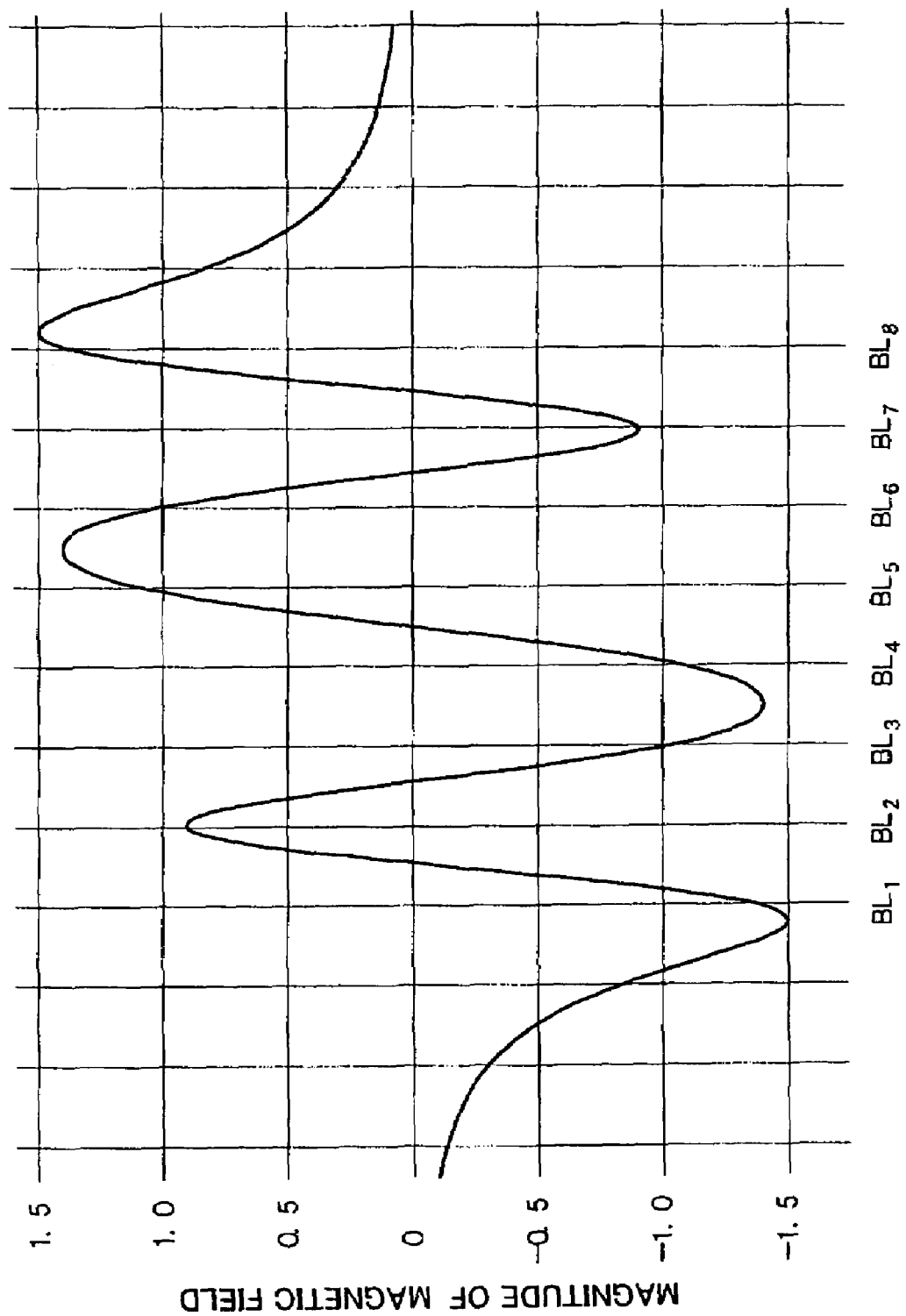
FIG. 22 is a graph of superposition of normalized magnetic fields in the X-axis direction, obtained on the basis of the expression (7) and on the basis of "t" and "i(t)" in Table 8 without providing any dummy line.

When none of the dummy lines $DL_{11}$, $DL_{12}$, $DL_{21}$ and $DL_{22}$ is provided, a graph obtained by superimposing the normalized magnetic fields $[=\{i(t)\cdot\beta p^2\}/\{(x-t)^2+\beta^2\}]$ in the X-axis direction, obtained on the basis of the expression (7) and "t" and "i(t)" in Table 8, is as shown in FIG. 22. As is clearly shown in FIG. 22, in the tunnel magnetoresistance device into which data "1" is to be written, the magnitude of the normalized magnetic field in the X-axis direction is almost "1", and in the tunnel magnetoresistance device into which data "0" is to be written, the magnitude of the normalized magnetic field in the X-axis direction is almost "−1". That is, it is seen that even when data are simultaneously written into the eight tunnel magnetoresistance devices arranged in parallel, no erroneous data writing occurs. It is also seen that providing dummy lines is not essential.

It is supposed that the normalized currents $I(n)_{BL}$ shown in the following Table 9 are passed through (or flowed in) the bit lines $BL_n$. Further, the following Table 9 shows the normalized currents $i(n)_{BL}$ that are passed through (or flowed in) the bit lines $BL_n$ and the dummy lines $DL_{11}$, $DL_{12}$, $DL_{21}$ and $DL_{22}$.

Figure 23:
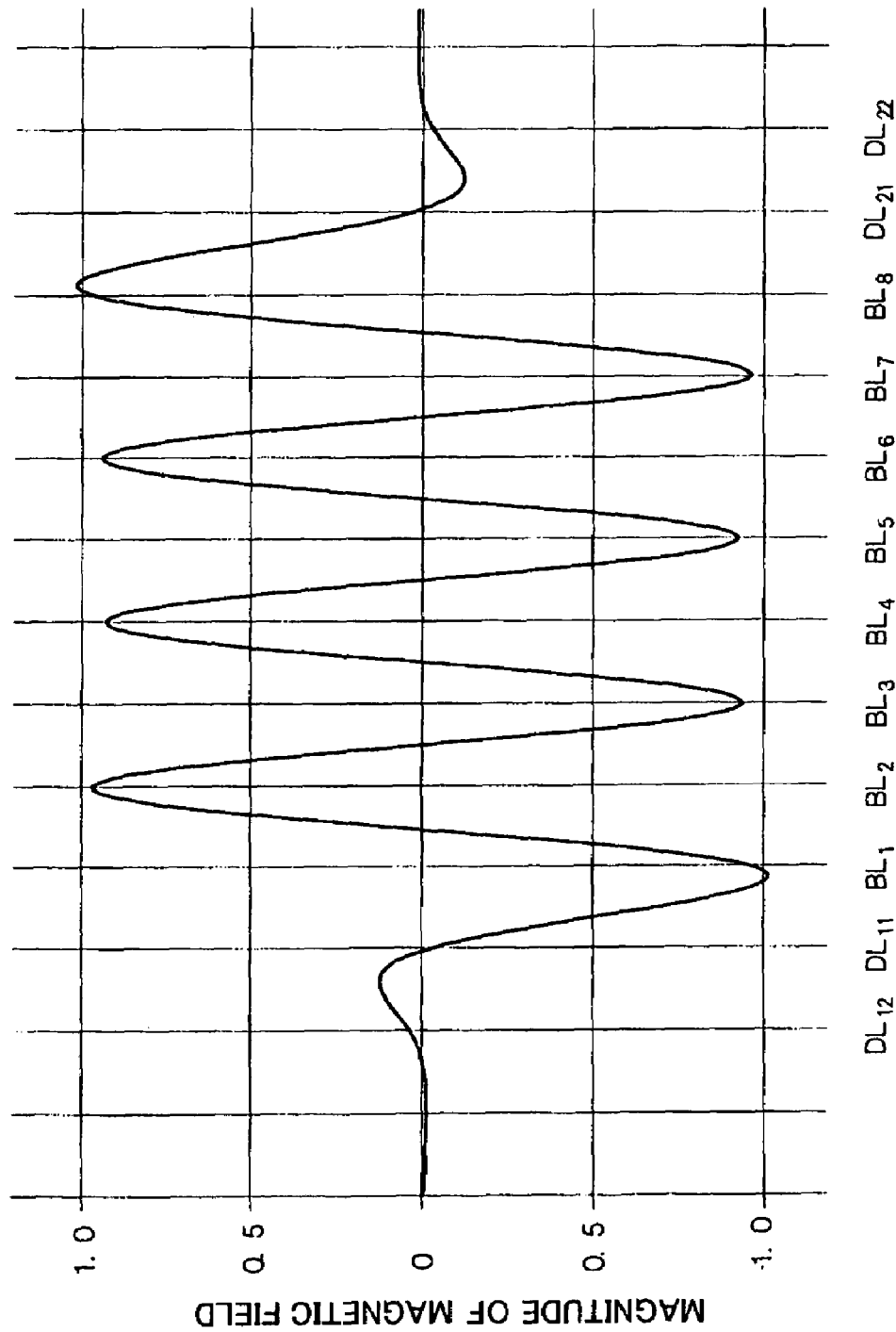
FIG. 23 is a graph of superposition of normalized magnetic fields in the X-axis direction, obtained on the basis of the expression (7) and on the basis of "s" and "i(s)" in Table 9.

Further, FIG. 23 shows a graph obtained by superimposing the normalized magnetic fields $[=\{i(S)\cdot\beta^2\}/\{(X-S)^2+\beta^2\}]$ in the X-axis direction, obtained on the basis of the expression (7) and "s" and "i(s)" in Table 9. As is clearly shown in FIG. 23, in the tunnel magnetoresistance device into which data "1" is to be written, the magnitude of the normalized magnetic field in the X-axis direction is almost "1", and in the tunnel magnetoresistance device into which data "0" is to be written, the magnitude of the normalized magnetic field in the X-axis direction is almost "−1". That is, it is seen that even when data are simultaneously written into the eight tunnel magnetoresistance devices arranged in parallel, no erroneous data writing occurs.

Figure 24:
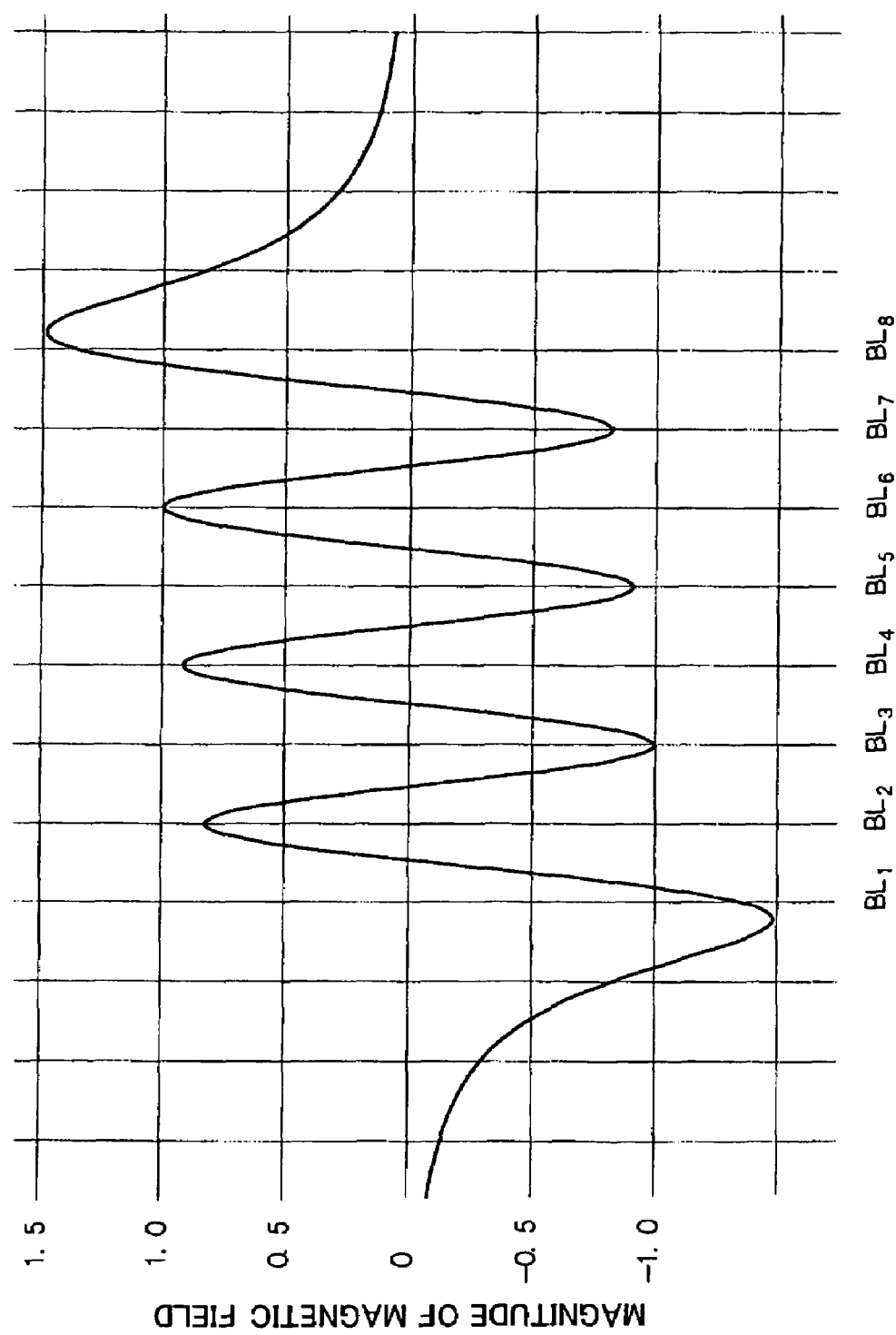
FIG. 24 is a graph of superposition of normalized magnetic fields in the X-axis direction, obtained on the basis of the expression (7) and on the basis of "t" and "i(t)" in Table 9 without providing any dummy line.

When none of the dummy lines $DL_{11}$, $DL_{12}$, $DL_{21}$ and $DL_{22}$ is provided, FIG. 24 shows a graph obtained by superimposing the normalized magnetic fields $[=\{i(t)\cdot\beta^2\}/\{(x-t)^2+\beta^2\}]$ in the X-axis direction, obtained on the basis of the expression (7) and "t" and "i(t)" in Table 9. As is also clearly shown in FIG. 24, in the tunnel magnetoresistance device into which data "1" is to be written, the magnitude of the normalized magnetic field in the X-axis direction is almost "1", and in the tunnel magnetoresistance device into which data "0" is to be written, the magnitude of the normalized magnetic field in the X-axis direction is almost "−1". That is, it is seen that even when data are simultaneously written into the eight tunnel magnetoresistance devices arranged in parallel, no erroneous data writing occurs. It is also seen that providing dummy lines is not essential.

It is supposed that the normalized currents $I(n)_{BL}$ shown in the following Table 10 are passed through (or flowed in) the bit lines $BL_n$. Further, the following Table 10 shows the currents $i(n)_{BL}$ that are passed through (or flowed in) the bit lines $BL_n$ and the

TABLE 9

|  | $DL_{12}$ | $DL_{11}$ | $BL_1$ | $BL_2$ | $BL_3$ | $BL_4$ | $BL_5$ | $BL_6$ | $BL_7$ | $BL_8$ | $DL_{21}$ | $DL_{22}$ |
|---|---|---|---|---|---|---|---|---|---|---|---|---|
| $I(n)_{BL}$ |  |  | −1 | 1 | −1 | 1 | −1 | 1 | −1 | 1 |  |  |
| $g(k) I(n-k)_{BL}$ | −0.0885 | 0.7603 | −1.7222 | 0.7603 | −0.0885 |  |  |  |  |  |  |  |
| $g(k) I(n-k)_{BL}$ |  | 0.0885 | −0.7603 | 1.7222 | −0.7603 | 0.0885 |  |  |  |  |  |  |
| $g(k) I(n-k)_{BL}$ |  |  | −0.0885 | 0.7603 | −1.7222 | 0.7603 | −0.0885 |  |  |  |  |  |
| $g(k) I(n-k)_{BL}$ |  |  |  | 0.0885 | −0.7603 | 1.7222 | −0.7603 | 0.0885 |  |  |  |  |
| $g(k) I(n-k)_{BL}$ |  |  |  |  | −0.0885 | 0.7603 | −1.7222 | 0.7603 | −0.0885 |  |  |  |
| $g(k) I(n-k)_{BL}$ |  |  |  |  |  | 0.0885 | −0.7603 | 1.7222 | −0.7603 | 0.0885 |  |  |
| $g(k) I(n-k)_{BL}$ |  |  |  |  |  |  | −0.0885 | 0.7603 | −1.7222 | 0.7603 | −0.0885 |  |
| $g(k) I(n-k)_{BL}$ |  |  |  |  |  |  |  | 0.0885 | −0.7603 | 1.7222 | −0.7603 | 0.0885 |
| $i(n)_{BL}$ |  |  | −2.571 | 3.3313 | −3.4198 | 3.4198 | −3.4198 | 3.4198 | −3.3313 | 2.571 |  |  |
| $i(s)$ | −0.0885 | 0.8488 | −2.571 | 3.3313 | −3.4198 | 3.4198 | −3.4198 | 3.4198 | −3.3313 | 2.571 | −0.8488 | 0.0885 |
| s | −2 | −1 | 0 | 1 | 2 | 3 | 4 | 5 | 6 | 7 | 8 | 9 |
| $i(t)$ |  |  | −2.571 | 3.3313 | −3.4198 | 3.4198 | −3.4198 | 3.4198 | −3.3313 | 2.571 |  |  |
| t |  |  | 0 | 1 | 2 | 3 | 4 | 5 | 6 | 7 |  |  |

TABLE 10

|  | $DL_{12}$ | $DL_{11}$ | $BL_1$ | $BL_2$ | $BL_3$ | $BL_4$ | $BL_5$ | $BL_6$ | $BL_7$ | $BL_8$ | $DL_{21}$ | $DL_{22}$ |
|---|---|---|---|---|---|---|---|---|---|---|---|---|
| $I(n)_{BL}$ |  |  | 1 | 1 | 1 | 1 | 1 | 1 | 1 | 1 |  |  |
| $g(k) I(n-k)_{BL}$ | 0.0885 | −0.7603 | 1.7222 | −0.7603 | 0.0885 |  |  |  |  |  |  |  |
| $g(k) I(n-k)_{BL}$ |  | 0.0885 | −0.7603 | 1.7222 | −0.7603 | 0.0885 |  |  |  |  |  |  |
| $g(k) I(n-k)_{BL}$ |  |  | 0.0885 | −0.7603 | 1.7222 | −0.7603 | 0.0885 |  |  |  |  |  |
| $g(k) I(n-k)_{BL}$ |  |  |  | 0.0885 | −0.7603 | 1.7222 | −0.7603 | 0.0885 |  |  |  |  |
| $g(k) I(n-k)_{BL}$ |  |  |  |  | 0.0885 | −0.7603 | 1.7222 | −0.7603 | 0.0885 |  |  |  |
| $g(k) I(n-k)_{BL}$ |  |  |  |  |  | 0.0885 | −0.7603 | 1.7222 | −0.7603 | 0.0885 |  |  |
| $g(k) I(n-k)_{BL}$ |  |  |  |  |  |  | 0.0885 | −0.7603 | 1.7222 | −0.7603 | 0.0885 |  |
| $g(k) I(n-k)_{BL}$ |  |  |  |  |  |  |  | 0.0885 | −0.7603 | 1.7222 | −0.7603 | 0.0885 |

TABLE 10-continued

|   | $DL_{12}$ | $DL_{11}$ | $BL_1$ | $BL_2$ | $BL_3$ | $BL_4$ | $BL_5$ | $BL_6$ | $BL_7$ | $BL_8$ | $DL_{21}$ | $DL_{22}$ |
|---|---|---|---|---|---|---|---|---|---|---|---|---|
| $i(n)_{BL}$ |  |  | 1.0504 | 0.2901 | 0.3786 | 0.3786 | 0.3786 | 0.3786 | 0.2901 | 1.0504 |  |  |
| $i(s)$ | 0.0885 | −0.6718 | 1.0504 | 0.2901 | 0.3786 | 0.3786 | 0.3786 | 0.3786 | 0.2901 | 1.0504 | −0.6718 | 0.0885 |
| s | −2 | −1 | 0 | 1 | 2 | 3 | 4 | 5 | 6 | 7 | 8 | 9 |
| $i(t)$ |  |  | 1.0504 | 0.2901 | 0.3786 | 0.3786 | 0.3786 | 0.3786 | 0.2901 | 1.0504 |  |  |
| t |  |  | 0 | 1 | 2 | 3 | 4 | 5 | 6 | 7 |  |  |

Figure 25:
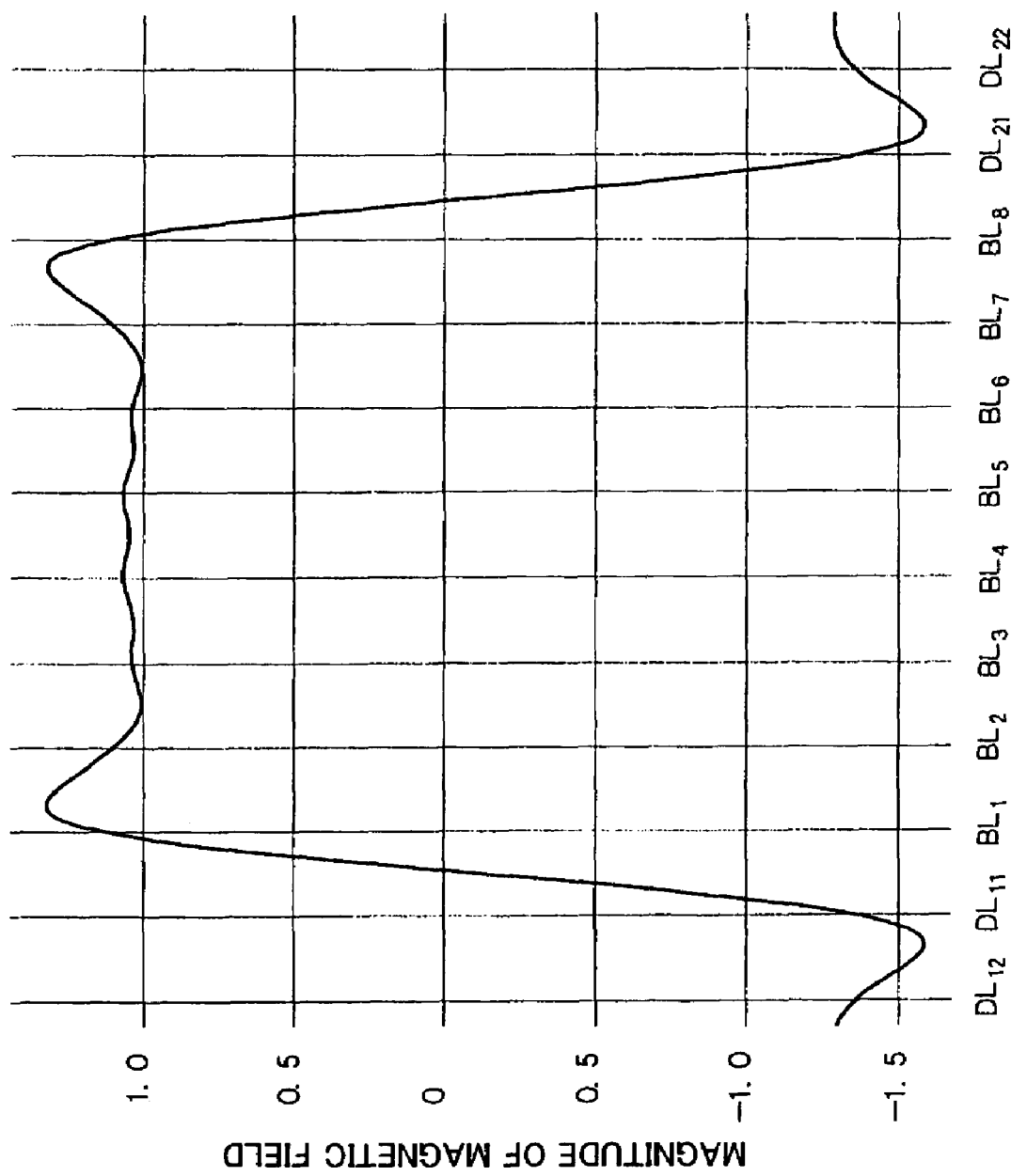
FIG. 25 is a graph of superposition of normalized magnetic fields in the X-axis direction, obtained on the basis of the expression (7) and on the basis of "s" and "i(s)" in Table 10.

Further, FIG. 25 shows a graph obtained by superimposing the normalized magnetic fields $[=\{i(s)\cdot\beta^2\}/\{(x-s)^2+\beta^2\}]$ in the X-axis direction, obtained on the basis of the expression (7) and "s" and "i(s)" in Table 10. As is clearly shown in FIG. 25, in the tunnel magnetoresistance device into which data "1" is to be written, the magnitude of the normalized magnetic field in the X-axis direction is almost "1", and in the tunnel magnetoresistance device into which data "0" is to be written, the magnitude of the normalized magnetic field in the X-axis direction is almost "−1". That is, it is seen that even when data are simultaneously written into the eight tunnel magnetoresistance devices arranged in parallel, no erroneous data writing occurs.

Figure 26:
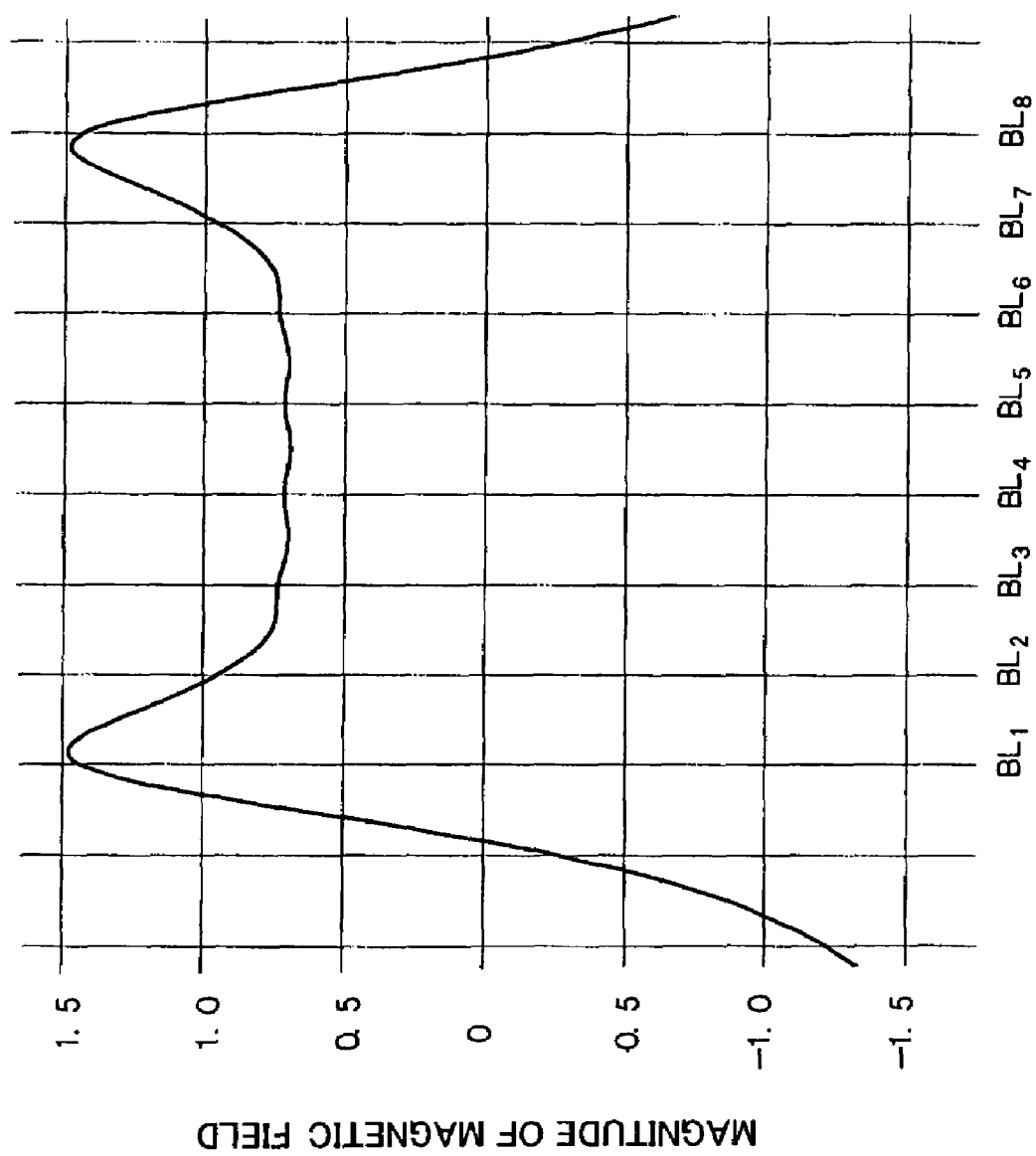
FIG. 26 is a graph of superposition of normalized magnetic fields in the X-axis direction, obtained on the basis of the expression (7) and on the basis of "t" and "i(t)" in Table 10 without providing any dummy line.

When none of the dummy lines $DL_{11}$, $DL_{12}$, $DL_{21}$ and $DL_{22}$ is provided, FIG. 26 shows a graph obtained by superimposing the normalized magnetic fields $[=\{i(t)\cdot\beta^2\}/\{(x-t)^2+\beta^2\}]$ in the X-axis direction, obtained on the basis of the expression (7) and "t" and "i(t)" in Table 10. As is also clearly shown in FIG. 26, in the tunnel magnetoresistance device into which data "1" is to be written, the magnitude of the normalized magnetic field in the X-axis direction is almost "1", and in the tunnel magnetoresistance device into which data "0" is to be written, the magnitude of the normalized magnetic field in the X-axis direction is almost "−1". That is, it is seen that even when data are simultaneously written into the eight tunnel magnetoresistance devices arranged in parallel, no erroneous data writing occurs. It is also seen that providing dummy lines is not essential.

FIGS. 27A and 27B and FIGS. 28A and 28B show "eye" patterns when $\beta=(h/d)=1.0$. An "eye" pattern is generally used for evaluating equalization characteristics in the field of digital transmission. In FIGS. 27A and 27B and FIGS. 28A and 28B, the unit of values in the axis of abscissas is "d".

Figure 27A:
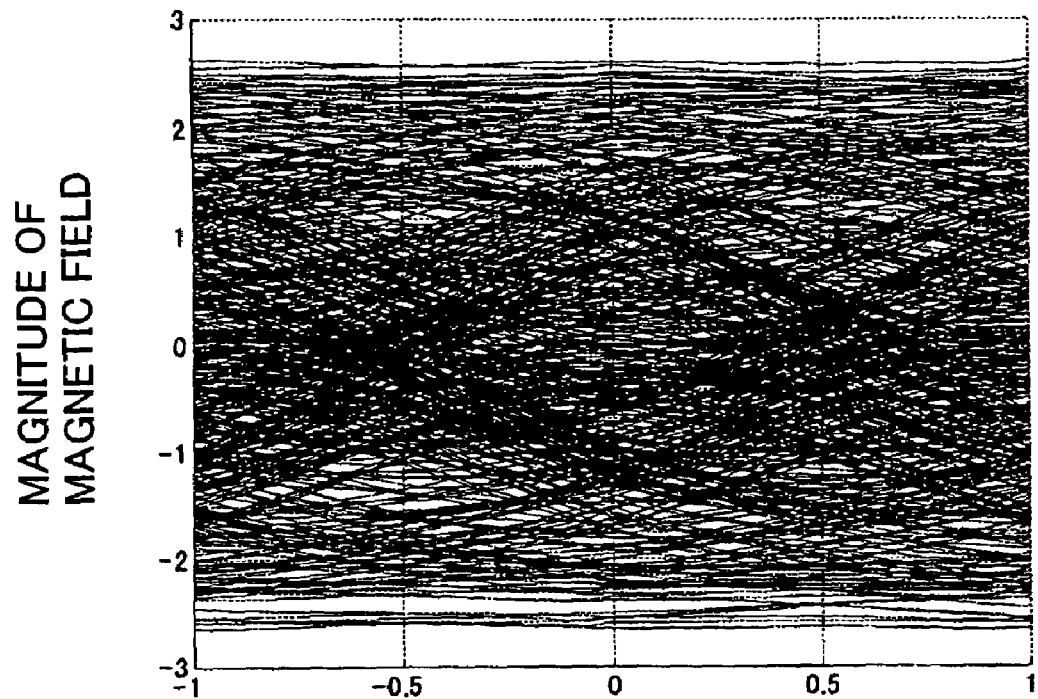
FIGS. 27A and 27B show drawings of "eye" patterns when $\beta=(h/d)=1.0$, and, FIG. 27A is a drawing before equalization

FIG. 27A shows a superimposition of the magnetic fields generated by a random current $I_{BL}$ or current $-I_{BL}$ (having the values of ±1) flowing in the bit lines when an infinite number of the tunnel magnetoresistance devices are arranged along the write-in word line. That is, FIG. 27A shows a superimposition of the magnetic fields before equalization.

Figure 27B:
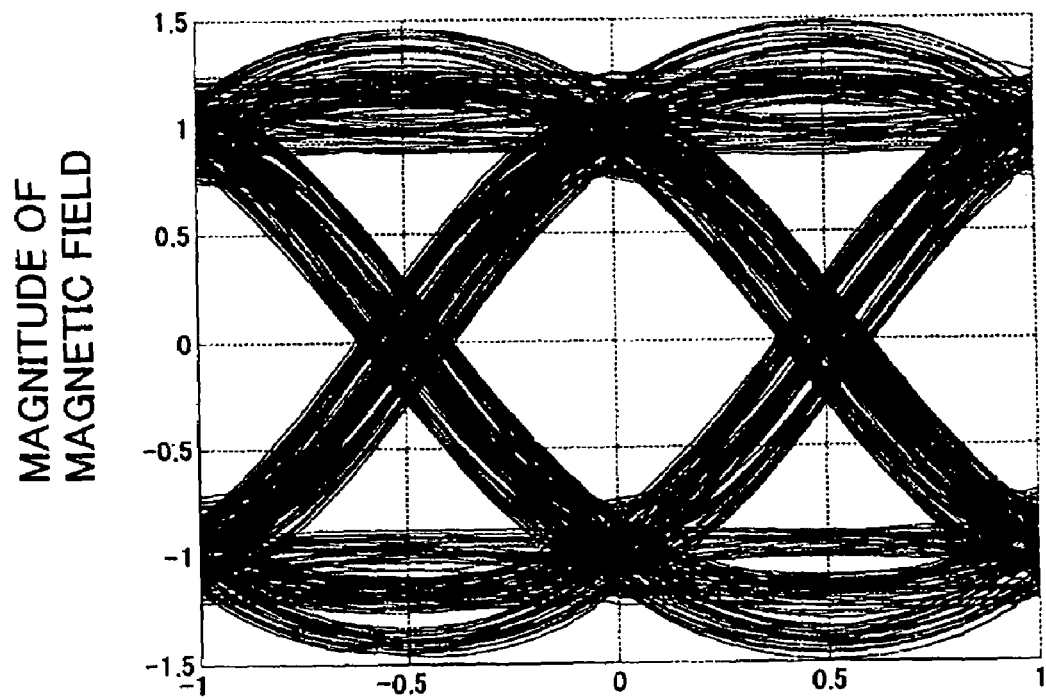

FIG. 27B shows a superimposition of the magnetic fields generated by a random current $I_{BL}$ or current $-I_{BL}$ (having the values of ±1), as a main magnetic field generating current $\pm g(0)\cdot I_{BL}$, flowing in the bit lines and further by the first compensatory magnetic field generating currents $\pm g(\pm 1)\cdot I_{BL}$ flowing in the bit lines, when an infinite number of the tunnel magnetoresistance devices are arranged along the write-in word line. That is, FIG. 27B shows a case where an FIR filter of three taps is constituted.

Figure 28A:
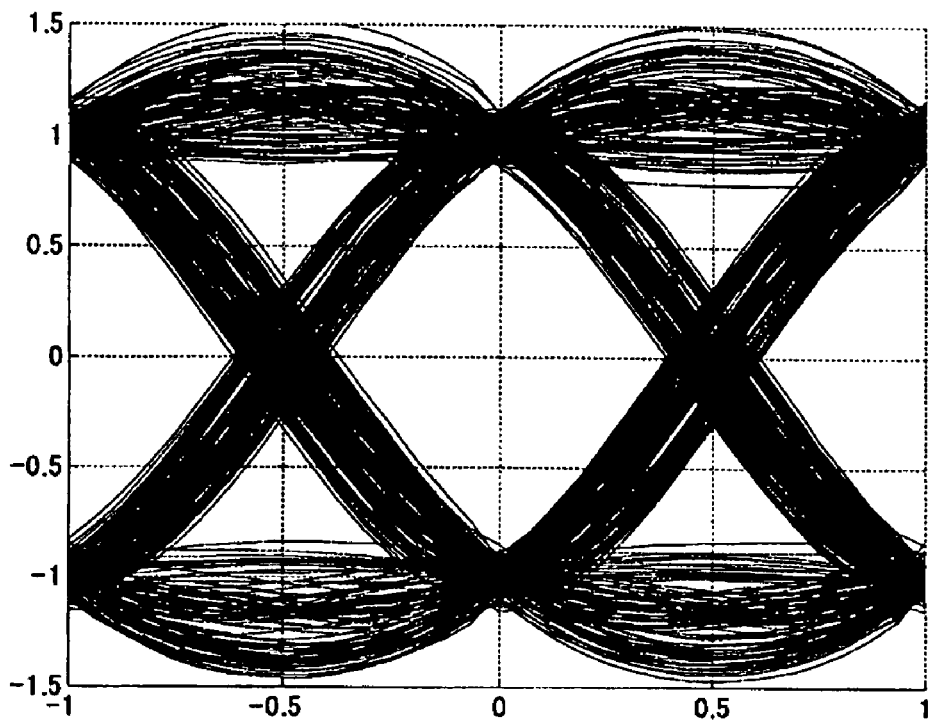
FIGS. 28A and 28B show drawings of "eye" patterns when $\beta=(h/d)=1.0$, and, FIG. 28A is a drawing after the equalization with five taps.

FIG. 28A shows a superimposition of the magnetic fields generated by a random current $I_{BL}$ or current $-I_{BL}$ (having the values of ±1), as a main magnetic field generating current $\pm g(0)\cdot I_{BL}$, flowing in the bit lines and further by the first compensatory magnetic field generating currents $\pm g(\pm 1)\cdot I_{BL}$ and the second compensatory magnetic field generating currents $\pm g(\pm 2)\cdot I_{BL}$ flowing in the bit lines, when an infinite number of the tunnel magnetoresistance devices are arranged along the write-in word line. That is, FIG. 28A shows a case where an FIR filter of five taps is constituted.

Figure 28B:
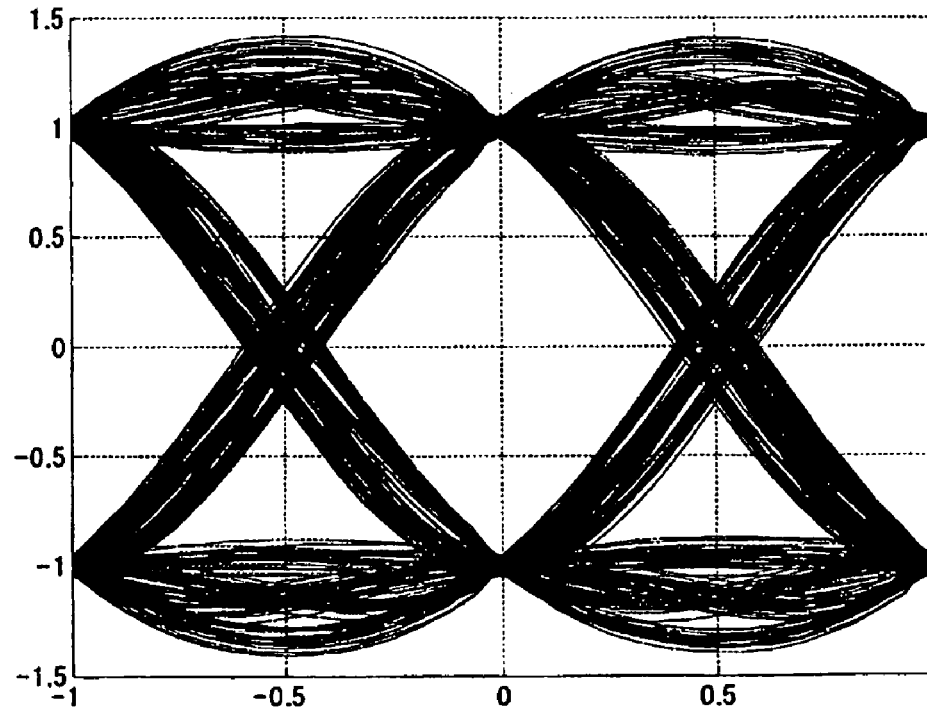

FIG. 28B shows a superimposition of the magnetic fields generated by a random current $I_{BL}$ or current $-I_{BL}$ (having the values of ±1), as a main magnetic field generating current $\pm g(0)\cdot I_{BL}$, flowing in the bit lines and further by the first compensatory magnetic field generating currents $\pm g(\pm 1)\cdot I_{BL}$, the second compensatory magnetic field generating currents $\pm g(\pm 2)\cdot I_{BL}$ and the third compensatory magnetic field generating currents $\pm g(3)\cdot I_{BL}$ flowing in the bit lines, when an infinite number of the tunnel magnetoresistance devices are arranged along the write-in word line. That is, FIG. 28B shows a case where an FIR filter of seven taps is constituted.

These "eye" pattern drawings show the following. When $\beta=(h/d)=1.0$, if the spatial FIR filter is not constituted, the magnetic fields interfere with one another to a great extent, so that parallel-data-writing in the tunnel magnetoresistance devices is not possible. However, if at least a FIR filter of three taps is constituted, the interference of the magnetic fields is suppressed, and parallel-data-writing in the tunnel magnetoresistance devices is possible. When an FIR filter of five taps and an FIR filter of seven taps are constituted, the interference of the magnetic fields is suppressed to a greater extent.

Figure 29A:
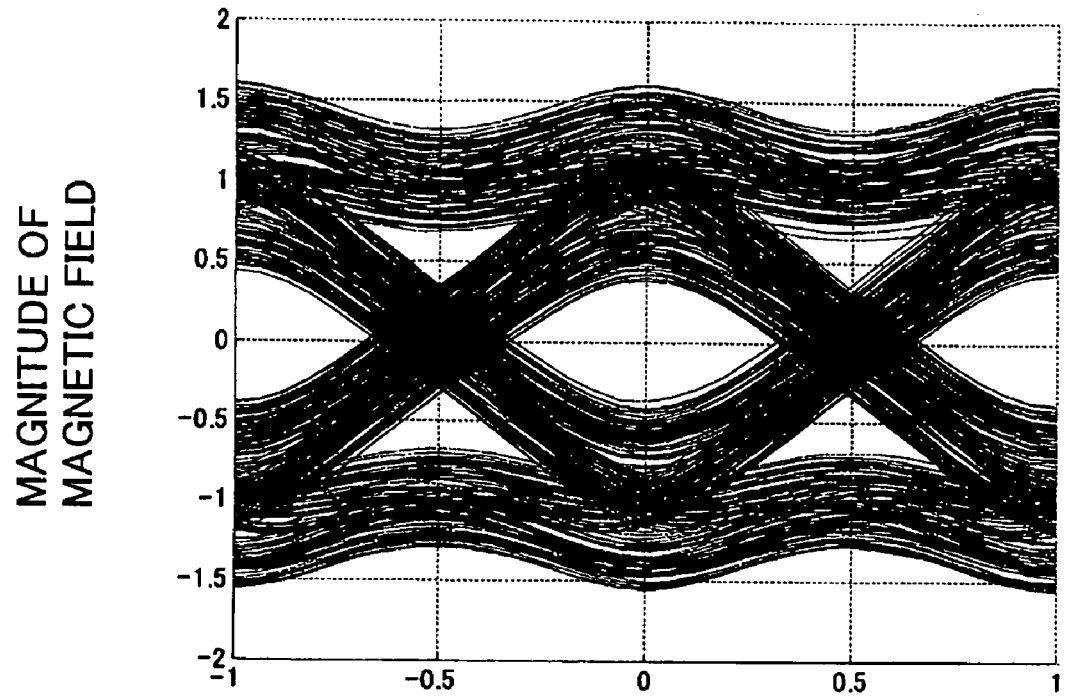
FIGS. 29A and 29B show drawings of "eye" patterns when $\beta=(h/d)=0.5$, and, FIG. 29A is a drawing before equalization.
Figure 29B:
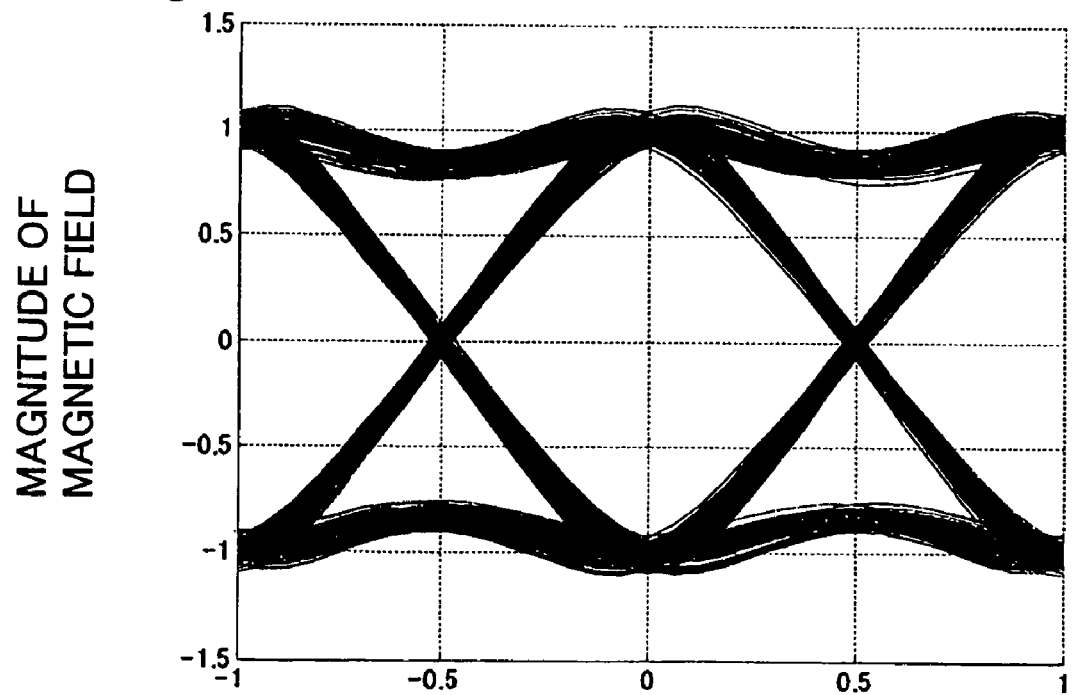

FIG. 29A shows a drawing of an "eye" pattern similar to that in FIG. 27A but when $\beta=(h/d)=0.5$, and FIG. 29B shows an "eye" pattern similar to that in FIG. 27B but when $\beta=(h/d)=0.5$. For example, it is supposed that data can be written into a tunnel magnetoresistance device into which data is to be written, at a magnetic field magnitude of 0.5 or more. In this case, it is seen that a case where no data is written into a tunnel magnetoresistance device in error before equalization occurs at a constant rate but that, if an FIR filter of three taps is constituted, such a failure in wiring does not occur.

Figure 30:
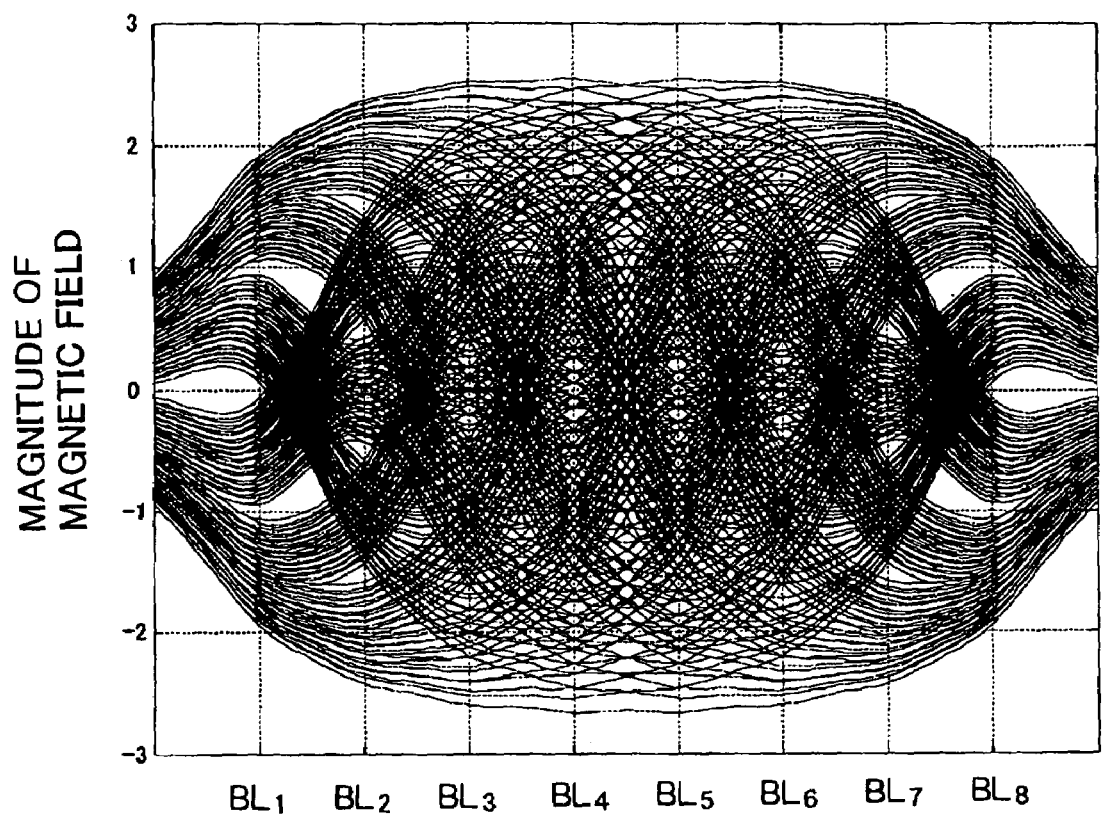
FIG. 30 shows a drawing of an "eye" pattern when $\beta=(h/d)=1.0$ before equalization.
Figure 31:
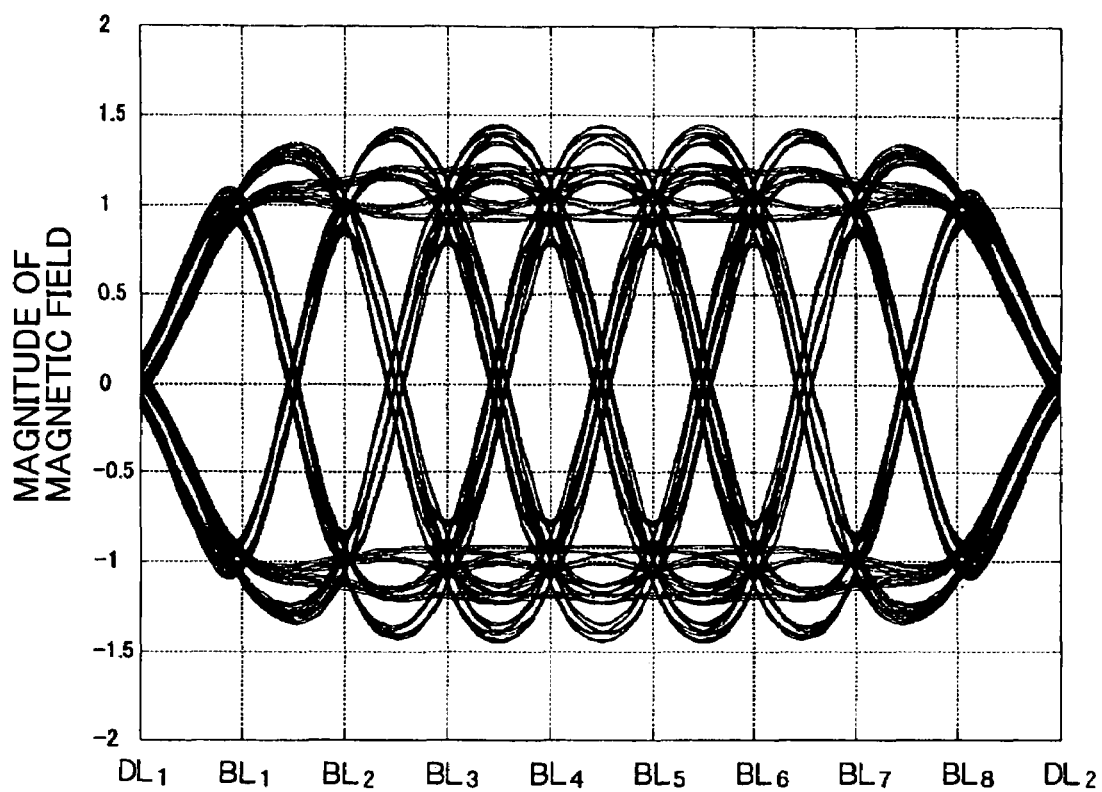
FIG. 31 shows a drawing of an "eye" pattern when $\beta=(h/d)=1.0$ after equalization with three taps when dummy lines are provided.
Figure 32:
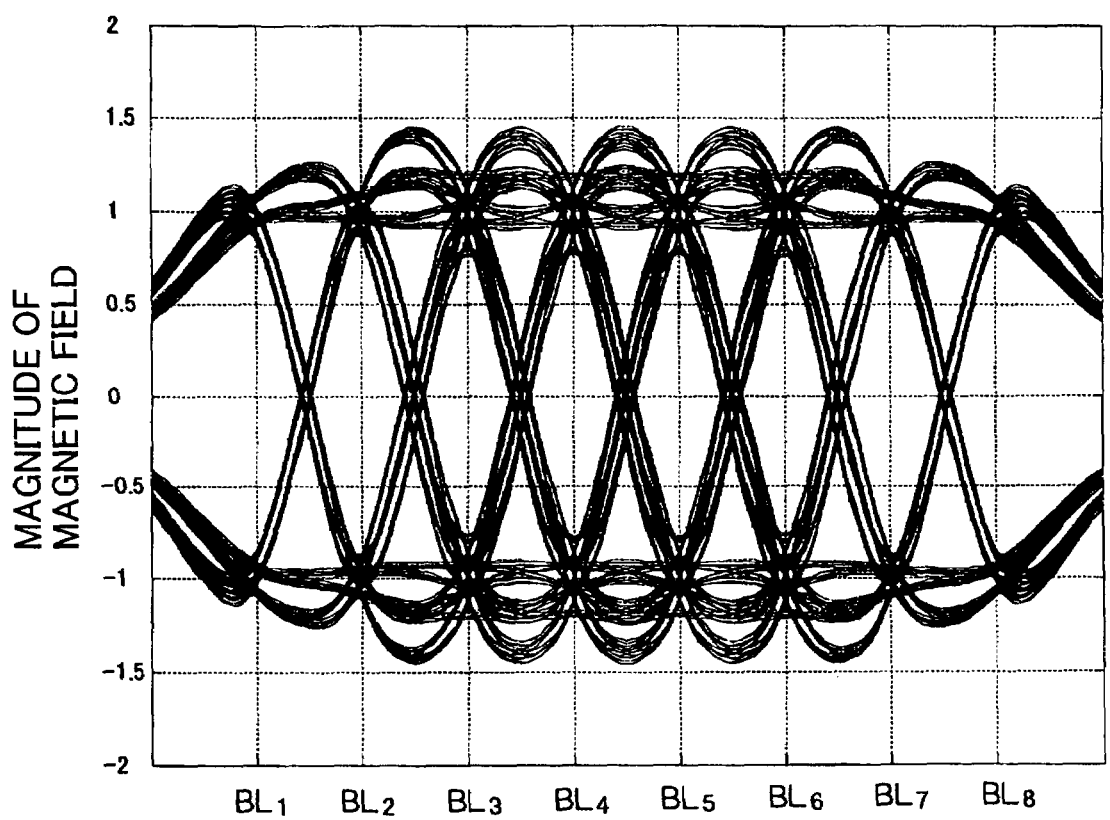
FIG. 32 shows a drawing of an "eye" pattern when $\beta=(h/d)=1.0$ after equalization with three taps when no dummy line is provided.

Further, FIGS. 30, 31 and 32 show "eye" patterns when $\beta=(h/d)=1.0$. FIG. 30 shows a superimposition of the magnetic fields generated by a random current $I_{BL}$ or current $-I_{BL}$ (having values of ±1) flowing in the bit lines when the eight tunnel magnetoresistance devices are arranged along the write-in word line. That is, FIG. 30 shows a superimposition of the magnetic fields before equalization. FIG. 31 shows a superimposition of the magnetic fields generated by a random current $I_{BL}$ or current $-I_{BL}$ (having values of ±1), as a main magnetic field generating current $\pm g(0)\cdot I_{BL}$, flowing in the bit lines and by the first compensatory magnetic field generating currents $\pm g(\pm 1)\cdot I_{BL}$ flowing in the bit lines, in a case where one dummy line $DL_1$ is provided outside the first bit lines, one dummy line $DL_2$ is provided outside the eighth bit line and the eight tunnel magnetoresistance devices are arranged along the write-in word line. That is, FIG. 31 shows a case where an FIR filter of three taps is constituted. Further, FIG. 32 shows a case where an FIR filter of three taps is constituted without providing the dummy lines. From a comparison between FIG. 31 and FIG. 32, it is seen that providing dummy lines is not essential.

For writing data into the tunnel magnetoresistance device in the nonvolatile magnetic memory device in Example 5, first, the open/close circuit $SW_{RWL1}$ is brought into an ON-state, and a current $I_{RWL}$ is passed through (or flowed in) the first write-in word line $RWL_1$ from the write-in word line current source $RS_1$. And, for example, the currents shown in Table 6 are simultaneously passed through (or flowed in) the first to eighth bit lines $BL_1$ to $BL_8$. These procedures are consecutively repeated from the second write-in word line $RWL_2$ to the M-th-place write-in word line $RWL_M$.

In writing data into the tunnel magnetoresistance device in the nonvolatile magnetic memory device of Example 5, erroneous data writing into an adjacent tunnel magnetoresistance device can be reliably prevented.

EXAMPLE 6

Figure 33:
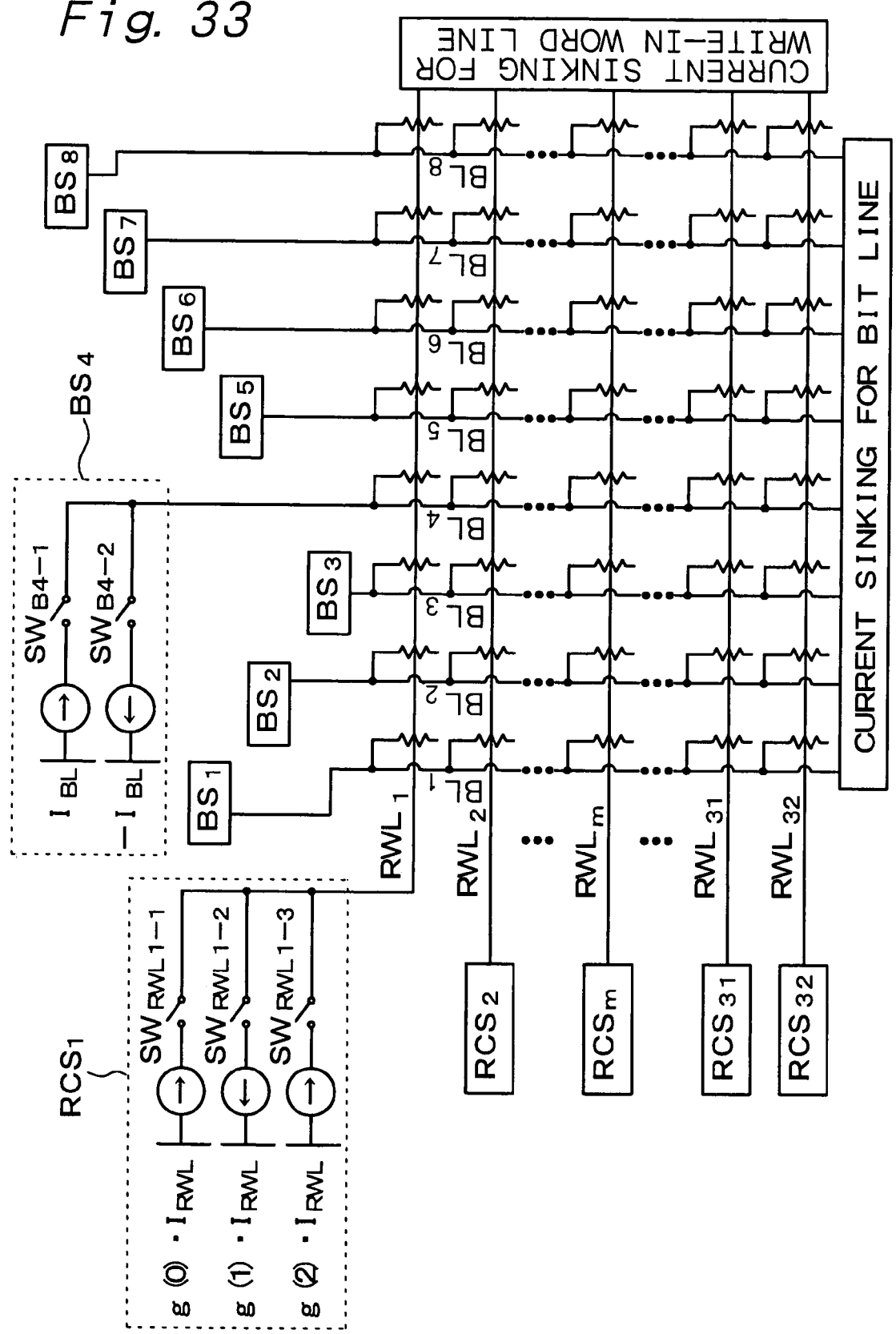
FIG. 33 is an equivalent circuit diagram of a nonvolatile magnetic memory device in Example 6.

Example 6 is concerned with the nonvolatile magnetic memory according to the second aspect of the present invention. FIG. 33 shows an equivalent circuit diagram of the nonvolatile magnetic memory device in Example 6.

As shown in FIG. 33, the nonvolatile magnetic memory device in Example 6 has a nonvolatile magnetic memory array comprising;

(A) write-in word lines $RWL_m$ that are M in number (m=1, 2, ... M, M≧2, and M=32 in Example 6), extending in a first direction, (B) bit line(s) $BL_n$ that is(are) N in number (n=1, 2, ... N, N≧1, and N=8 in Example 6), extending in a second direction different from the first direction, and (C) tunnel magnetoresistance devices TMJ that are N×M (=8×32) in number, as explained above, formed in the overlap region of the write-in word lines $RWL_m$ and the bit line $BL_n$.

When data is written into the tunnel magnetoresistance device $TMJ_{(m,n)}$ positioned in the overlap region of the m-th-place write-in word line $RWL_m$ (m is one of 1, 2, ... M) and the n-th-place bit line $BL_n$ (n is one of 1, 2, ... N), the current $I(n)_{BL}$ is passed through (or flowed in) the n-th-place bit line $BL_n$, and the current $g(0) \cdot I(m)_{RWL}$ [g(0): coefficient] is passed through (or flowed in) the m-th-place write-in word line $RWL_m$. Further, together with these, the current $g(k) \cdot I(m)_{RWL}$ [g(k):coefficient] is passed through (or flowed in) the p-th-place write-in word line $RWL_p$ (p=n+k, k represents ±1, ±2, ..., k in Example 6 represents a value of −2, −1, 1, 2, and the total number of the lines is K).

When the magnetic fields, which are supposed to be formed in the m-th-place write-in word line $RWL_m$ and the write-in word lines $RWL_p$ that are K in number by the currents $I(m)_{RWL}$, is assumed to be discrete pulse response, and when the coefficients g(0) and g(k) are assumed to be tap-gains, a spatial FIR filter is constituted of the m-th-place write-in word line $RWL_m$ and the write-in word lines $RWL_p$ that are K in number.

Further, the coefficients g(0) and g(k) are defined such that data is written into the tunnel magnetoresistance device $TMJ_{(m,n)}$ positioned in the overlap region of the m-th-place write-in word line $RWL_m$ and the n-th-place bit line $BL_n$ and data are not written into the tunnel magnetoresistance devices $TMJ_{(p,n)}$ positioned in the overlap regions of the n-th-place bit line $BL_n$ and the write-in word lines $RWL_p$ that are K in number by means of a synthetic magnetic field based on a magnetic field (main magnetic field) generated by the current $g(0) \cdot I(m)_{RWL}$ flowing in the m-th-place write-in word line $RWP_m$, magnetic fields (compensatory magnetic fields) generated by the currents $g(k) \cdot I(m)_{RWL}$ flowing in the write-in word lines $RWL_p$ that are K in number, and a magnetic field generated by the current $I(n)_{BL}$ flowing in the n-th-place bit line $BL_n$.

When the value of k represents ±1 and ±2 as examples, and when a simple model in FIG. 39 is used for approximation, the values of g(−2), g(−1), g(0), g(1) and g(2) when β=(h/d)=1.0 are as shown in Table 2.

The absolute value $k_0$ of the maximum value that k represents is 2. Further, the value of m and the value of K have a relationship as shown in the following Table 11.

TABLE 11

When m = 1, K = 2.
When m = 2, K = 3.
When 3 ≦ m ≦ (M − 2), K = 4.
When m = (M − 1), K = 3.
When m = M, K = 2.

Meanwhile, the value of g(−2) and the value of g(2) are the same, and the value of g(−1) and the value of g(1) are the same. In the following explanation, therefore, the current source for letting the $g(-1) \cdot I_{RWL}$ flow and the current source for letting the $g(1) \cdot I_{RWL}$ flow are constituted of one current source, and the current source for letting the $g(-2) \cdot I_{RWL}$ flow and the current source for letting the $g(2) \cdot I_{RWL}$ flow are constituted of one current source. This will be also applicable to Examples 7 to 10. Since the value of $I(m)_{RWL}$ is determined to be constant regardless of any value of m, it will be shown as $I_{RWL}$ hereinafter. Further, since the coefficient g(1) and the coefficient g(−1) have the same value, they will be shown as g(1) hereinafter, and since the coefficient g(2) and the coefficient g(−2) have the same value, they will be shown as g(2) hereinafter.

That is, each write-in word line $RWL_m$ is provided with a current source unit $RCS_m$ for letting the current $g(0) \cdot I(m)_{RWL}$, the current $g(1) \cdot I(m)_{RWL}$ and the current $g(2) \cdot I(n)_{RWL}$ flow in the write-in word line $RWL_m$.

Each current source unit $RCS_m$ is provided with open/close circuits $SW_{RWLm-i}$ (i=1, 2, 3) constituted of a MOS-type FET each, and one of three currents, the current $g(0) \cdot I_{RWL}$, the current $g(1) \cdot I_{RWL}$ and the current $g(2) \cdot I_{RWL}$, can be passed through (or flowed in) the write-in word line $RWL_m$ from the current source unit $RCS_m$ by the ON/OFF operation of the open/close circuits $SW_{RWLm-i}$. FIG. 33 shows the current source unit $RCS_1$ connected to the first write-in word line $RWL_1$, while other current source units $RCS_2$ to $RCS_{32}$ have the same constitution as that of the current source unit $RCS_1$.

The current $g(0) \cdot I_{RWL}$ is a current (to be sometimes referred to as "main magnetic field generating current $g(0) \cdot I_{RWL}$") for generating the magnetic field for writing data into the tunnel magnetoresistance devices that are N in number (tunnel magnetoresistance device $TMJ_{(m,1)}$–tunnel magnetoresistance devices $TMJ_{(m,N)}$) opposed to the m-th-place write-in word line $RWL_m$.

The current $g(1) \cdot I_{RWL}$ is a compensatory current (to be sometimes referred to as "first compensatory magnetic field generating current $g(^1) \cdot I_{RWL}$") for generating the compensatory magnetic field for preventing the destruction of data stored in the tunnel magnetoresistance device (tunnel magnetoresistance device $TMJ_{(m,1)}$–tunnel magnetoresistance device $TMJ_{(m,N)}$) opposed to the m-th-place write-in word line $RWL_m$, which destruction is caused by the magnetic field generated as a result of the flowing of the main magnetic field generating current $g(0) \cdot I_{RWL}$ in the write-in word line $RWL_m$, when data are written into the tunnel magnetoresistance devices (tunnel magnetoresistance device $TMJ_{(m',1)}$–tunnel magnetoresistance device $TMJ_{(m',N)}$) opposed to the write-in word line $RWL_{m'}$ [m'=m±1, and 2≦m'≦(M−1)] adjacent to the m-th-place write-in word line $RWL_m$.

Further, the current $g(2) \cdot I_{RWL}$ is a compensatory current (to be sometimes referred to as "second compensatory magnetic field generating current $g(2) \cdot I_{RWL}$") for generating the compensatory magnetic field for preventing the destruction of data stored in the tunnel magnetoresistance device (tunnel magnetoresistance device $TMJ_{(m,1)}$–tunnel magnetoresistance device $TMJ_{(m,N)}$) opposed to the m-th-place write-in word line $RWL_m$, which destruction is caused by the magnetic field generated as a result of the flowing of the main magnetic field generating current $g(0) \cdot I_{RWL}$ in the write-in word line $RWL_{m''}$ when data are written into the tunnel magnetoresistance devices (tunnel magnetoresistance device $TMJ_{(m,1)}$–tunnel magnetoresistance device $TMJ_{(m'',N)}$) opposed to the write-in word line $RWL_{m''}$ [m''=n±2, and 3≦m''≦(M−2)] adjacent to the m-th-place write-in word line $RWL_m$.

That is, when the main magnetic field generating current $g(0) \cdot I_{RWL}$ flows in the adjacent write-in word line $RWL_{m'}$, the first compensatory magnetic field generating current $g(1) \cdot I_{RWL}$ is passed through (or flowed in) the m-th-place write-in word line $RWL_m$. Further, when the main magnetic field generating current $g(0) \cdot I_{RWL}$ flows in the adjacent write-in word line $RWL_{m''}$, the second compensatory magnetic field generating current $g(2) \cdot I_{RWL}$ is passed through (or flowed in) the m-th-place write-in word line $RWL_m$. When it is not required to write data into the tunnel magnetoresistance device TMJ, no current is passed through (or flowed in) any write-in word line.

The bit line $BL_n$ is connected to the bit line current source $BS_n$ through an open/close circuit $SW_{Bn-i}$ (i=1, 2) constituted of a MOS-type FET. When the open/close circuit $SW_{Bn-i}$ is in an ON-state, the current $I(n)_{BL}$ (specifically, current $I_{BL}$ or current $-I_{BL}$) flows in the bit line $BL_n$.

In the nonvolatile magnetic memory device in Example 6, when data is written into the tunnel magnetoresistance device TMJ, the open/close circuit $SW_{B1-i}$ is brought into an ON-state, to flow the current $I(1)_{BL}$ from the bit line current source $BS_1$ to the first bit line $BL_1$. And, the main magnetic field generating current $g(0) \cdot I_{RWL}$ is passed through (or flowed in) the first write-in word line $RWL_1$, the first compensatory magnetic field generating current $g(1) \cdot I_{RWL}$ is passed through (or flowed in) the second write-in word line $WRL_2$, and the second compensatory magnetic field generating current $g(2) \cdot I_{RWL}$ is passed through (or flowed in) the third write-in word line $WRL_3$. These procedures are consecutively repeated from the second bit line $BL_2$ to the N-th-place bit line $BL_N$.

Then, again, the current $I(1)_{BL}$ is passed through (or flowed in) the first bit line $BL_1$ from the bit line current source $BS_1$. And, the main magnetic field generating current $g(0) \cdot I_{RWL}$ is passed through (or flowed in) the second write-in word line $RWL_2$, the first compensatory magnetic field generating currents $g(1) \cdot I_{RWL}$ are passed through (or flowed in) the first write-in word line $RWL_1$ and the third write-in word line $RWL_3$, and the second compensatory magnetic field generating current $g(2) \cdot I_{RWL}$ is passed through (or flowed in) the fourth write-in word line $RWL_4$. These procedures are consecutively repeated from the second bit line $BL_2$ to the N-th-place bit line $BL_N$.

Further, again, the current $I(1)_{BL}$ is passed through (or flowed in) the first bit line $BL_1$ from the bit line current source $BS_1$. And, the main magnetic field generating current $g(0) \cdot I_{RWL}$ is passed through (or flowed in) the third write-in word line $RWL_3$, the first compensatory magnetic field generating currents $g(1) \cdot I_{RWL}$ are passed through (or flowed in) the second write-in word line $RWL_2$ and the fourth write-in word line $RWL_4$, and the second compensatory magnetic field generating currents $g(2) \cdot I_{RWL}$ are passed through (or flowed in) the first write-in word line $RWL_1$ and the fifth write-in word line $RWL_5$. These procedures are consecutively repeated from the second bit line $BL_2$ to the N-th-place bit line $BL_N$. Further, these procedures are consecutively repeated from the fourth write-in word line $RWL_4$ to the (M−2)-th-place write-in word line $RWL_{M-2}$.

Then, again, the current $I(1)_{BL}$ is passed through (or flowed in) the first bit line $BL_1$ from the bit line current source $BS_1$. And, the main magnetic field generating current $g(0) \cdot I_{RWL}$ is passed through (or flowed in) the (M−1)-th-place write-in word line $RWL_{M-1}$, the first compensatory magnetic field generating currents $g(1) \cdot I_{RWL}$ are passed through (or flowed in) the (M−2)-th-place write-in word line $RWL_{M-2}$ and the M-th-place write-in word line $RWL_M$, and the second compensatory magnetic field generating current $g(2) \cdot I_{RWL}$ is passed through (or flowed in) the (M−3)-th-place write-in word line $RWL_{M-3}$. These procedures are consecutively repeated from the second bit line $BL_2$ to the N-th-place bit line $BL_N$.

Further, again, the current $I(1)_{BL}$ is passed through (or flowed in) the first bit line $BL_1$ from the bit line current source $BS_1$. And, the main magnetic field generating current $g(0) \cdot I_{RWL}$ is passed through (or flowed in) the M-th-place write-in word line $RWL_M$, the first compensatory magnetic field generating current $g(1) \cdot I_{RWL}$ is passed through (or flowed in) the (M−1)-th-place write-in word line $RWL_{M-1}$, and the second compensatory magnetic field generating current $g(2) \cdot I_{RWL}$ is passed through (or flowed in) the (M−2)-th-place write-in word line $RWL_{M-2}$. These procedures are consecutively repeated from the second bit line $BWL_2$ to the N-th-place bit line $BL_N$.

The above-explained operation is give as an example and may be modified as required. In Examples 7 to 10, further, data can be written into the tunnel magnetoresistance devices that are M×N in number substantially by the same method.

[Writing of Data into Tunnel Magnetoresistance Device $TMJ_{(4,4)}$]

A case of writing data into the tunnel magnetoresistance device $TMJ_{(4,4)}$ connected to the fourth bit line $BL_4$ and positioned in the overlap region of the fourth bit line $BL_4$ and the fourth write-in word line $RWL_4$ (opposed to the fourth write-in word line $RWL_4$) will be explained below as an example.

Immediately before data is written, all of the open/close circuits $SW_{Bn-i}$ (n=1, 2, . . . N) are in an OFF-state. For starting the writing of data, the open/close circuit $SW_{B4-i}$ is brought into an ON-state, whereby the current $I(4)_{BL}$ is passed through (or flowed in) the fourth bit line $BL_4$ from the bit line current source $BS_4$. In the current source unit $RCS_4$, the open/close circuit $SW_{RWLm-j}$ (m=4, j=1) is selected to come into an ON-state, whereby the main magnetic field generating current $g(0) \cdot I_{RWL}$ flows in the fourth write-in word line $RWL_4$.

In the current source unit $RCS_3$ and the current source unit $RCS_5$, the open/close circuits $SW_{RWLm-j}$ (m=3 and 5, j=2) are selected to come into an ON-state, whereby the first compensatory magnetic field generating currents $g(1) \cdot I_{RWL}$ flow in the third write-in word line $RWL_3$ and the fifth write-in word line $RWL_5$.

In the current source unit $RCS_2$ and the current source unit $RCS_6$, the open/close circuits $SW_{RWLm-j}$ (m=2 and 6, j=3) are selected to come into an ON-state, whereby the second compensatory magnetic field generating currents $g(2) \cdot I_{RWL}$ flow in the second write-in word line $RWL_2$ and the sixth write-in word line $RWL_6$.

By the synthetic field generated as the result of the above [synthetic magnetic field of (1) the magnetic field generated by the main magnetic field generating current $g(0) \cdot I_{RWL}$ flowing in the fourth write-in word line $RWL_4$; (2) the magnetic fields generated by the first compensatory magnetic field generating currents $g(^1) \cdot I_{RWL}$ flowing in the third and fifth write-in word lines $RWL_3$ and $RWL_5$; (3) the magnetic fields generated by the second compensatory magnetic field generating currents $g(2) \cdot I_{RWL}$ flowing in the second and sixth write-in word lines $RWL_2$ and $RWL_6$; and (4) the magnetic field generated by the current $I(4)_{BL}$ flowing in the fourth bit line $BL_4$], the magnetization direction of the second ferromagnetic layer (memory layer) 35 in the tunnel magnetoresistance device $TMJ_{(4,4)}$ is changed, to record "1" or "0" in the second ferromagnetic layer (memory layer) 35. On the other hand, the magnetization direction of the second ferromagnetic layer (memory layer) 35 of each of the tunnel magnetoresistance devices $TMJ_{(2,4)}$, $TMJ_{(3,4)}$, $TMJ_{(5,4)}$ and $TMJ_{(6,4)}$ remains unchanged by the above synthetic magnetic field.

The values of the current $\pm I_{BL}$ and the current $I_{RWL}$ are determined beforehand such that the synthetic magnetic field in the second ferromagnetic layer (memory layer) 35 of the tunnel magnetoresistance device $TMJ_{(4,4)}$ has a value included in the region $(OUT_1)$ in the asteroid curve shown in FIG. 38, and that the synthetic magnetic field in the second ferromagnetic layer (memory layer) 35 of each of the tunnel magnetoresistance devices $TMJ_{(2,4)}$, $TMJ_{(3,4)}$, $TMJ_{(5,4)}$ and $TMJ_{(6,4)}$ has a values included in the region (IN) in the asteroid curve shown in FIG. 38.

There may be employed a constitution in which the magnetic field ($H_{EA}$) in the easy-magnetization axis direction of the memory layer 35 is generated by the main magnetic field generating current $g(0) \cdot I_{RWL}$ flowing in the write-in word line, and the magnetic field ($H_{HA}$) in the hard-magnetization direction of the memory layer 35 is generated by the current $\pm I_{BL}$ flowing in the bit line, or there may be employed a constitution in which the magnetic field ($H_{HA}$) in the hard-magnetization direction of the memory layer 35 is generated by the main magnetic field generating current $g(0) \cdot I_{RWL}$ flowing in the write-in word line, and the magnetic field ($H_{EA}$) in the easy-magnetization axis direction of the memory layer 35 is generated by the current $\pm I_{BL}$ flowing in the bit line. The above is also applicable to Examples 7 to 10 to be described later.

[Writing of Data into Tunnel Magnetoresistance Device $TMJ_{(m,n)}$]

When data is written into the tunnel magnetoresistance device $TMJ_{(m,n)}$ opposed to the m-th-place write-in word line $RWL_m$ [m=3, 4, ... (M−3), (M−2)] and positioned in the overlap region of the m-th-place write-in word line $RWL_m$ and the n-th-place bit line $BL_n$ (electrically connected to the n-bit line $BL_n$), the following operation is carried out.

Immediately before data is written, all of the open/close circuits $SW_{Bn-1}$ (n=1, 2, ... N) are in an OFF-state. For starting the writing of data, the open/close circuit $SW_{Bn-i}$ is brought into an ON-state, whereby the current $I(n)_{BL}$ is passed through (or flowed in) the n-th-place bit line $BL_n$ from the bit line current source $BS_n$. In the current source unit $RCS_m$, the open/close circuit $SW_{RWLm-1}$ is selected to come into an ON-state, whereby the main magnetic field generating current $g(0) \cdot I_{RWL}$ flows in the m-th-place write-in word line $RWL_m$.

In the current source unit $RCS_{m-1}$ and the current source unit $RCS_{m+1}$, the open/close circuits $SW_{RWLm'-2}$ [m'=(m−1) and (m+1)] are selected to come into an ON-state, whereby the first compensatory magnetic field generating currents $g(1) \cdot I_{RWL}$ flow in the (m−1)-th-place write-in word line $RWL_{m-1}$ and the (m+1)-th-place write-in word line $RWL_{m+1}$.

Further, in the current source unit $RCS_{m-2}$ and the current source unit $RCS_{m+2}$, the open/close circuits $SW_{RWLm''-3}$ [m''=(m−2) and (m+2)] are selected to come into an ON-state, whereby the second compensatory magnetic field generating currents $g(2) \cdot I_{RWL}$ flow in the (m−2)-th-place write-in word line $RWL_{m-2}$ and the (m+1)-th-place write-in word line $RWL_{m+2}$.

[Writing of Data into Tunnel Magnetoresistance Device $TMJ_{(1,n)}$ or $TMJ_{(M,n)}$]

When data is written into the tunnel magnetoresistance device $TMJ_{(P,n)}$ opposed to the P-th-place write-in word line $RWL_P$ [P=1 or M] and electrically connected to the n-th-place bit line $BL_n$, the following operation is carried out.

Immediately before data is written, all of the open/close circuits $SW_{Bn-1}$ (n=1, 2, ... N) are in an OFF-state. For starting the writing of data, the open/close circuit $SW_{Bn-i}$ is brought into an ON-state, whereby the current $I(n)_{BL}$ is passed through (or flowed in) the n-th-place bit line $BL_n$ from the bit line current source $BS_n$. In the current source unit $RCS_p$, the open/close circuit $SW_{RWLP-1}$ is selected to come into an ON-state, whereby the main magnetic field generating current $g(0) \cdot I_{RWL}$ flows in the P-th-place write-in word line $RWL_P$.

In the current source unit $RCS_2$ or the current source unit $RCS_{M-1}$, the open/close circuit $SW_{RWLP'-2}$ [P'=2 or (M−1)] is selected to come into an ON-state, whereby the first compensatory magnetic field generating current $g(1) \cdot I_{RWL}$ flows in the second write-in word line $RWL_2$ or the (M−1)-th-place write-in word line $RWL_{M-1}$.

Further, in the current source unit $RCS_3$ or the current source unit $RCS_{M-2}$, the open/close circuit $SW_{RWLP''-3}$ [P''=3 or (M−2)] is selected to come into an ON-state, whereby the second compensatory magnetic field generating current $g(2) \cdot I_{RWL}$ flows in the third write-in word line $RWL_3$ or the (M−2)-th-place write-in word line $RWL_{M-2}$.

[Writing of Data into Tunnel Magnetoresistance Device $TMJ_{(2,n)}$ or $TMJ_{(M-1,n)}$]

When data is written into the tunnel magnetoresistance device $TMJ_{(P,n)}$ opposed to the P-th-place write-in word line $RWL_P$ [P=2 or (M−1)] and electrically connected to the n-th-place bit line $BL_n$, the following operation is carried out.

Immediately before data is written, all of the open/close circuits $SW_{Bn-1}$ (n=1, 2, ... N) are in an OFF-state. For starting the writing of data, the open/close circuit $SW_{Bn-i}$ is brought into an ON-state, whereby the current $I(n)_{BL}$ is passed through (or flowed in) the n-th-place bit line $BL_n$ from the bit line current source $BS_n$. In the current source unit $RCS_P$, the open/close circuit $SW_{RWLP-1}$ is selected to come into an ON-state, whereby the main magnetic field generating current $g(0) \cdot I_{RWL}$ flows in the P-th-place write-in word line $RWL_P$.

In the current source unit $RCS_1$ and the current source unit $RCS_3$, or in the current source unit $RCS_{M-2}$ and the current source unit $BCS_M$, the open/close circuits $SW_{RWLP'-2}$ [P'=1 and 3, or P'=(M−2) or M] are selected to come into an ON-state, whereby the first compensatory magnetic field generating currents $g(1)·I_{RWL}$ flow in the first write-in word line $RWL_1$ and the third write-in word line $RWL_3$, or in the (M−2)-th-place write-in word line $RWL_{M-2}$ and the M-th-place write-in word line $RWL_M$.

Further, in the current source unit $RCS_4$ or the current source unit $RCS_{M-3}$, the open/close circuit $SW_{RWLP''-2}$ [P''=4 or (M−3)] is selected to come into an ON-state, whereby the second compensatory magnetic field generating current $g(2)·I_{RWL}$ flows in the fourth write-in word line $RWL_4$ or the (M−3)-th-place write-in word line $RWL_{M-3}$.

In the nonvolatile magnetic memory device in Example 6, when data is written into the tunnel magnetoresistance device $TMJ_{(m,n)}$, the main magnetic field generating current $g(0)·I_{RWL}$ is passed through (or flowed in) the write-in word line $RWL_m$ from the current source unit $RCS_m$, and the compensatory magnetic field generating currents $g(2)·I_{RWL}$, $g(1)·I_{RWL}$, $g(1)·I_{RWL}$ and $g(2)·I_{RWL}$ are passed through (or flowed in) the write-in word lines $RWL_{m-2}$, $RWL_{m-1}$, $RWL_{m+1}$ and $RWL_{m+2}$ from the current source units $RCS_{m-2}$, $RCS_{m-1}$, $RCS_{m+1}$, and $RCS_{m+2}$. As a result, the destruction of data stored in the tunnel magnetoresistance devices $TMJ_{(m-2,n)}$, $TMJ_{(m-1,n)}$, $TMJ_{(m+1,n)}$ and $TMJ_{(m+2,n)}$ opposed to the write-in word lines $RWL_{m-2}$, $RWL_{m-1}$, $RWL_{m+1}$ and $RWL_{m+2}$ can be reliably prevented.

EXAMPLE 7

Figure 34:
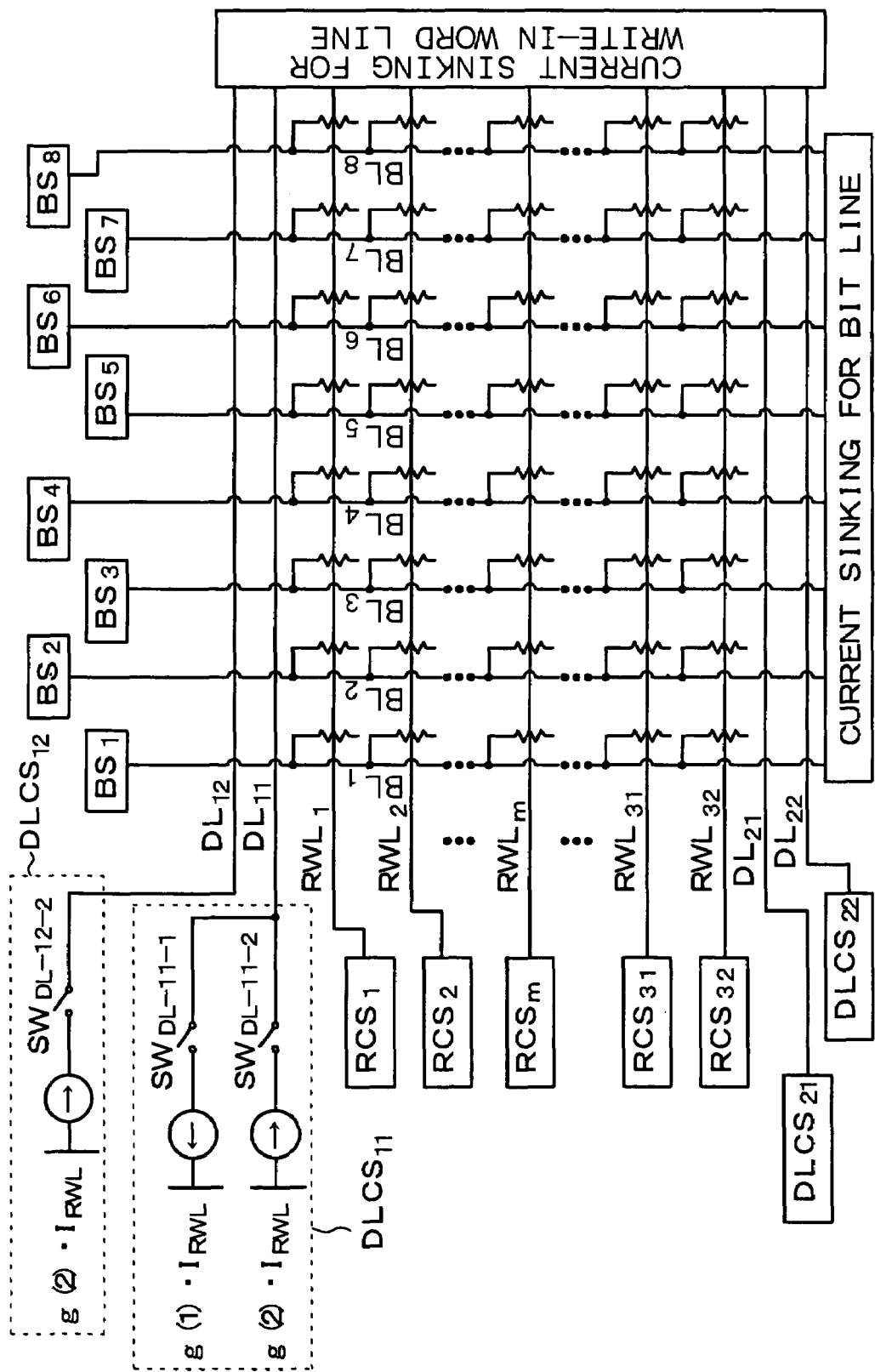
FIG. 34 is an equivalent circuit diagram of a nonvolatile magnetic memory device in Example 7.

Example 7 is a variant of Example 6. FIG. 34 shows an equivalent circuit diagram of a nonvolatile magnetic memory device in Example 7.

In the nonvolatile magnetic memory device explained in Example 6, for example, the main magnetic field is generated by the current flowing in the first write-in word line $RWL_1$ or the M-th-place write-in word line $RWL_M$ [magnetic field generated by the current $g(0)·I(1)_{RWL}$ or current $g(0)·I(M)_{RWL}$], and the compensatory magnetic fields are generated by the currents flowing in the second and third write-in word lines $RWL_2$ and $RWL_3$ or by the currents flowing in the (M−2)-th-place and (M−1)-th-place write-in word lines $RWL_{(M-2)}$ and $RWL_{(M-1)}$ [magnetic fields generated by the current $g(1)·I(1)_{RWL}$ and the current $g(2)·I(1)_{RWL}$, or the current $g(-2)·I(M)_{RWL}$ and $g(-1)·I(M)_{RWL}$], while these compensatory magnetic fields become asymmetric, for example, with regard to the first write-in word line $RWL_1$ or the M-th-place write-in word line $RWL_M$ as a base.

In the nonvolatile magnetic memory device in Example 7, therefore, when the absolute value of the maximum value that k represents is $k_0$ ($k_0=2$ in Example 7), a group of first dummy lines that are $k_0$ in number (first dummy lines $DL_{11}$ and $DL_{12}$) is provided outside the first write-in word line $RWL_1$ and in parallel with the first write-in word line $RWL_1$, a group of second dummy lines that are $k_0$ in number (second dummy lines $DL_{21}$ and $DL_{22}$) is provided outside the M-th-place write-in word line $RWL_M$ and in parallel with the M-th-place write-in word line $RWL_M$, and a current $g(k)·I(m)_{RWL}$ is passed through (or flowed in) the [(1−m)+|k|]-th-place first dummy line constituting the group of the first dummy lines or the [m−M+|k|]-th-place second dummy line constituting the group of the second dummy lines.

Specifically, when the main magnetic field generating current $g(0)·I_{RWL}$ is passed through (or flowed in) the first write-in word line $RWL_1$, the first compensatory magnetic field generating current $g(-1)·I_{RWL}$ is passed through (or flowed in) the [(1−m)+|k|]-th-place first dummy line $DL_{11}$ (m=1, k=−1, first-place first dummy line) constituting the group of the first dummy lines, and the second compensatory magnetic field generating current $g(-2)·I_{RWL}$ is passed through (or flowed in) the [(1−m)+|k|]-th-place first dummy line $DL_{12}$ (m=1, k=−2, and second-place first dummy line) constituting the group of the first dummy lines. Further, when the main magnetic field generating current $g(0)·I_{RWL}$ is passed through (or flowed in) the second write-in word line $RWL_2$, the second compensatory magnetic field generating current $g(-2)·I_{RWL}$ is passed through (or flowed in) the [(1−m)+|k|]-th-place first dummy line $DL_{11}$ (m=2, k=−2, first-place first dummy line) constituting the group of the first dummy lines.

When the main magnetic field generating current $g(0)·I_{RWL}$ is passed through (or flowed in) the M-th-place write-in word line $RWL_M$, the first compensatory magnetic field generating current $g(1)·I_{RWL}$ is passed through (or flowed in) the [m−M+|k|]-th-place second dummy line $DL_{21}$ (m=M, k=1, first-place second dummy line) constituting the group of the second dummy lines, and the second compensatory magnetic field generating current $g(2)·I_{RWL}$ is passed through (or flowed in) the [m−M+|k|]-th-place second dummy line $DL_{22}$ (m=M, k=2, and second-place second dummy line) constituting the group of the second dummy lines. Further, when the main magnetic field generating current $g(0)·I_{RWL}$ is passed through (or flowed in) the (M−1)-th-place write-in word line $RWL_{M-1}$, the second compensatory magnetic field generating current $g(2)·I_{RWL}$ is passed through (or flowed in) the [m−M+|k|]-th-place second dummy line $DL_{21}$ (m=M−1, k=2, first-place second dummy line) constituting the group of the second dummy lines.

The first-place first dummy line $DL_{11}$ constituting the group of the first dummy lines is connected to a first dummy line current source $DLCS_{11}$, the second-place first dummy line $DL_{12}$ constituting the group of the first dummy lines is connected to a first dummy line current source $DLCS_{12}$, the first-place second dummy line $DL_{21}$ constituting the group of the second dummy lines is connected to a second dummy line current source $DLCS_{21}$, and the second-place second dummy line $DL_{22}$ constituting the group of the second dummy lines is connected to a second dummy line current source $DLCS_{22}$.

The first dummy line current source $DLCS_{11}$ is provided with an open/close circuit $SW_{DL-11-j}$ (j=1, 2) constituted of a MOS-type FET, and by the ON/OFF operation of the open/close circuit $SW_{DL-11-j}$, one of two currents, the current $g(1)·I_{RWL}$ and the current $g(2)·I_{RWL}$, can be passed through (or flowed in) the first-place first dummy line $DL_{11}$ constituting the group of the first dummy lines from the first dummy line current source $DLCS_{11}$. The second dummy line current source $DLCS_{21}$ is provided with an open/close circuit $SW_{DL-21-j}$ (j=1, 2) constituted of a MOS-type FET, and by the ON/OFF operation of the open/close circuit $SW_{DL-21-j}$, one of two currents, the current $g(1)·I_{RWL}$ and the current $g(2)·I_{RWL}$ can be passed through (or flowed in) the first-place second dummy line $DL_{21}$ constituting the group of the second dummy lines from the second dummy line current source $DLCS_{21}$.

Further, the first dummy line current source $DLCS_{12}$ is provided with an open/close circuit $SW_{DL-12-2}$ constituted of a MOS-type FET, and by the ON/OFF operation of the open/close circuit $SW_{DL-12-2}$, the current $g(2)·I_{RWL}$ can be passed through (or flowed in) the second-place first dummy line $DL_{12}$ constituting the group of the first dummy lines from the first dummy line current source $DLCS_{12}$. The second dummy line current source $DLCS_{22}$ is provided with an open/close circuit $SW_{DL-22-2}$ constituted of a MOS-type FET, and by the ON/OFF operation of the open/close circuit $SW_{DL-22-2}$, the current $g(2) \cdot I_{RWL}$ can be passed through (or flowed in) the second-place second dummy line $DL_{22}$ constituting the group of the second dummy lines from the second dummy line current source $DLCS_{22}$.

The constitution, structure and operation of the nonvolatile magnetic memory device in Example 7 can be the same as those of the nonvolatile magnetic memory device in Example 6 except for the above points, so that a detailed explanation thereof will be omitted. The values of the coefficients $g(1)$, $g(-1)$, $g(2)$ and $g(-2)$ can be determined so as to be the same as those in Example 7.

In the nonvolatile magnetic memory device in Example 7, the compensatory magnetic field for preventing the destruction of data stored in the tunnel magnetoresistance device becomes symmetric with regard to the first write-in word line $RWL_1$, the second write-in word line $RWL_2$, the $(M-1)$-th-place write-in word line $RWL_{M-1}$ or the M-th-place write-in word line $RWL_M$ as a base, so that the operation of writing data into the nonvolatile magnetic memory device is more stabilized.

EXAMPLE 8

Figure 35:
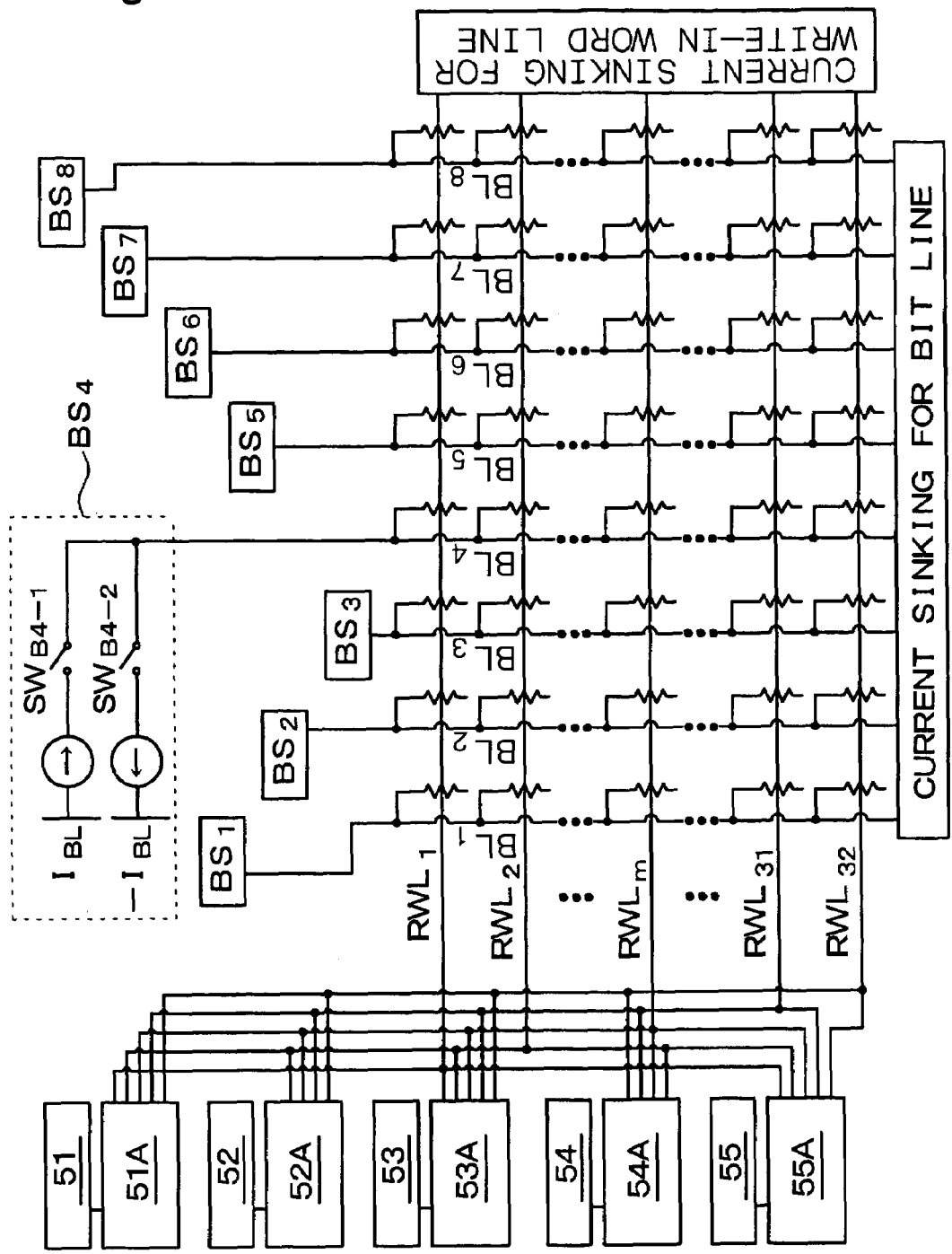
FIG. 35 is an equivalent circuit diagram of a nonvolatile magnetic memory device in Example 8.
Figure 36:
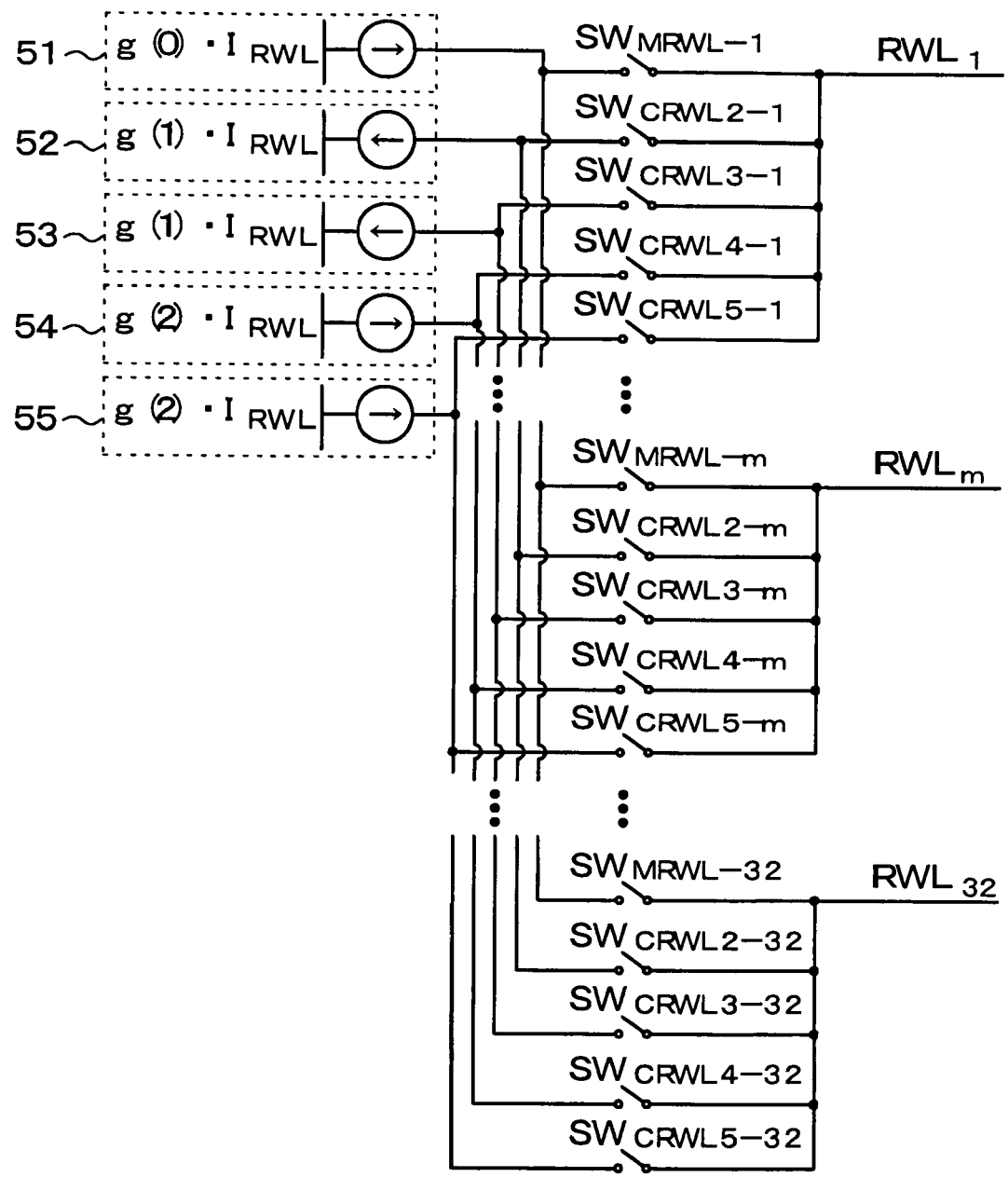
FIG. 36 shows equivalent circuit diagrams of a first current source unit and a first switching circuit, a second current source unit and a second switching circuit, a third current source unit and a third switching circuit, a fourth current source unit and a fourth switching circuit, and a fifth current source unit and a fifth switching circuit in the nonvolatile magnetic memory device in Example 8.

Example 8 is also a variant of Example 6. FIG. 35 shows an equivalent circuit diagram of a nonvolatile magnetic memory device in Example 8. FIG. 36 shows an equivalent circuit diagram of a first current source unit 51 and a first switch circuit 51A, a second current source unit 52 and a second switch circuit 52A, a third current source unit 53 and a third switch circuit 53A, a fourth current source unit 54 and a fourth switch circuit 54A, and a fifth current source unit 55 and a fifth switch circuit 55A in the nonvolatile magnetic memory device in Example 8.

In Example 8, the current source is not constituted of the current source units that are N in number, but instead constituted of the first current source unit 51, the second current source unit 52, the third current source unit 53, the fourth current source unit 54 and the fifth current source unit 55. The first current source unit 51 for letting the main magnetic field generating current $g(0) \cdot I_{RWL}$ flow in the write-in word line $RWL_m$ is connected to the write-in word lines $RWL_m$ that are M in number through the first switch circuit 51A (constituted of open/close circuits $SW\ SW_{MRWL-1}$–$SW_{MRL-32}$ constituted of a MOS-type FET each). The second current source unit 52 and the third current source unit 53 for letting the first compensatory magnetic field generating current $g(1) \cdot I_{RWL}$ flow in the write-in word lines $RWL_m$ are connected to the write-in word lines $RWL_m$ that are M in number through the second switch circuit 52A (constituted of open/close circuits $SW\ SW_{CRWL2-1}$–$SW_{CRWL2-32}$ constituted of a MOS-type FET each) and the third switch circuit 53A (constituted of open/close circuits $SW\ SW_{CRWL3-1}$–$SW_{CRWL3-32}$ constituted of a MOS-type FET each). Further, the fourth current source unit 54 and the fifth current source unit 55 for letting the second compensatory magnetic field generating current $g(2) \cdot I_{RWL}$ flow in the write-in word lines $RWL_m$ are connected to the write-in word lines $RWL_m$ that are M in number through the fourth switch circuit 54A (constituted of open/close circuits $SW\ SW_{CRWL4-1}$–$SW_{CRWL4-32}$ constituted of a MOS-type FET each) and the fifth switch circuit 54A (constituted of open/close circuits $SW\ SW_{CRWL5-1}$–$SW_{CRWL5-32}$ constituted of a MOS-type FET each).

The constitution, structure and operation of the nonvolatile magnetic memory device in Example 8 can be the same as those of the nonvolatile magnetic memory device in Example 6 except for the above points, so that a detailed explanation thereof will be omitted. In Example 8, the above constitution is employed, so that the number of the current source units can be decreased, and that the constitution of the nonvolatile magnetic memory device can be simplified.

[Writing of Data into Tunnel Magnetoresistance Device $TMJ_{(m,n)}$]

When data is written into the tunnel magnetoresistance device $TMJ_{(m,n)}$ opposed to the m-th-place write-in word line $WRL_m$ [m=3, 4, ... (M-2)] and electrically connected to the n-th-place bit line $BL_n$, the following operation is carried out.

Immediately before data is written, all of the open/close circuits $SW_{Bn-i}$ (n=1, 2, ... N) are in an OFF-state. For starting the writing of data, the open/close circuit $SW_{Bn-i}$ is brought into an ON-state, whereby the current $I(n)_{BL}$ is passed through (or flowed in) the n-th-place bit line $BL_n$ from the bit line current source $BS_n$. In the first current source unit 51, the open/close circuit $SW_{MRWL-m}$ constituted of a MOS-type FET constituting the first switch circuit 51A is selected to come into an ON-state, whereby the main magnetic field generating current $g(0) \cdot I_{RWL}$ flows in the m-th-place write-in word line $RWL_m$.

In the second current source unit 52, the open/close circuit $SW_{CRWL-2(m-1)}$ constituting the second switch circuit 52A is selected to come into an ON-state. In the third current source unit 53, the open/close circuit $SW_{CRWL3-(m+1)}$ constituting the third switch circuit 53A is selected to come into an ON-state, whereby the first compensatory magnetic field generating currents $g(1) \cdot I_{RWL}$ flow in the (m-1)-th-place write-in word line $RWL_{m-1}$ and the (m+1)-th-place write-in word line $RWL_{m+1}$. Further, in the fourth current source unit 54, the open/close circuit $SW_{CRWL4-(m-2)}$ constituting the fourth switch circuit 54A is selected to come into an ON-state, and in the fifth current source unit 55, the open/close circuit $SW_{CRWL5-(m+2)}$ constituting the fifth switch circuit 55A is selected to come into an ON-state, whereby the second compensatory magnetic field generating currents $g(2) \cdot I_{RWL}$ flow in the (m-2)-th-place write-in word line $RWL_{m-2}$ and the (m+2)-th-place write-in word line $RWL_{m+2}$.

By the synthetic magnetic field generated as the result of the above (synthetic magnetic field of (1) the magnetic field generated by the main magnetic field generating current $g(0) \cdot I_{RWL}$ flowing in the m-th-place write-in word line $RWL_m$; (2) the magnetic fields generated by the first compensatory magnetic field generating currents $g(1) \cdot I_{RWL}$ flowing in the (m-1)-th-place and (m+1)-th-place write-in word lines $RWL_{m-1}$ and $RWL_{m+1}$; (3) the magnetic fields generated by the second compensatory magnetic field generating currents $g(2) \cdot I_{RWL}$ flowing in the (m-2)-th-place and (m+2)-th-place write-in word line $RWL_{m-2}$ and $RWL_{m+2}$; and (4) the magnetic field generated by the current $I(n)_{BL}$ flowing in the n-th-place bit line $BL_n$], the magnetization direction of the second ferromagnetic layer (memory layer) 35 in the tunnel magnetoresistance device $TMJ_{(m,n)}$ is changed, to record "1" or "0" in the second ferromagnetic layer (memory layer) 35. On the other hand, the magnetization direction of the second ferromagnetic layer (memory layer) 35 of each of the tunnel magnetoresistance devices $TMJ_{(m-2,n)}$, $TMJ_{(m-1,n)}$, $TMJ_{(m+1,n)}$ and $TMJ_{(m+2,n)}$ remains unchanged by the above synthetic magnetic field.

[Writing of Data into Tunnel Magnetoresistance Device $TMJ_{(1,n)}$ or $TMJ_{(M,n)}$]

When data is written into the tunnel magnetoresistance device $TMJ_{(P,n)}$ opposed to the P-th-place write-in word line RWL$_P$ [P=1 or M] and electrically connected to the n-th-place bit line BL$_n$, the following operation is carried out.

Immediately before data is written, all of the open/close circuits SW$_{Bn-i}$ (i=1, 2, . . . N) are in an OFF-state. For starting the writing of data, the open/close circuit SW$_{Bn-i}$ is brought into an ON-state, whereby the current I(n)$_{BL}$ is passed through (or flowed in) the n-th-place bit line BL$_n$ from the bit line current source BS$_n$. In the first current source unit 51, the open/close circuit SW$_{MRWL-P}$ constituted of a MOS-type FET constituting the first switch circuit 51A is selected to come into an ON-state, whereby the main magnetic field generating current g(0)·I$_{RWL}$ flows in the P-th-place write-in word line RWL$_P$.

In the second current source unit 52, the open/close circuit SW$_{CRWL2-(M-1)}$ constituting the second switch circuit 52A is selected to come into an ON-state or the open/close circuit SW$_{CRWL3-2}$ constituting the third switch circuit 53A is selected to come into an ON-state, whereby the first compensatory magnetic field generating current g(1)·I$_{RWL}$ flows in the second write-in word line RWL$_2$ or the (M−1)-th-place write-in word line RWL$_{M-1}$. Further, the open/close circuit SW$_{CRWL4-(M-2)}$ constituting the fourth switch circuit 54A is selected to come into an ON-state, or the open/close circuit SW$_{CRWL5-3}$ constituting the fifth switch circuit 55A is selected to come into an ON-state, whereby the second compensatory magnetic field generating current g(2)·I$_{RWL}$ flows in the third write-in word line RWL$_3$ or the (M−2)-th-place write-in word line RWL$_{M-2}$.

[Writing of Data into Tunnel Magnetoresistance Device TMJ$_{(2,n)}$ or TMJ$_{(M-1,n)}$]

When data is written into the tunnel magnetoresistance device TMJ$_{(P,n)}$ opposed to the P-th-place write-in word line RWL$_P$ [P=2 or (M−1)] and electrically connected to the n-th-place bit line BL$_n$, the following operation is carried out.

Immediately before data is written, all of the open/close circuits SW$_{Bn-i}$ (i=1, 2, . . . N) are in an OFF-state. For starting the writing of data, the open/close circuit SW$_{Bn-i}$ is brought into an ON-state, whereby the current I(n)$_{BL}$ is passed through (or flowed in) the n-th-place bit line BL$_n$ from the bit line current source BS$_n$. In the first current source unit 51, the open/close circuit SW$_{MRWL-P}$ constituting the first switch circuit 51A is selected to come into an ON-state.

In the second current source unit 52 and the third current source unit 53, the open/close circuit SW$_{CRWL2-(P-1)}$ and the open/close circuit SW$_{CRWL3-(P+1)}$ are selected to come into an ON-state, whereby the first compensatory magnetic field generating currents g(1)·I$_{RWL}$ flow in the first write-in word line RWL$_1$ and the third write-in word line RWL$_3$ or in the (M−2)-th-place write-in word line RWL$_{M-2}$ and the M-th-place write-in word line RWL$_M$. Further, in the fourth current source unit 54 or the fifth current source unit 55, the open/close circuit SW$_{CRWL4-(P-2)}$ constituting the fourth switch circuit 54A or the open/close circuit SW$_{CRWL5-4}$ constituting the fifth switch circuit 55A is selected to come into an ON-state, whereby the second compensatory magnetic field generating current g(2)·I$_{RWL}$ flows in the fourth write-in word line RWL$_4$ or the (M−3)-th-place write-in word line RWL$_{M-3}$.

In the nonvolatile magnetic memory device in Example 8, when data is written into the tunnel magnetoresistance device TMJ$_{(m,n)}$, the main magnetic field generating current g(0)·I$_{RWL}$ is passed through (or flowed in) the write-in word line RWL$_m$ from the first current source unit 51, and the compensatory magnetic field generating currents g(2)·I$_{RWL}$, g(1)·I$_{RWL}$, g(1)·I$_{RWL}$ and g(2)·I$_{RWL}$ are passed through (or flowed in) the write-in word lines RWL$_{m-2}$, RWL$_{m-1}$, RWL$_{m+1}$ and RWL$_{m+2}$ from the fourth current source unit 54, the second current source unit 52, the third current source unit 53 and the fifth current source unit 55. As a result, the destruction of data stored in the tunnel magnetoresistance devices TMJ$_{(m-2,n)}$, TMJ$_{(m-1,n)}$, TMJ$_{(m+1,n)}$ and TMJ$_{(m+2,n)}$ opposed to the write-in word lines RWL$_{m-2}$, RWL$_{m-1}$, RWL$_{m+1}$ and RWL$_{m+2}$ can be reliably prevented.

EXAMPLE 9

Figure 37:
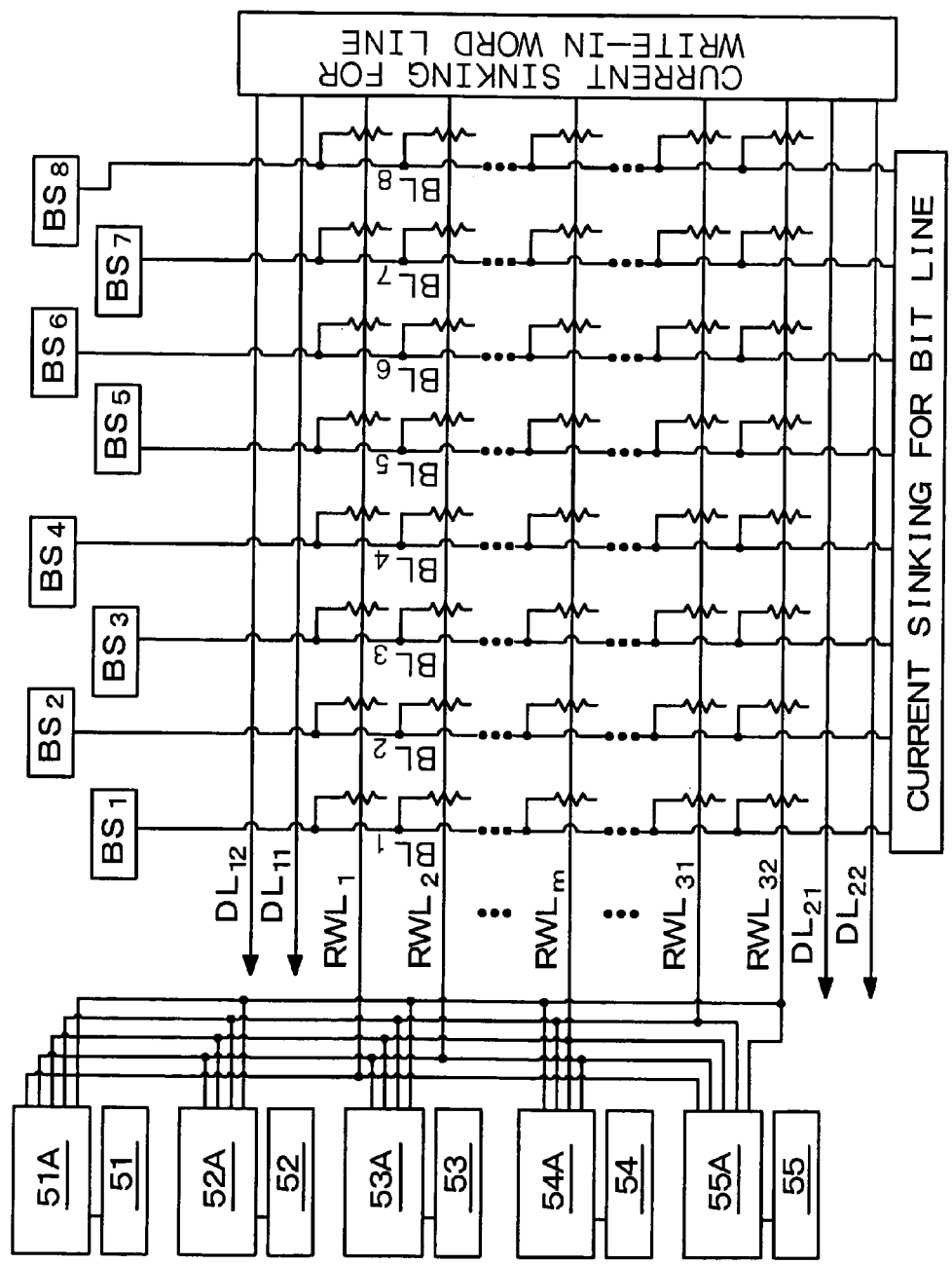
FIG. 37 is an equivalent circuit diagram of a nonvolatile magnetic memory device in Example 9.

Example 9 is a variant of Example 8. FIG. 37 shows an equivalent circuit diagram of a nonvolatile magnetic memory in Example 9.

In the nonvolatile magnetic memory device explained in Example 8, for example, the main magnetic field is generated by the current flowing in the first write-in word line RWL$_1$ or in the M-th-place write-in word line RWL$_M$ [magnetic field generated by the current g(0)·I$_{RWL}$ or the current g(0)·I(M)$_{RWL}$], and the compensatory magnetic fields are generated by the currents flowing in the second and third write-in word lines RWL$_2$ and RWL$_3$ or in the (M−2)-th-place and (M−1)-th-place write-in word lines RWL$_{(M-2)}$ and RWL$_{(M-1)}$ [magnetic field generated by the current g(1)·I(1)$_{RWL}$ and the current g(2)·I(1)$_{RWL}$, or by the current g(−2)·I(M)$_{BL}$ and the current g(−1)·I(M)$_{BL}$]. The above compensatory magnetic fields are asymmetric, for example, with regard to the first write-in word line RWL$_1$ or the M-th-place write-in word line RWL$_M$ as a base.

In the nonvolatile magnetic memory device in Example 9, therefore, when the absolute value of the maximum value that k represents is k$_0$ like Example 7 (k$_0$=2 in Example 9), a group of first dummy lines that are k$_0$ in number (first dummy lines DL$_{11}$ and DL$_{12}$) is provided outside the first write-in word line RWL$_1$ and in parallel with the first write-in word line RWL$_1$, a group of second dummy lines that are k$_0$ in number (second dummy lines DL$_{21}$ and DL$_{22}$) is provided outside the M-th-place write-in word line RWL$_M$ and in parallel with the M-th-place write-in word line RWL$_M$, and a current g(k)·I$_{RWL}$ is passed through (or flowed in) the [(1−m)+|k|]-th-place first dummy line constituting the group of the first dummy lines or the [m−M+|k|]-th-place second dummy line constituting the group of the second dummy lines.

Specifically, like Example 7, when the main magnetic field generating current g(0)·I$_{RWL}$ is passed through (or flowed in) the first write-in word line RWL$_1$, the first compensatory magnetic field generating current g(−1)·I$_{RWL}$ is passed through (or flowed in) the [(1−m)+|k|]-th-place first dummy line DL$_{11}$ (m=1, k=−1, first-place first dummy line) constituting the group of the first dummy lines, and the second compensatory magnetic field generating current g(−2)·I$_{RWL}$ is passed through (or flowed in) the [(1−m)+|k|]-th-place first dummy line DL$_{12}$ (m=1, k=−2, and second-place first dummy line) constituting the group of the first dummy lines. Further, when the main magnetic field generating current g(0)·I$_{RWL}$ is passed through (or flowed in) the second write-in word line RWL$_2$, the second compensatory magnetic field generating current g(−2)·I$_{RWL}$ is passed through (or flowed in) the [(1−m)+|k|]-th-place first dummy line DL$_{11}$ (m=2, k=−2, first-place first dummy line) constituting the group of the first dummy lines.

When the main magnetic field generating current g(0)·I$_{RWL}$ is passed through (or flowed in) the M-th-place write-in word line RWL$_M$, the first compensatory magnetic field generating current g(1)·$I_{RWL}$ is passed through (or flowed in) the [m−M+|k|]-th-place second dummy line $DL_{21}$ (m=M, k=1, first-place second dummy line) constituting the group of the second dummy lines, and the second compensatory magnetic field generating current g(2)·$I_{RWL}$ is passed through (or flowed in) the [m−M+|k|]-th-place second dummy line $DL_{22}$ (m=M, k=2, and second-place second dummy line) constituting the group of the second dummy lines. Further, when the main magnetic field generating current g(0)·$I_{RWL}$ is passed through (or flowed in) the (M−1)-th-place write-in word line $RWL_{M-1}$, the second compensatory magnetic field generating current g(2)·$I_{RWL}$ is passed through (or flowed in) the [m−M+|k|]-th-place second dummy line $DL_{21}$ (m=M−1, k=2, first-place second dummy line) constituting the group of the second dummy lines.

The first-place first dummy line $DL_{11}$ constituting the group of the first dummy lines is connected to the third current source unit 53 through an open/close circuit that is not shown, and further, is connected to the fifth current source unit 55 through an open/close circuit that is not shown. Further, the first-place second dummy line $DL_{21}$ constituting the group of the second dummy lines is connected to the second current source unit 52 through an open/close circuit that is not shown, and further, is connected to the fourth current source unit 54 through an open/close circuit that is not shown. The second-place first dummy line $DL_{12}$ constituting the group of the first dummy lines is connected to the fifth current source unit 55 through an open/close circuit that is not shown. The second-place second dummy line $DL_{22}$ constituting the group of the second dummy lines is connected to the fourth current source unit 54 through an open/close circuit that is not shown.

The constitution, structure and operation of the nonvolatile magnetic memory device in Example 9 can be the same as those of the nonvolatile magnetic memory device in Example 8 except for the above points, so that a detailed explanation thereof is omitted. The operation of the dummy lines can be substantially the same as that explained in Example 7, so that a detailed explanation thereof is omitted.

EXAMPLE 10

Example 10 is concerned with the method for writing data into a tunnel magnetoresistance device in a nonvolatile magnetic memory device (more specifically, a nonvolatile magnetic memory device having TMR-type MRAM) according to the second aspect of the present invention.

The nonvolatile magnetic memory device in Example 10 has the constitution and the structure that are explained in Example 7. While each write-in word line $RWL_m$ is provided with a current source unit $RCS_m$ like Example 7, a circuit (not shown) for adding the current g(0)·$I_{RWL}$, the current g(1)·$I_{RWL}$ and the current g(2)·$I_{RWL}$ is provided between the current source unit $RCS_m$ and the write-in word line $RWL_m$. Further, similarly, circuits (not shown) for adding the currents are provided between the first dummy line current source $DLCS_{11}$ and the first-place first dummy line $DL_{11}$ and between the second dummy line current source $DLCS_{21}$ and the first-place second dummy line $DL_{21}$.

In Example 10, the current $I(n)_{BL}$ is passed through (or flowed in) the n-th-place bit line, and the following currents $i(m)_{RWL}$ are simultaneously passed through (or flowed in) the first to M-th-place write-in word lines. $k_0$ is the absolute value of the maximum value that k represents, and k in the expression (2) includes 0.

$$i(m)_{RWL} = \sum_{k=-k_0}^{k_0} g(k) \cdot I(m-k)_{RWL} \quad (2)$$

Specifically, the currents $i(m)_{RWL}$ shown in the following Table 12 are simultaneously passed through (or flowed in) the first to M-th-place write-in word lines. Table 12 shows all of the currents to be passed through (or flowed in) the dummy lines $DL_{12}$ and $DL_{11}$ and the first to sixth write-in word lines $RWL_1$ to $RWL_6$, and shows part of the currents to be passed through (or flowed in) the seventh to tenth write-in word lines $RWL_7$ to $RWL_{10}$. And, showing of the currents to be passed through (or flowed in) the 11th to 32nd write-in word lines $RWL_{11}$ to $RWL_{32}$ and the dummy lines $DL_{21}$ and $DL_{22}$ is omitted.

TABLE 12

| | | | | | | | |
|---|---|---|---|---|---|---|---|
| Dummy Line $DL_{12}$ | g(−2)·I(1) | | | | | | |
| Dummy Line $DL_{11}$ | g(−1)·I(1) + | g(−2)·I(2) | | | | | |
| Write-In Word Line $RWL_1$ | g(0)·I(1) + | g(−1)·I(2) + | g(−2)·I(3) | | | | |
| Write-In Word Line $RWL_2$ | g(1)·I(1) + | g(0)·I(2) + | g(−1)·I(3) + | g(−2)·I(4) | | | |
| Write-In Word Line $RWL_3$ | g(2)·I(1) + | g(1)·I(2) + | g(0)·I(3) + | g(−1)·I(4) + | g(−2)·I(5) | | |
| Write-In Word Line $RWL_4$ | | g(2)·I(2) + | g(1)·I(3) + | g(0)·I(4) + | g(−1)·I(5) + | g(−2)·I(6) | |
| Write-In Word Line $RWL_5$ | | | g(2)·I(3) + | g(1)·I(4) + | g(0)·I(5) + | g(−1)·I(6) + | g(−2)·I(7) |
| Write-In Word Line $RWL_6$ | | | | g(2)·I(4) + | g(1)·I(5) + | g(0)·I(6) + | g(−1)·I(7) + | g(−2)·I(8) |
| Write-In Word Line $RWL_7$ | | | | | g(2)·I(5) + | g(1)·I(6) + | g(0)·I(7) + | g(−1)·I(8) + |
| Write-In Word Line $RWL_8$ | | | | | | g(2)·I(6) + | g(1)·I(7) + | g(0)·I(8) + |
| Write-In Word Line $RWL_9$ | | | | | | | g(2)·I(7) + | g(1)·I(8) + |

TABLE 12-continued

| Write-In Word Line $RWL_{10}$ | $g(2) \cdot I(8) +$ |
|---|---|

For writing data into the tunnel magnetoresistance device in the nonvolatile magnetic memory device in Example 10, the open/close circuit $SW_{B1-i}$ is brought into an ON-state, and the current $I(1)_{BL}$ is passed through (or flowed in) the first bit line $BL_1$ from the bit line current source $BS_1$. And, for example, the currents shown in Table 12 are simultaneously passed through (or flowed in) the first to 32nd write-in word lines $RWL_1$ to $RWL_{32}$. These procedures are consecutively repeated from the second bit line $BL_2$ to the N-th-place bit line $BL_N$.

In writing data into the tunnel magnetoresistance device in the nonvolatile magnetic memory device in Example 10, the occurrence of erroneous data writing into adjacent tunnel magnetoresistance devices can be reliably prevented. In the nonvolatile magnetic memory device having the above-explained constitution, the current is passed through (or flowed in) the word line only unidirectionally, so that the same data is only written in a multiple-writing manner in the direction determined by the current flowing in the bit line. Unlike Example 5, therefore, it is not possible to write predetermined data in the tunnel magnetoresistance devices one by one in Example 10, and the use of the method of Example 10 is limited to erasing of data or multiple-writing of data. As explained in Example 5, it is not essential to provide the dummy lines.

While the present invention has been explained with reference to Examples hereinabove, the present invention shall not be limited thereto. The constitutions, structures and the like of the nonvolatile magnetic memory device, the current source and the dummy line current source and the materials for constituting the layers of the tunnel magnetoresistance device are given as examples and may be changed or modified as required.

In the examples, the coefficients g(0) and g(k) assumed to be tap-gains have identical values in all of the bit lines or all of the write-in word lines. However, the coefficients g(0) and g(k) assumed to be tap-gains may differ between one bit line and another or between one write-in word line and another.

Further, for example, the current source unit $RCS_m$ may have a constitution in which it not only lets the currents $g(0) \cdot I_{RWL}$, $g(1) \cdot I_{RWL}$ and $g(2) \cdot I_{RWL}$ flow but also lets the currents $-g(0) \cdot I_{RWL}$, $-g(1) \cdot I_{RWL}$ and $-g(2) \cdot I_{RWL}$ flow, like the current source unit $BCS_n$. In this case, the circuit constitution of the current source unit $RCS_m$ can be substantially the same as the circuit constitution of the current source unit $BCS_n$.

For reading data stored in the tunnel magnetoresistance device TMJ, a reference tunnel magnetoresistance device having the same structure and the same constitution as those of the tunnel magnetoresistance device TMJ may be provided in parallel with the first bit line and/or the N-th-place bit line and outside the first bit line and/or the N-th-place bit line. In this constitution, the bit line constituting the reference tunnel magnetoresistance device can work as a substitute for the dummy line.

The nonvolatile magnetic memory may comprise the following constitution.

(1) A combination of the nonvolatile magnetic memory in Example 1 and the nonvolatile magnetic memory in Example 6.

(2) A combination of the nonvolatile magnetic memory in Example 1 and the nonvolatile magnetic memory in Example 7.

(3) A combination of the nonvolatile magnetic memory in Example 1 and the nonvolatile magnetic memory in Example 8.

(4) A combination of the nonvolatile magnetic memory in Example 1 and the nonvolatile magnetic memory in Example 9.

(5) A combination of the nonvolatile magnetic memory in Example 2 and the nonvolatile magnetic memory in Example 6.

(6) A combination of the nonvolatile magnetic memory in Example 2 and the nonvolatile magnetic memory in Example 7.

(7) A combination of the nonvolatile magnetic memory in Example 2 and the nonvolatile magnetic memory in Example 8.

(8) A combination of the nonvolatile magnetic memory in Example 2 and the nonvolatile magnetic memory in Example 9.

(9) A combination of the nonvolatile magnetic memory in Example 3 and the nonvolatile magnetic memory in Example 6.

(10) A combination of the nonvolatile magnetic memory in Example 3 and the nonvolatile magnetic memory in Example 7.

(11) A combination of the nonvolatile magnetic memory in Example 3 and the nonvolatile magnetic memory in Example 8.

(12) A combination of the nonvolatile magnetic memory in Example 3 and the nonvolatile magnetic memory in Example 9.

(13) A combination of the nonvolatile magnetic memory in Example 4 and the nonvolatile magnetic memory in Example 6.

(14) A combination of the nonvolatile magnetic memory in Example 4 and the nonvolatile magnetic memory in Example 7.

(15) A combination of the nonvolatile magnetic memory in Example 4 and the nonvolatile magnetic memory in Example 8.

(16) A combination of the nonvolatile magnetic memory in Example 4 and the nonvolatile magnetic memory in Example 9.

In the examples, the coefficients g(0) and g(k) are used for the bit line and the write-in word line in view of explanations. However, the value of $\beta=(h/d)$ generally differs between the bit line and the write-in word line. In the above combination, therefore, different coefficients are used like $g_{BL}(0)$ and $g_{BL}(k)$ as coefficients for the bit line and $g_{RWL}(0)$ and $g_{RWL}(k)$ as coefficients for the write-in word line.

Further, a plurality of the nonvolatile magnetic memory devices of the present invention may be arranged in parallel while using the write-in word line in common.

The line in which the compensatory current is to flow shall not be limited to the bit line or the write-in word line. There may be employed a constitution in which a dedicated line for magnetic field controlling is provided between a tunnel magnetoresistance device and a tunnel magnetoresistance device, and the spatial FIR filter is constituted of the dedicated line(s) And the bit line(s) or of the dedicated line(s) and the write-in word line(s).

Like MRAM disclosed in U.S. Pat. No. 5,940,319, there may be employed a structure in which that portion of the wiring (bit line or write-in word line) positioned above and/or below the tunnel magnetoresistance device which portion is not opposed to the tunnel magnetoresistance device is covered with a material for flux concentration material (for example, a soft magnetic material or a high-permeability material such as a cobalt-iron alloy, a nickel-iron alloy or an amorphous magnetic material), so that the flux concentration on the second ferromagnetic layer (memory layer) 35 can be improved.

In the nonvolatile magnetic memory device of the present invention, the spatial FIR filter assuming the magnetic fields, which are supposed to be formed in the n-th-place bit line and the bit lines that are K in number by the current $I(n)_{BL}$, to be discrete pulse response and assuming the coefficients $g(0)$ and $g(k)$ to be tap-gains is constituted of the n-th-place bit line and the bit lines that are K in number, or the spatial FIR filter assuming the magnetic fields, which are supposed to be formed in the m-th-place write-in word line and the write-in word lines that are K in number by the current $I(m)_{RWL}$, to be discrete pulse response and assuming the coefficients $g(0)$ and $g(k)$ to be tap-gains is constituted of the m-th-place write-in word line and the write-in word lines that are K in number. These coefficients $g(0)$ and $g(k)$ can be relatively easily obtained on the basis of a calculation method of the tap-gains in the FIR filter. By defining the coefficients $g(0)$ and $g(k)$, erroneous data writing into an adjacent tunnel magnetoresistance device can be reliably prevented. As a result, data can be reliably written into adjacent tunnel magnetoresistance devices, and there can be reliably prevented a condition in which the tunnel magnetoresistance device into which data is to be written comes into a so-called half-selection state.

Even in a case where an inversion threshold value of magnetization direction of the second ferromagnetic layer (memory layer) differs among the tunnel magnetoresistance devices caused by fluctuation in manufacturing process of the nonvolatile magnetic memory device or by temperature change, the occurrence of destruction of data in an adjacent tunnel magnetoresistance device can be reliably prevented, and the operation range where the tunnel magnetoresistance devices can well perform can be secured. As a result, when the production process is identical, the nonvolatile magnetic memory devices are improved in reliability and improved in yields, and the production cost can be decreased.

Further, the tunnel magnetoresistance devices can be more micro-fabricated than they have been, and nonvolatile magnetic memory devices having a large memory capacity can be materialized.

In the nonvolatile magnetic memory device of the present invention, there is an increase in power consumption in compensation for prevention of the interference caused by the magnetic field. However, the magnetic field can be controlled to such an extent that a necessary normal operation range can be secured, so that the increase in power consumption can be controlled.

What is claimed is:

1. A nonvolatile magnetic memory device having a nonvolatile magnetic memory array comprising;
   (A) write-in word line(s) that is (are) M (M≧1) in number, extending in a first direction,
   (B) bit lines that are N (N≧2) in number, extending in a second direction different from the first direction, and
   (C) tunnel magnetoresistance devices, each being formed in an overlap region of the write-in word line and the bit line and having a stacking structure of a first ferromagnetic layer, a tunnel barrier and a second ferromagnetic layer, the first ferromagnetic layer being electrically insulated from the write-in word line, and the second ferromagnetic layer being electrically connected to the bit line, wherein:

when data is written into the tunnel magnetoresistance device positioned in the overlap region of the m-th-place write-in word line (m is one of 1, 2, ... M) and the n-th-place bit line (n is one of 1, 2, ... N), a current $I(m)_{RWL}$ is passed through the m-th-place write-in word line and a current $g(0) \cdot I(n)_{BL}$ [$g(0)$:coefficient] is passed through the n-th-place bit line, and at the same time, a current $g(k) \cdot I(n)_{BL}$ [$g(k)$:coefficient] is passed through the q-th-place bit line (q=n+k, k is ±1, ±2, ..., and the total number of the lines is K), a spatial FIR filter assuming magnetic fields, which are supposed to be formed in the n-th-place bit line and the bit lines that are K in number by the current $I(n)_{BL}$, to be discrete pulse response and assuming the coefficients $g(0)$ and $g(k)$ to be tap-gains is constituted of the n-th-place bit line and the bit lines that are K in number, and the coefficients $g(0)$ and $g(k)$ are defined such that data is written into the tunnel magnetoresistance device positioned in the overlap region of the m-th-place write-in word line and the n-th-place bit line and no data are written into the tunnel magnetoresistance devices positioned in the overlap regions of the m-th-place write-in word line and the bit lines that are K in number by means of a synthetic magnetic field based on a magnetic field generated by the current $g(0) \cdot I(n)_{BL}$ flowing in the n-th-place bit line, magnetic fields generated by the currents $g(k) \cdot I(n)_{BL}$ flowing in the bit lines that are K in number, and a magnetic field generated by the current $I(m)_{RWL}$ flowing in the m-th-place write-in word line.

2. The nonvolatile magnetic memory device according to claim 1, in which the coefficients $g(0)$ and $g(k)$ that are assumed to be tap-gains are defined so as to nearly satisfy the Nyquist's first criterion.

3. The nonvolatile magnetic memory device according to claim 1, in which the value of k covers values of 1 and 2.

4. The nonvolatile magnetic memory device according to claim 1, in which when the absolute value of the maximum value of the values that the k represents is $k_0$,
   a group of first dummy line(s) that is(are) $k_0$ in number is provided outside the first bit line and in parallel with the first bit line,
   a group of second dummy line(s) that is(are) $k_0$ in number is provided outside the N-th-place bit line and in parallel with the N-th-place bit line, and
   the current $g(k) \cdot I(n)_{BL}$ is passed through a [(1−n)+|k|]-th-place first dummy line constituting the group of the first dummy line(s) or an [n−N+|k|]-th-place second dummy line constituting the group of the second dummy line(s).

5. The nonvolatile magnetic memory device according to claim 4, in which the value of k covers values of 1 and 2, and the value of $k_0$ is 2.

6. A method of writing data into a tunnel magnetoresistance device in a nonvolatile magnetic memory device having a nonvolatile magnetic memory array comprising;
- (A) write-in word line(s) that is(are) M (M≧1) in number, extending in a first direction,
- (B) bit lines that are N (N≧2) in number, extending in a second direction different from the first direction, and
- (C) tunnel magnetoresistance devices, each being formed in an overlap region of the write-in word line and the bit line and having a stacking structure of a first ferromagnetic layer, a tunnel barrier and a second ferromagnetic layer, the first ferromagnetic layer being electrically insulated from the write-in word line, and the second ferromagnetic layer being electrically connected to the bit line, wherein:

when it is assumed that data is written into the tunnel magnetoresistance device positioned in the overlap region of the m-th-place write-in word line (m is one of 1, 2, ... M) and the n-th-place bit line (n is one of 1, 2, ... N), a current $I(m)_{RWL}$ is passed through the m-th-place write-in word line and a current $g(0) \cdot I(n)_{BL}$ [g(0):coefficient] is passed through the n-th-place bit line, and at the same time, a current $g(k) \cdot I(n)_{BL}$ [g(k): coefficient] is passed through the q-th-place bit line (q=n+k, k is ±1, ±2, ..., and the total number of the lines is K), a spatial FIR filter assuming magnetic fields, which are supposed to be formed in the n-th-place bit line and the bit lines that are K in number by the current $I(n)_{BL}$, to be discrete pulse response and assuming the coefficients g(0) and g(k) to be tap-gains is constituted of the n-th-place bit line and the bit lines that are K in number, and the coefficients g(0) and g(k) are defined such that data is written into the tunnel magnetoresistance device positioned in the overlap region of the m-th-place write-in word line and the n-th-place bit line and no data are written into the tunnel magnetoresistance devices positioned in the overlap regions of the m-th-place write-in word line and the bit lines that are K in number by means of a synthetic magnetic field based on a magnetic field generated by the current $g(0) \cdot I(n)_{BL}$ flowing in the n-th-place bit line, magnetic fields generated by the currents $g(k) \cdot I(n)_{BL}$ flowing in the bit lines that are K in number, and a magnetic field generated by the current $I(m)_{RWL}$ flowing in the m-th-place write-in word line, said method comprising letting the current $I(m)_{RWL}$ flow in the m-th-place write-in word line, and simultaneously letting the following currents $i(n)_{BL}$ flow in each of the first bit line to the N-th-place bit line, $$i(n)_{BL} = \sum_{k=-k_0}^{k_0} g(k) \cdot I(n-k)_{BL} \quad (1)$$

wherein $k_0$ is an absolute value of the maximum value that k represents, and k in the expression (1) includes 0.

7. The method of writing data into a tunnel magnetoresistance device in a nonvolatile magnetic memory device according to claim 6, in which the coefficients g(0) and g(k) that are assumed to be tap-gains are defined so as to nearly satisfy the Nyquist's first criterion.

8. The method of writing data into a tunnel magnetoresistance device in a nonvolatile magnetic memory device according to claim 6, in which the value of k covers values of 1 and 2, and the value of $k_0$ is 2.

9. The method of writing data into a tunnel magnetoresistance device in a nonvolatile magnetic memory device according to claim 6, in which
- a group of first dummy line(s) that is(are) $k_0$ in number is provided outside the first bit line and in parallel with the first bit line,
- a group of second dummy line(s) that is(are) $k_0$ in number is provided outside the N-th-place bit line and in parallel with the N-th-place bit line, and
- the current $g(k) \cdot I(n)_{BL}$ is passed through a [(1−n)+|k|]-th-place first dummy line constituting the group of the first dummy line(s) or an [n−N+|k|]-th-place second dummy line constituting the group of the second dummy line(s).

10. The method of writing data into a tunnel magnetoresistance device in a nonvolatile magnetic memory device according to claim 9, in which the value of k covers values of 1 and 2, and the value of $k_0$ is 2.

11. A nonvolatile magnetic memory device having a nonvolatile magnetic memory array comprising;
- (A) write-in word lines that are M (M≧2) in number, extending in a first direction,
- (B) bit line(s) that is(are) N (N≧1) in number, extending in a second direction different from the first direction,
- (C) tunnel magnetoresistance devices, each being formed in an overlap region of the write-in word line and the bit line and having a stacking structure of a first ferromagnetic layer, a tunnel barrier and a second ferromagnetic layer, the first ferromagnetic layer being electrically insulated from the write-in word line, and the second ferromagnetic layer being electrically connected to the bit line, wherein:

when data is written into the tunnel magnetoresistance device positioned in the overlap region of the m-th-place write-in word line (m is one of 1, 2, ... M) and the n-th-place bit line (n is one of 1, 2, ... N), a current $I(n)_{BL}$ is passed through the n-th-place bit line and a current $g(0) \cdot I(m)_{RWL}$ [g(0):coefficient] is passed through the m-th-place write-in word line, and at the same time, a current $g(k) \cdot I(m)_{RWL}$ [g(k):coefficient] is passed through the p-th-place write-in word line (p=n+k, k is ±1, ±2, and the total number of the lines is K), a spatial FIR filter assuming magnetic fields, which are supposed to be formed in the m-th-place write-in word line and the write-in word lines that are K in number by the current $I(m)_{RWL}$, to be discrete pulse response and assuming the coefficients g(0) and g(k) to be tap-gains is constituted of the m-th-place write-in word line and the write-in word lines that are K in number, and the coefficients g(0) and g(k) are defined such that data is written into the tunnel magnetoresistance device positioned in the overlap region of the m-th-place write-in word line and the n-th-place bit line and no data are written into the tunnel magnetoresistance devices positioned in the overlap regions of the n-th-place bit line and the write-in word lines that are K in number by means of a synthetic magnetic field based on a magnetic field generated by the current $g(0) \cdot I(m)_{RWL}$ flowing in the m-th-place write-in word line, magnetic fields generated by the currents $g(k) \cdot I(m)_{RWL}$ flowing in the write-in word lines that are K in number, and a magnetic field generated by the current $I(n)_{BL}$ flowing in the n-th-place bit line.

12. The nonvolatile magnetic memory device according to claim 11, in which the coefficients $g(0)$ and $g(k)$ that are assumed to be tap-gains are defined so as to nearly satisfy the Nyquist's first criterion.

13. The nonvolatile magnetic memory device according to claim 11, in which the value of k covers values of 1 and 2, and the value of $k_0$ is 2.

14. The nonvolatile magnetic memory device according to claim 11, in which when the absolute value of the maximum value of the values that the k represents is $k_0$,
a group of first dummy line(s) that is(are) $k_0$ in number is provided outside the first write-in word line and in parallel with the first write-in word line,
a group of second dummy line(s) that is(are) $k_0$ in number is provided outside the M-th-place write-in word line and in parallel with the M-th-place write-in word line, and
the current $g(k) \cdot I(m)_{RWL}$ is passed through a $[(1-m)+|k|]$-th-place first dummy line constituting the group of the first dummy line(s) or an $[m-M+|k|]$-th-place second dummy line constituting the group of the second dummy line(s).

15. The nonvolatile magnetic memory device according to claim 14, in which the value of k covers values of 1 and 2, and the value of $k_0$ is 2.

16. A method of writing data into a tunnel magnetoresistance device in a nonvolatile magnetic memory device having a nonvolatile magnetic memory array comprising;
(A) write-in word lines that are M ($M \geq 2$) in number, extending in a first direction,
(B) bit line(s) that is(are) N ($N \geq 1$) in number, extending in a second direction different from the first direction,
(C) tunnel magnetoresistance devices, each being formed in an overlap region of the write-in word line and the bit line and having a stacking structure of a first ferromagnetic layer, a tunnel barrier and a second ferromagnetic layer, the first ferromagnetic layer being electrically insulated from the write-in word line, and the second ferromagnetic layer being electrically connected to the bit line,
wherein:
when it is assumed that data is written into the tunnel magnetoresistance device positioned in the overlap region of the m-th-place write-in word line (m is one of 1, 2, . . . M) and the n-th-place bit line (n is one of 1, 2, . . . N), a current $I(n)_{BL}$ is passed through the n-th-place bit line and a current $g(0) \cdot I(m)_{RWL}$ [$g(0)$: coefficient] is passed through the m-th-place write-in word line, and at the same time, a current $g(k) \cdot I(m)_{RWL}$ [$g(k)$:coefficient] is passed through the p-th-place write-in word line (p=n+k, k is ±1, ±2, and the total number of the lines is K),
a spatial FIR filter assuming magnetic fields, which are supposed to be formed in the m-th-place write-in word line and the write-in word lines that are K in number by the current $I(m)_{RWL}$, to be discrete pulse response and assuming the coefficients $g(0)$ and $g(k)$ to be tap-gains is constituted of the m-th-place write-in word line and the write-in word lines that are K in number, and
the coefficients $g(0)$ and $g(k)$ are defined such that data is written into the tunnel magnetoresistance device positioned in the overlap region of the m-th-place write-in word line and the n-th-place bit line and no data are written into the tunnel magnetoresistance devices positioned in the overlap regions of the n-th-place bit line and the write-in word lines that are K in number by means of a synthetic magnetic field based on a magnetic field generated by the current $g(0) \cdot I(m)_{RWL}$ flowing in the m-th-place write-in word line, magnetic fields generated by the currents $g(k) \cdot I(m)_{RWL}$ flowing in the write-in word lines that are K in number, and a magnetic field generated by the current $I(n)_{BL}$ flowing in the n-th-place bit line,
said method comprising letting the current $I(n)_{BL}$ flow in the n-th-place bit line, and simultaneously letting the following currents $i(m)_{RWL}$ flow in each of the first bit line to the M-th-place write-in word line, $$i(m)_{RWL} = \sum_{k=-k_0}^{k_0} g(k) \cdot I(m-k)_{RWL} \qquad (2)$$

wherein $k_0$ is an absolute value of the maximum value that k represents, and k in the expression (2) includes 0.

17. The method of writing data into a tunnel magnetoresistance device in a nonvolatile magnetic memory device according to claim 16, in which the coefficients $g(0)$ and $g(k)$ that are assumed to be tap-gains are defined so as to nearly satisfy the Nyquist's first criterion.

18. The method of writing data into a tunnel magnetoresistance device in a nonvolatile magnetic memory device according to claim 16, in which the value of k covers values of 1 and 2, and the value of $k_0$ is 2.

19. The method of writing data into a tunnel magnetoresistance device in a nonvolatile magnetic memory device according to claim 16, in which when the absolute value of maximum value of values that the k represents is $k_0$,
a group of first dummy line(s) that is(are) $k_0$ in number is provided outside the first write-in word line and in parallel with the first write-in word line,
a group of second dummy line(s) that is(are) $k_0$ in number is provided outside the M-th-place write-in word line and in parallel with the M-th-place write-in word line, and
the current $g(k) \cdot I(m)_{RWL}$ is passed through a $[(1-m)+|k|]$-th-place first dummy line constituting the group of the first dummy line(s) or an $[m-M+|k|]$-th-place second dummy line constituting the group of the second dummy line(s).

20. The method of writing data into a tunnel magnetoresistance device in a nonvolatile magnetic memory device according to claim 19, in which the value of k covers values of 1 and 2, and the value of $k_0$ is 2.

* * * * *

UNITED STATES PATENT AND TRADEMARK OFFICE
CERTIFICATE OF CORRECTION

PATENT NO.        : 7,035,136 B2
APPLICATION NO. : 10/767423
DATED             : April 25, 2006
INVENTOR(S)       : Masaaki Hara It is certified that error appears in the above-identified patent and that said Letters Patent is hereby corrected as shown below:

Column 66:
Line 47, "2, and" should read -- 2, ..., and --.

Column 67:
Line 54, "2, and" should read -- 2, ..., and --.

Signed and Sealed this

Thirteenth Day of February, 2007

JON W. DUDAS
*Director of the United States Patent and Trademark Office*